United States Patent
Sasaki et al.

(10) Patent No.: US 10,332,593 B2
(45) Date of Patent: Jun. 25, 2019

(54) SEMICONDUCTOR MEMORY DEVICE CONFIGURED TO SENSE MEMORY CELL THRESHOLD VOLTAGES IN ASCENDING ORDER

(71) Applicant: TOSHIBA MEMORY CORPORATION, Minato-ku (JP)

(72) Inventors: Takahiko Sasaki, Tokyo (JP); Go Shikata, San Jose, CA (US); Tomonori Kurosawa, Zama (JP); Rieko Funatsuki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 286 days.

(21) Appl. No.: 15/530,248

(22) Filed: Dec. 16, 2016

(65) Prior Publication Data

US 2017/0110186 A1 Apr. 20, 2017

Related U.S. Application Data

(63) Continuation-in-part of application No. 15/069,335, filed on Mar. 14, 2016, now abandoned.
(Continued)

(51) Int. Cl.
*G11C 16/04* (2006.01)
*G11C 11/56* (2006.01)
(Continued)

(52) U.S. Cl.
CPC ...... *G11C 11/5642* (2013.01); *G11C 11/5628* (2013.01); *G11C 11/5635* (2013.01);
(Continued)

(58) Field of Classification Search
CPC ............ G11C 11/5642; G11C 11/5628; G11C 11/5635; G11C 16/10; G11C 16/12; G11C 16/3459; G11C 29/50
See application file for complete search history.

(56) References Cited

U.S. PATENT DOCUMENTS

| | | | |
|---|---|---|---|
| 7,656,710 B1 * | 2/2010 | Wong ................ | G11C 11/5628 365/185.19 |
| 8,245,094 B2 | 8/2012 | Jiang et al. | |

(Continued)

FOREIGN PATENT DOCUMENTS

| | | |
|---|---|---|
| JP | 10-011980 | 1/1998 |
| JP | 2004-319007 A | 11/2004 |

(Continued)

*Primary Examiner* — Gene Auduong
(74) *Attorney, Agent, or Firm* — Oblon, McClelland, Maier & Neustadt, L.L.P.

(57) ABSTRACT

According to one embodiment, a semiconductor memory device includes first and second memory cells, a word line, first and second bit lines, a sense amplifier and a driver. The first and second memory cells have first and second threshold voltages, respectively. The word line is electrically connected to the first and second memory cells. The first and second bit lines are electrically connected to the first and second memory cells, respectively. The driver increases gradually the voltage of the word line. When the voltage of the word line is increased gradually by the driver, the sense amplifier senses the first and second threshold voltages in ascending order.

15 Claims, 37 Drawing Sheets

Related U.S. Application Data

(60) Provisional application No. 62/218,335, filed on Sep. 14, 2015.

(51) Int. Cl.
  *G11C 16/34* (2006.01)
  *G11C 16/32* (2006.01)
  *G11C 16/08* (2006.01)

(52) U.S. Cl.
  CPC .......... *G11C 16/32* (2013.01); *G11C 16/3459* (2013.01); *G11C 16/08* (2013.01)

(56) References Cited

U.S. PATENT DOCUMENTS

| | | |
|---|---|---|
| 8,248,851 B1 | 8/2012 | Pio |
| 8,406,052 B2 | 3/2013 | Lee et al. |
| 9,449,682 B2 * | 9/2016 | Wong .................. G11C 11/5628 |
| 2004/0208061 A1 | 10/2004 | Toda |
| 2006/0209593 A1 | 9/2006 | Toda |
| 2008/0151627 A1 | 6/2008 | Lee et al. |
| 2008/0285351 A1 | 11/2008 | Shlick et al. |
| 2009/0268516 A1 | 10/2009 | Murin et al. |
| 2010/0128527 A1 | 5/2010 | Shunichi |
| 2011/0222353 A1 | 9/2011 | Pabustan |

FOREIGN PATENT DOCUMENTS

| | | | | |
|---|---|---|---|---|
| JP | 2006-260711 A | | 9/2006 | |
| JP | 2009-026436 | * | 2/2009 | ......... G11C 11/5321 |
| JP | 2010-73275 A | | 4/2010 | |
| JP | 2010-129103 | | 6/2010 | |
| JP | 2012-133834 A | | 7/2012 | |
| JP | 5166442 B2 | * | 3/2013 | ......... G11C 16/0483 |
| JP | 5410507 B2 | * | 2/2014 | ......... G11C 11/5628 |

* cited by examiner

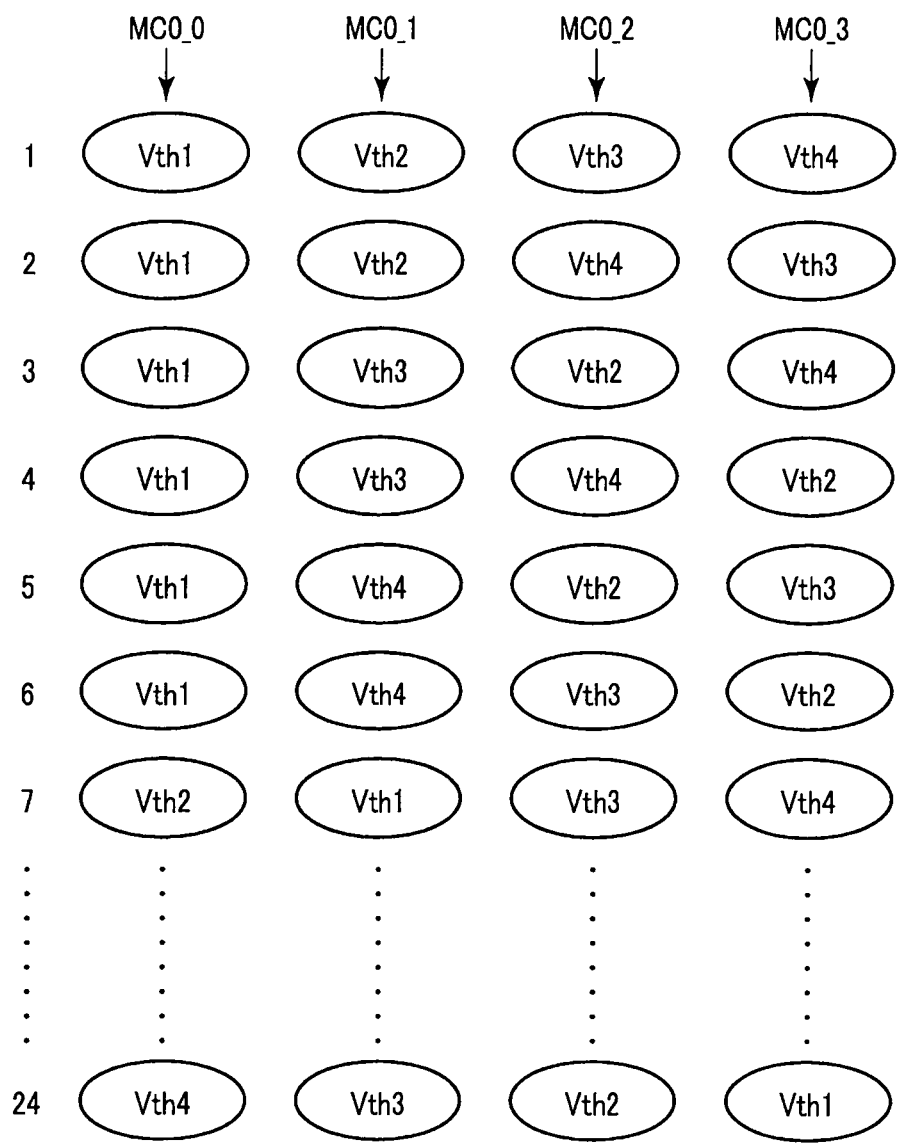
F I G. 2

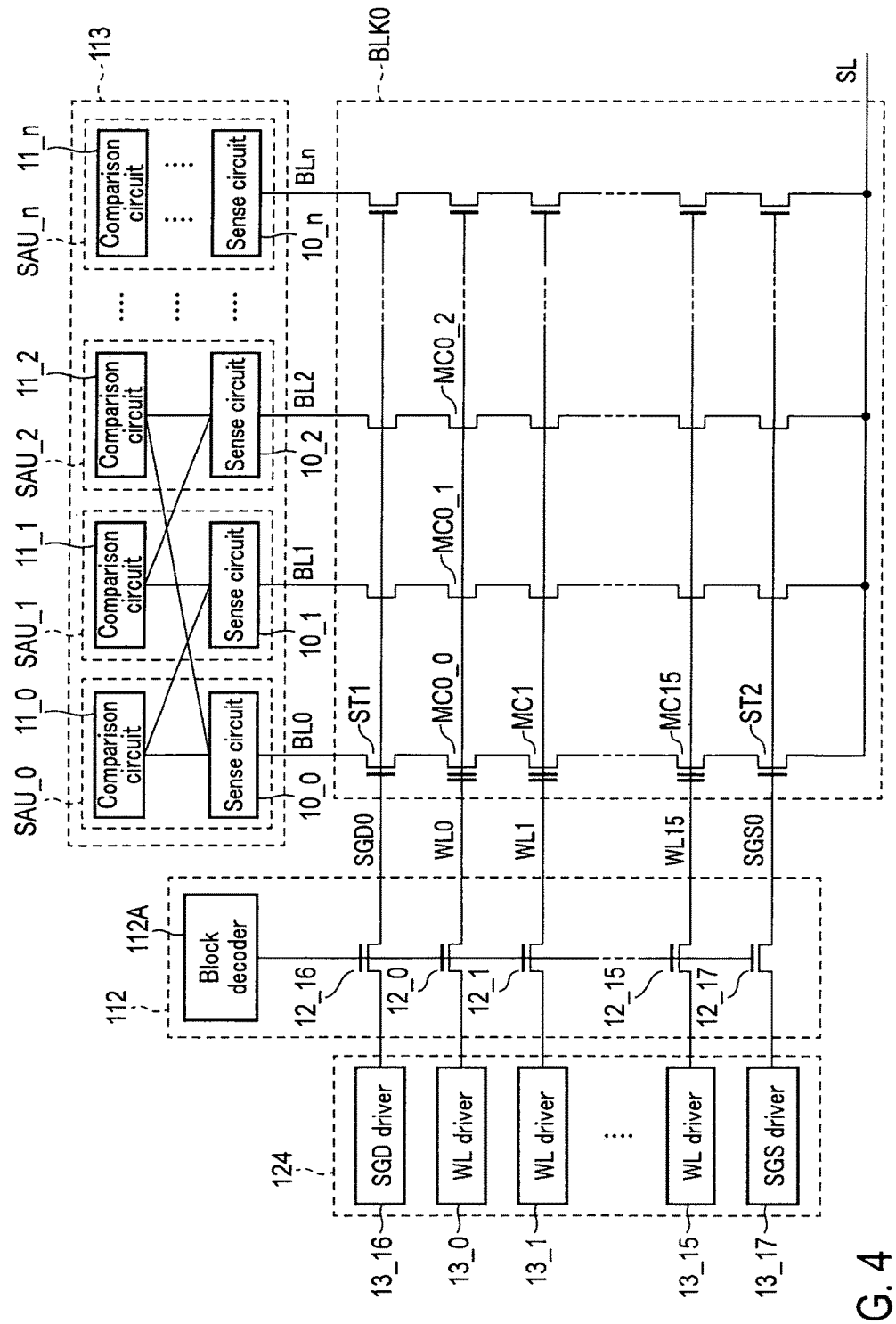
F I G. 4

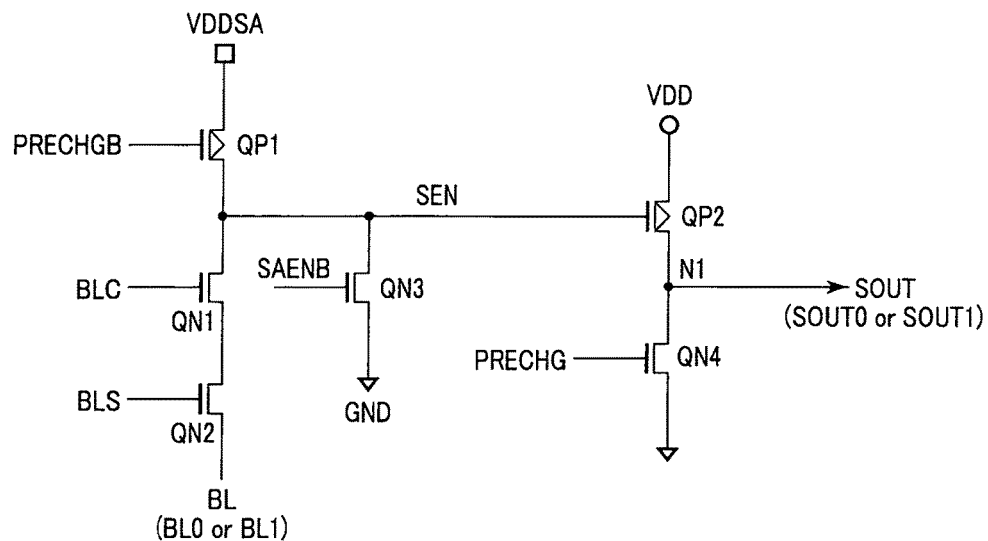
F I G. 5
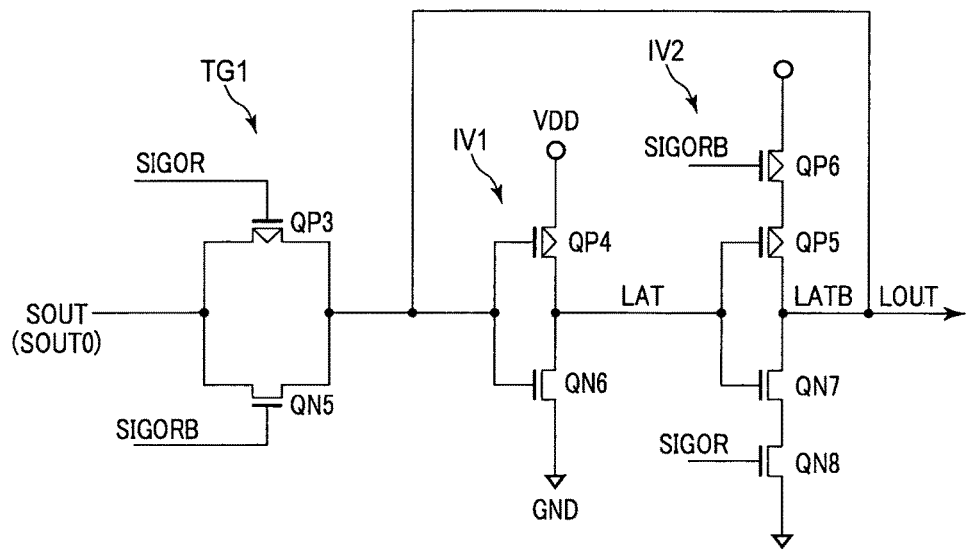
F I G. 6

| | Magnitude relation of threshold voltages | LOUT |
|---|---|---|
| 11_0 | Vth1<Vth2 | H |
| | Vth1>Vth2 | L |
| 11_1 | Vth2<Vth3 | H |
| | Vth2>Vth3 | L |
| 11_2 | Vth1<Vth3 | H |
| | Vth1>Vth3 | L |

F I G. 10

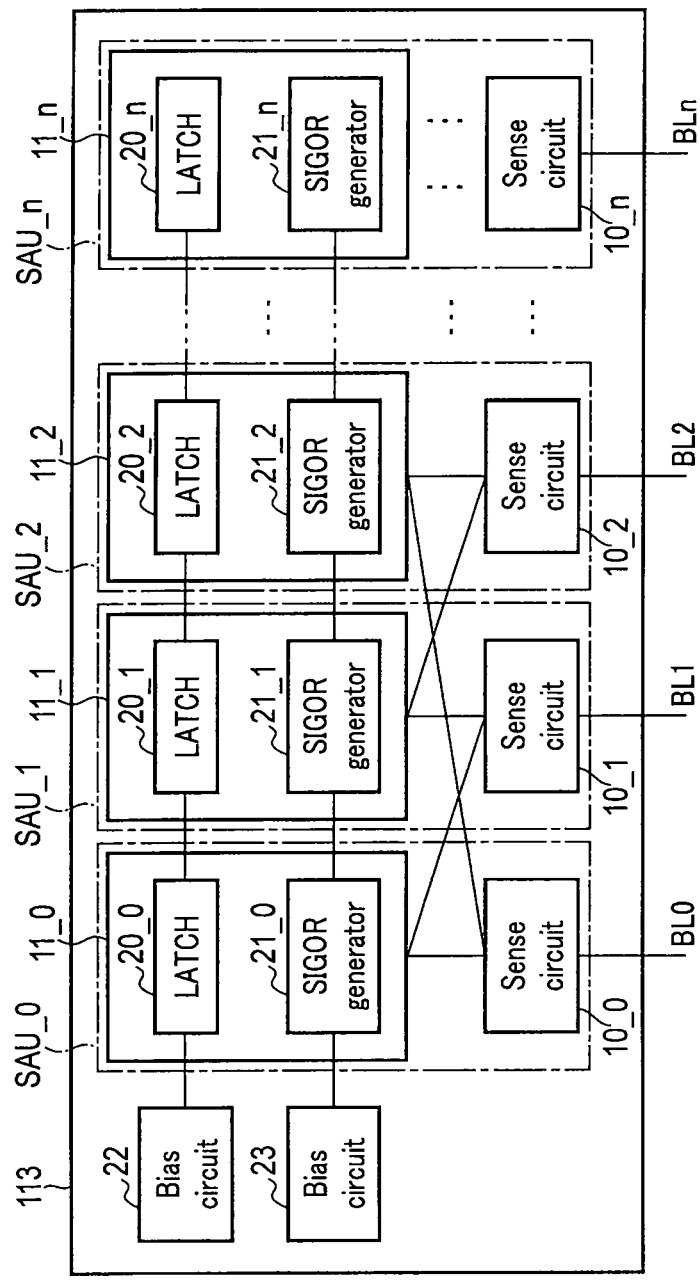
F I G. 11

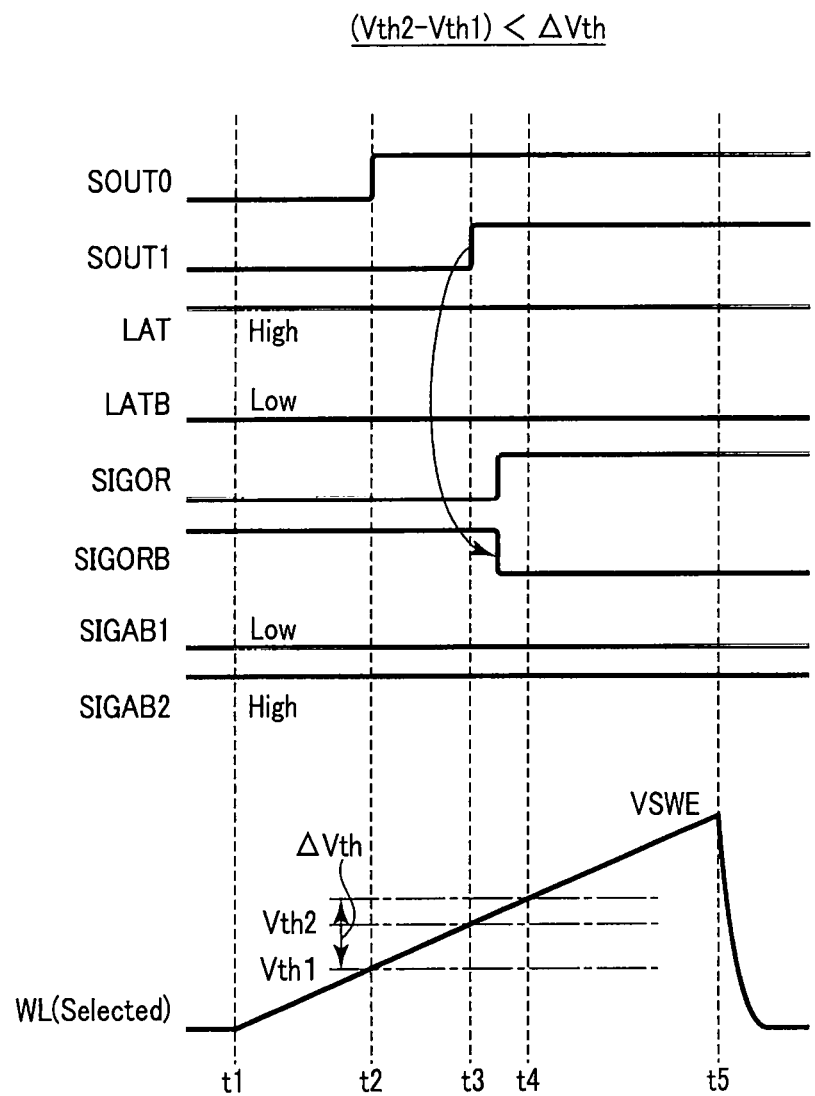
F I G. 16

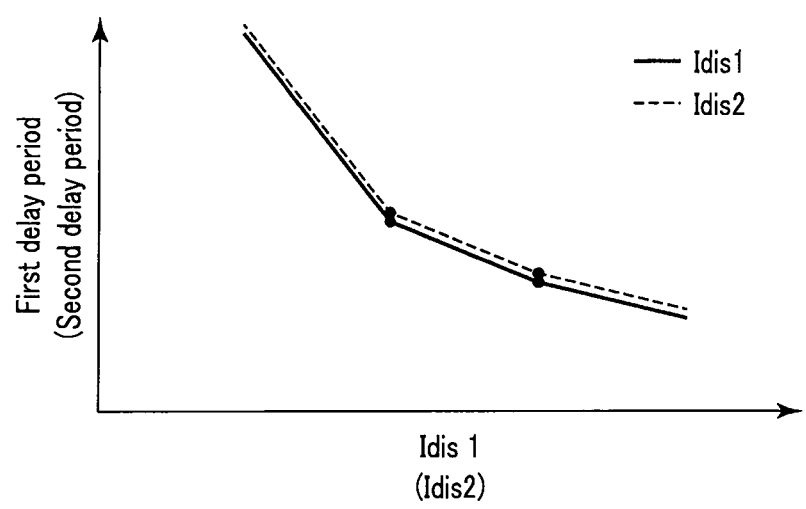
F I G. 19

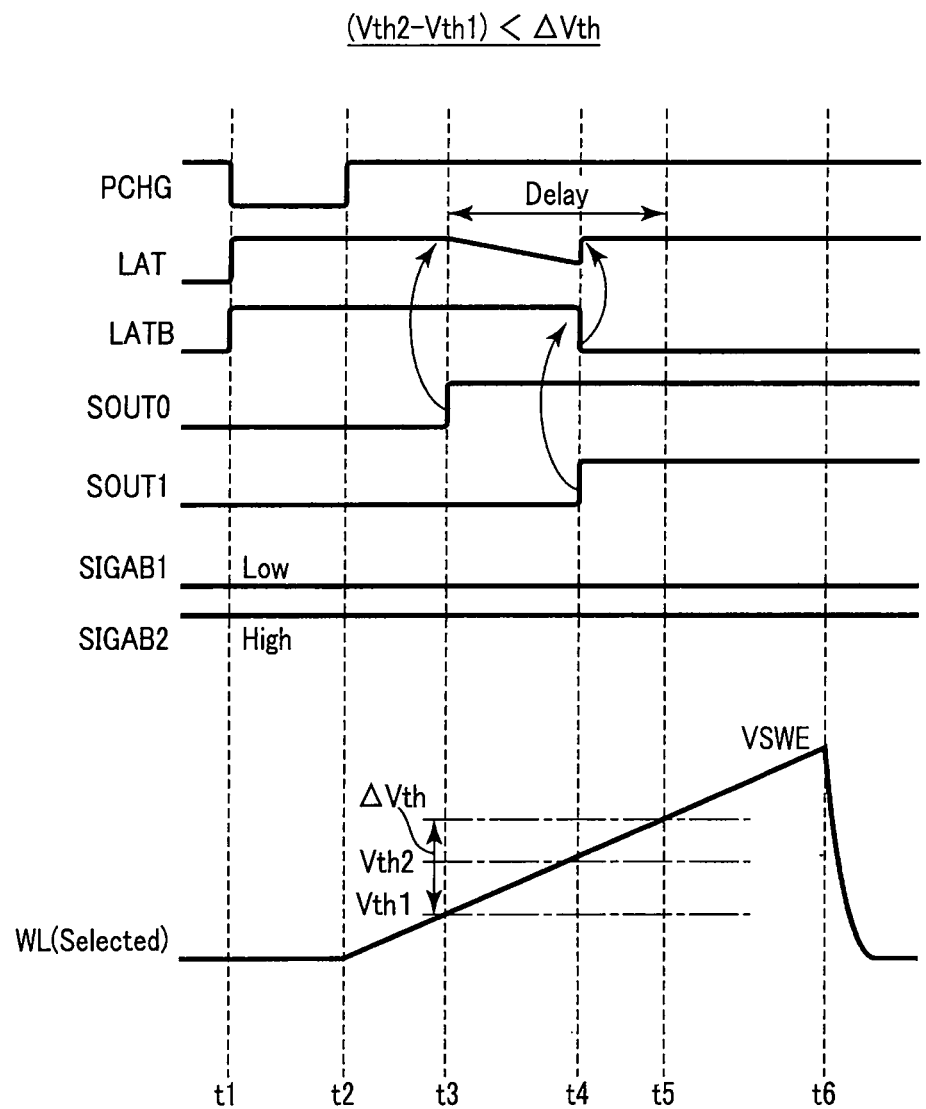
F I G. 23

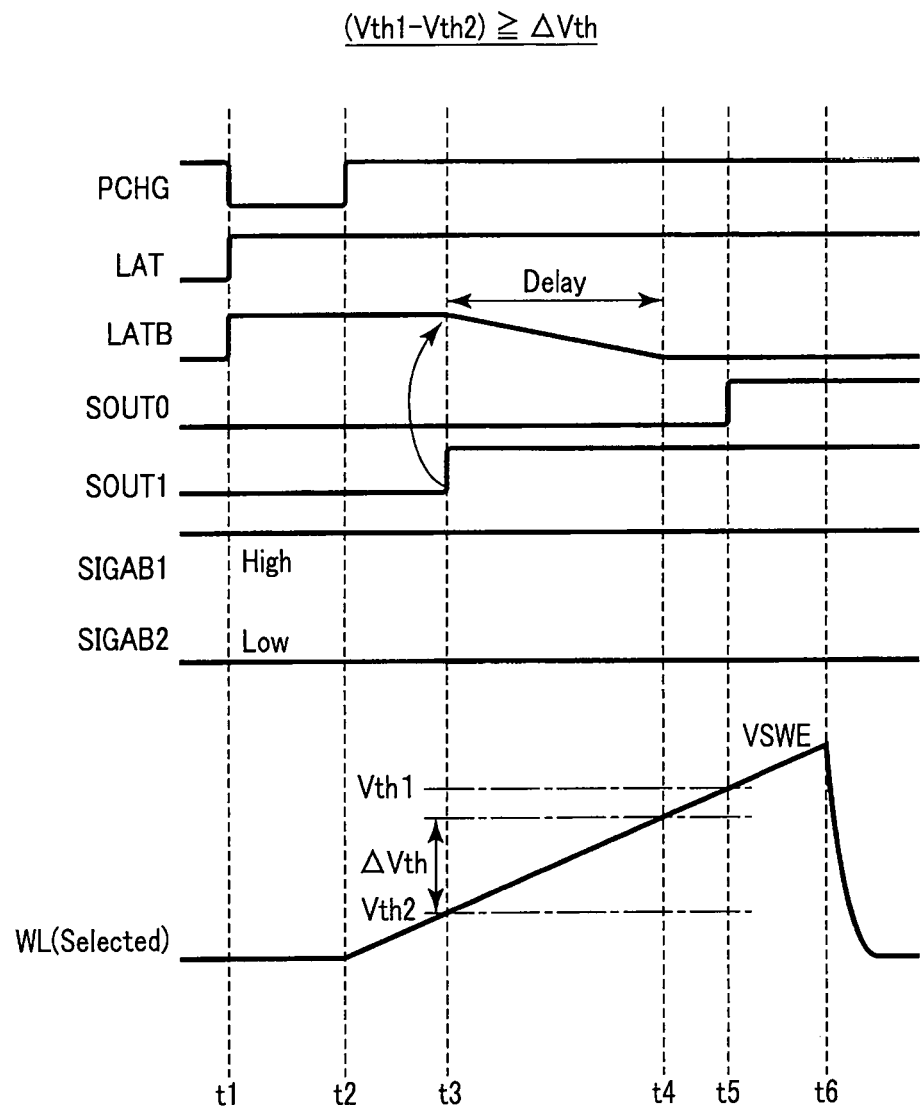
F I G. 24

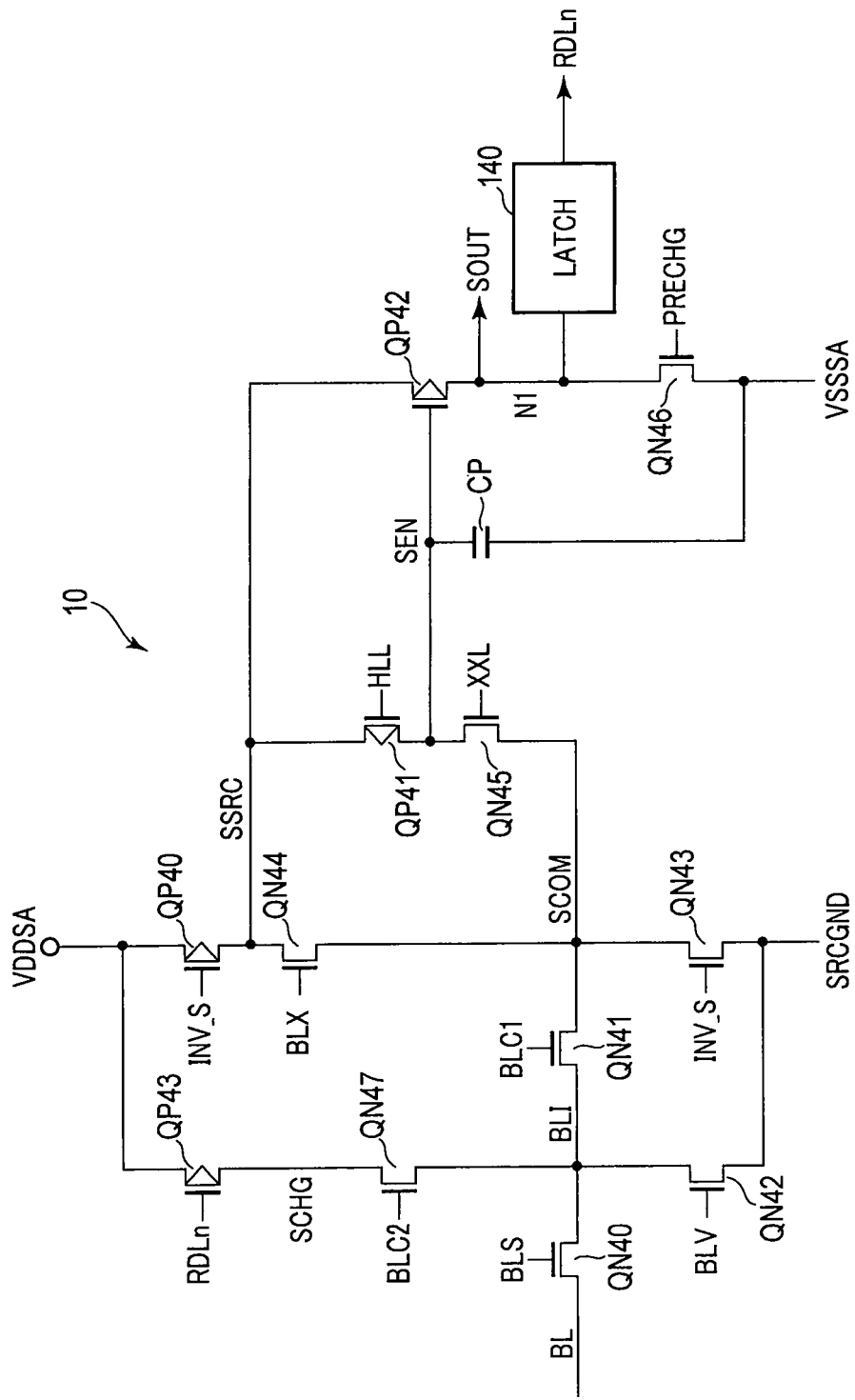
F I G. 26

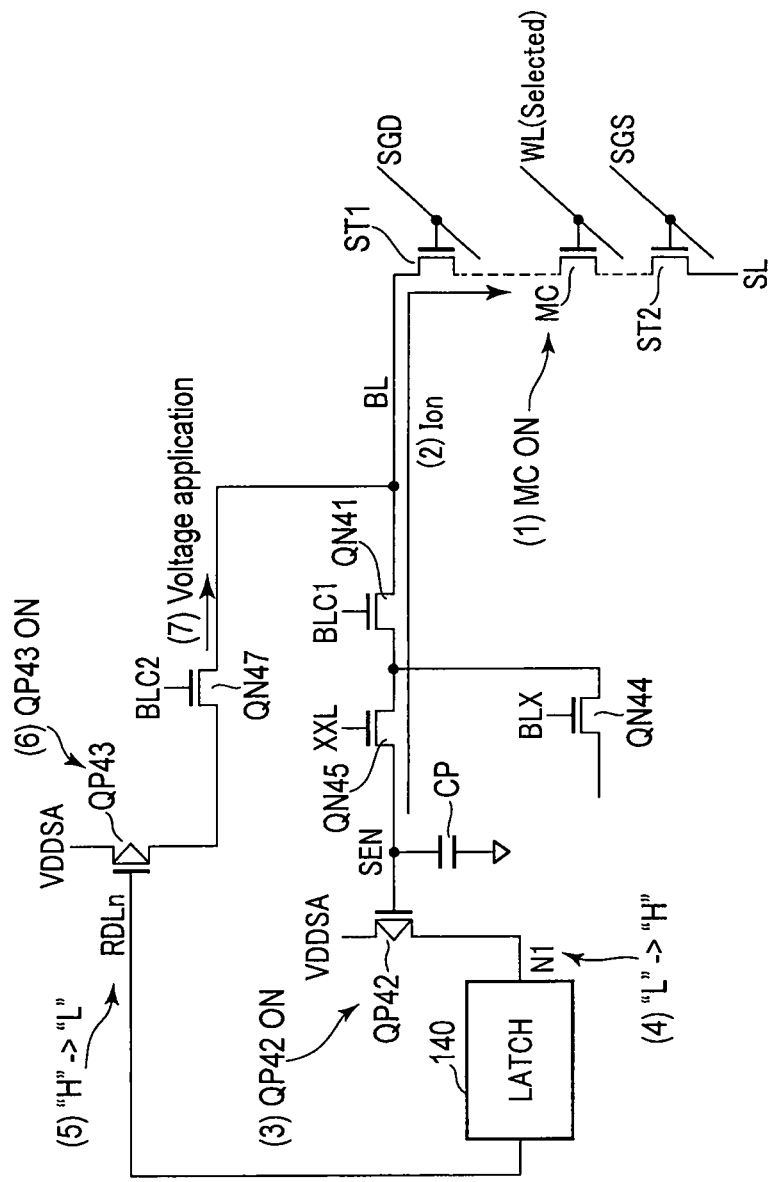
F I G. 27

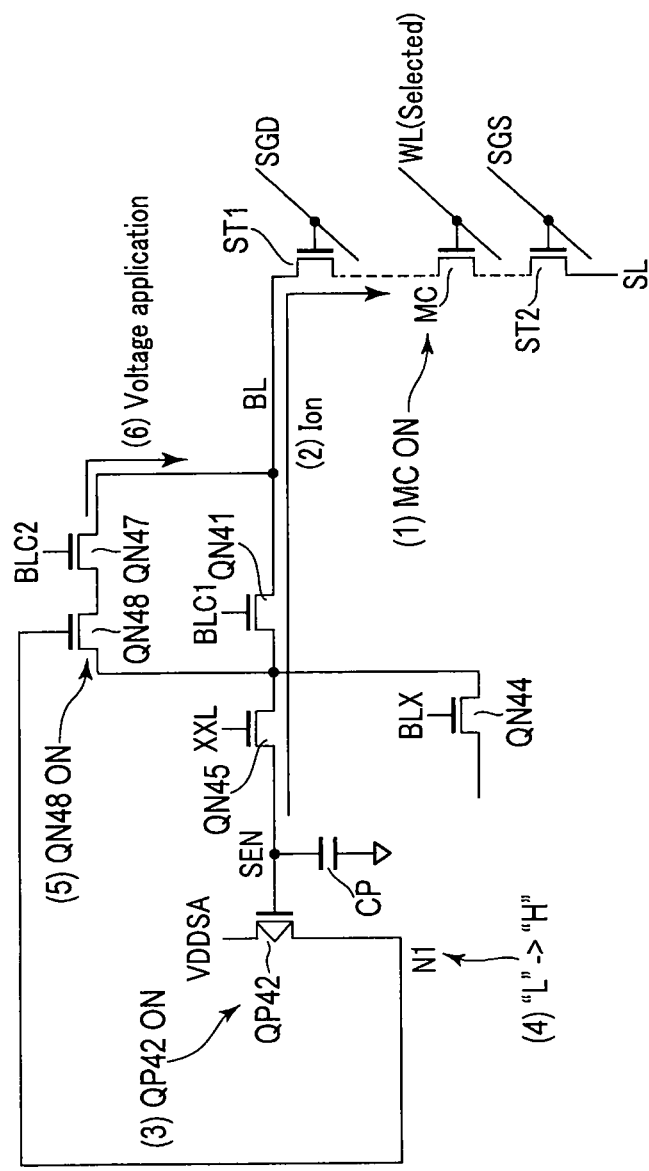
F I G. 30

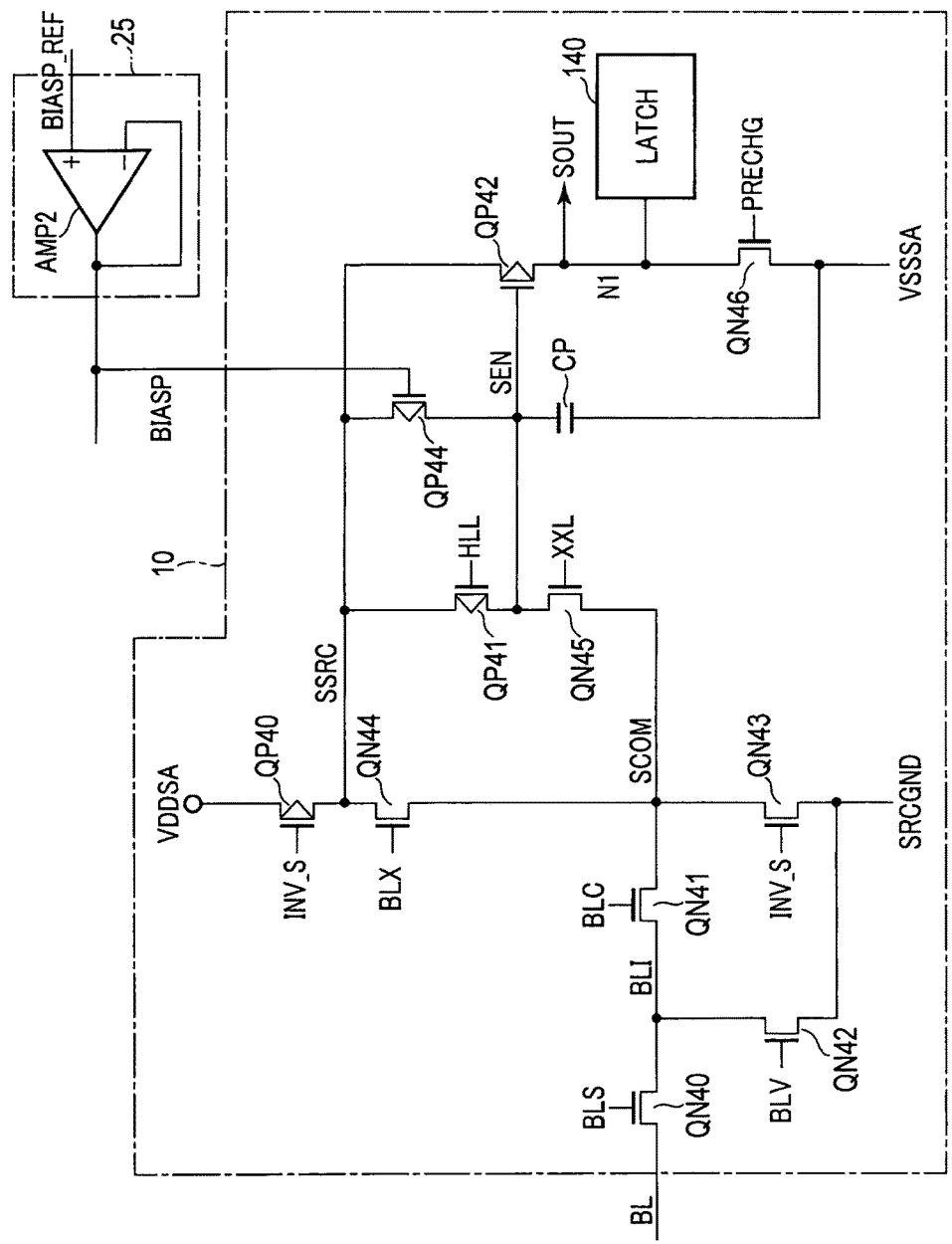
F I G. 33

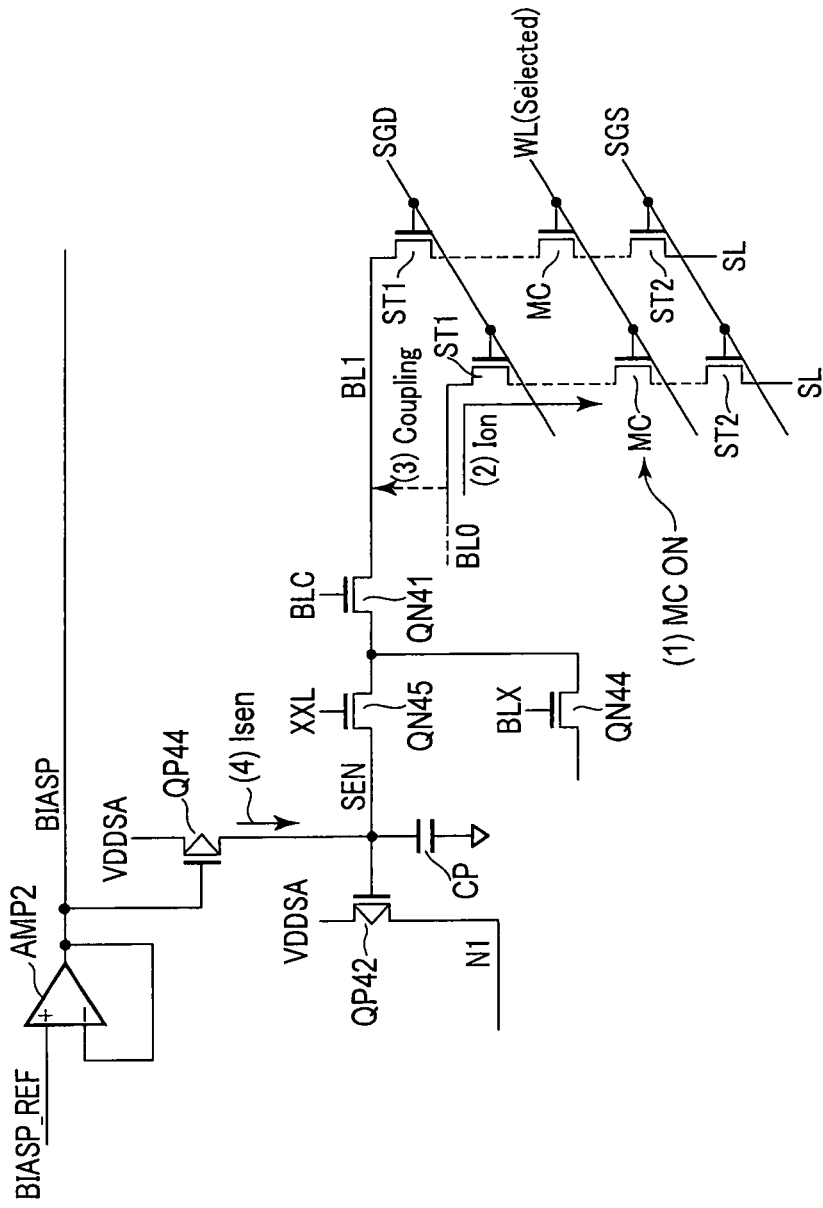
F I G. 34

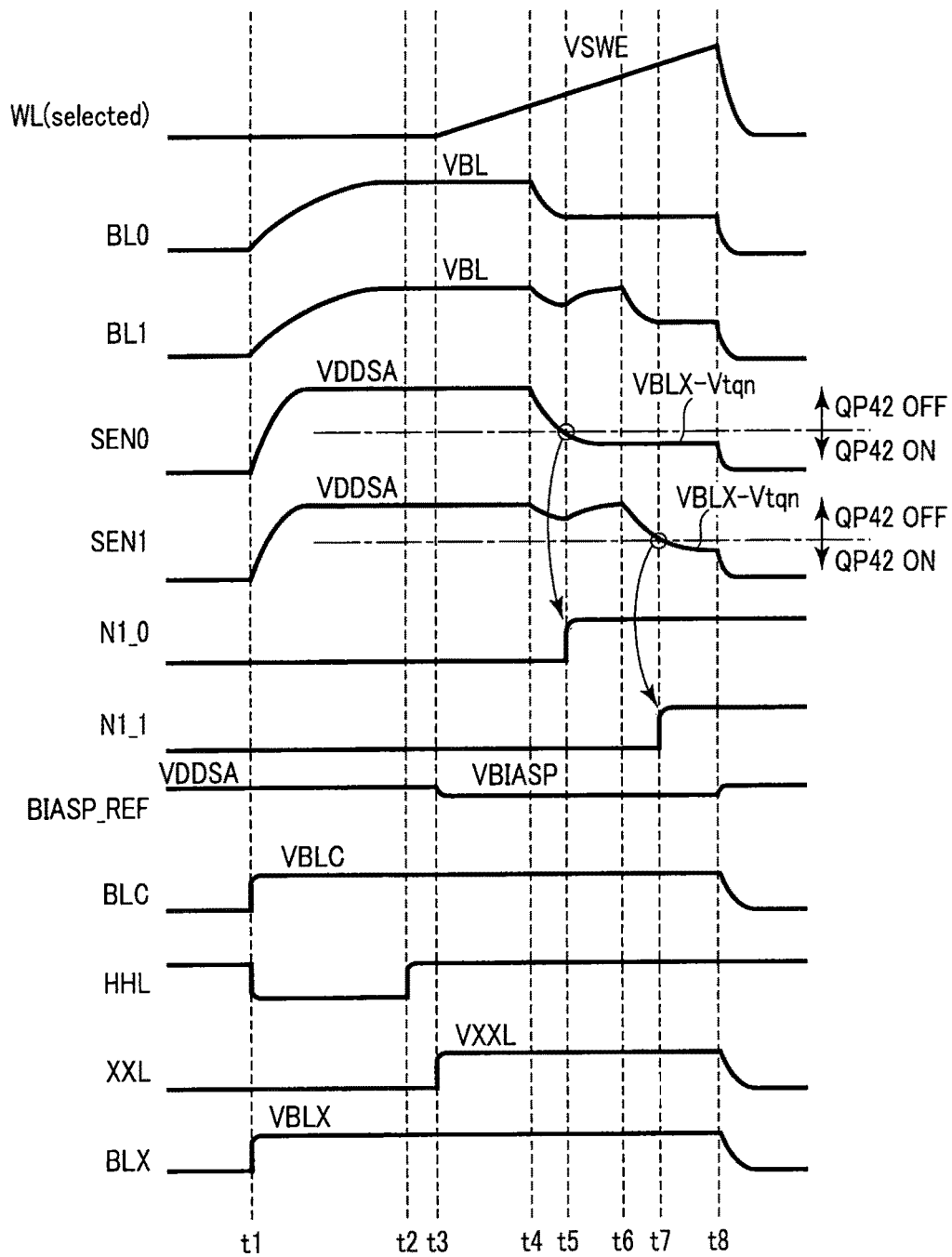
F I G. 35

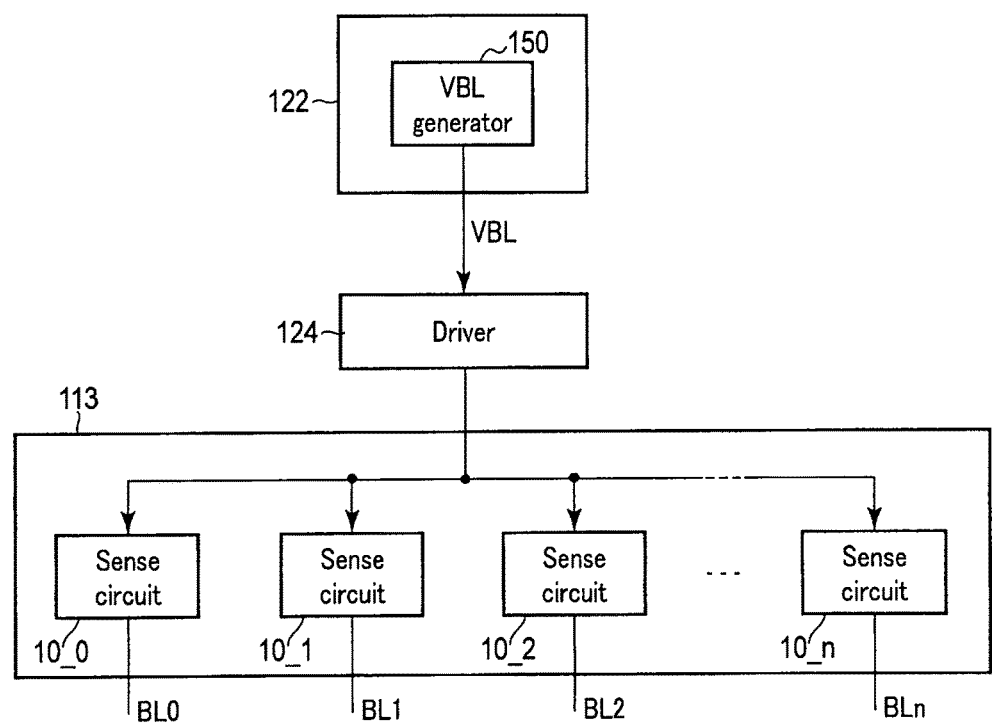
F I G. 36

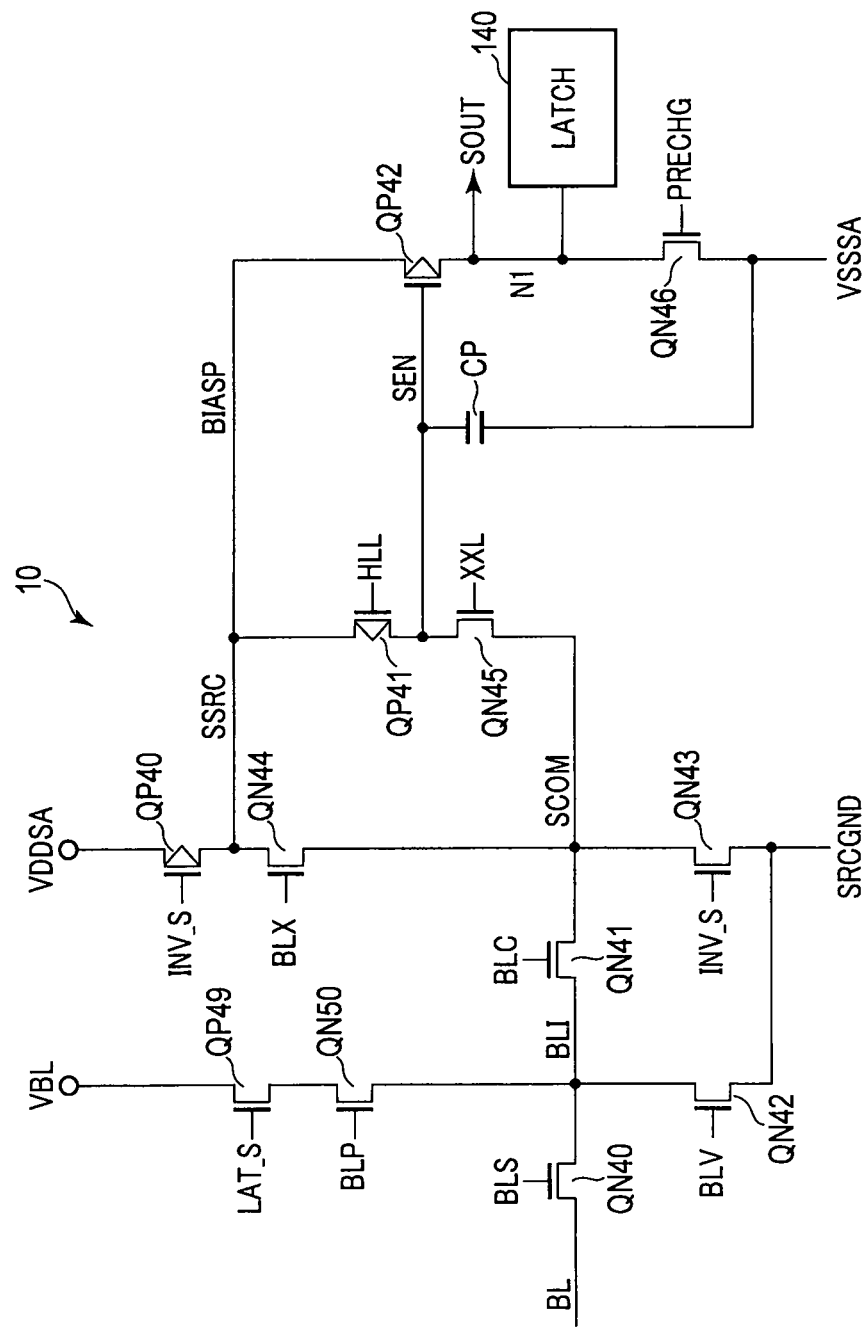
F I G. 37

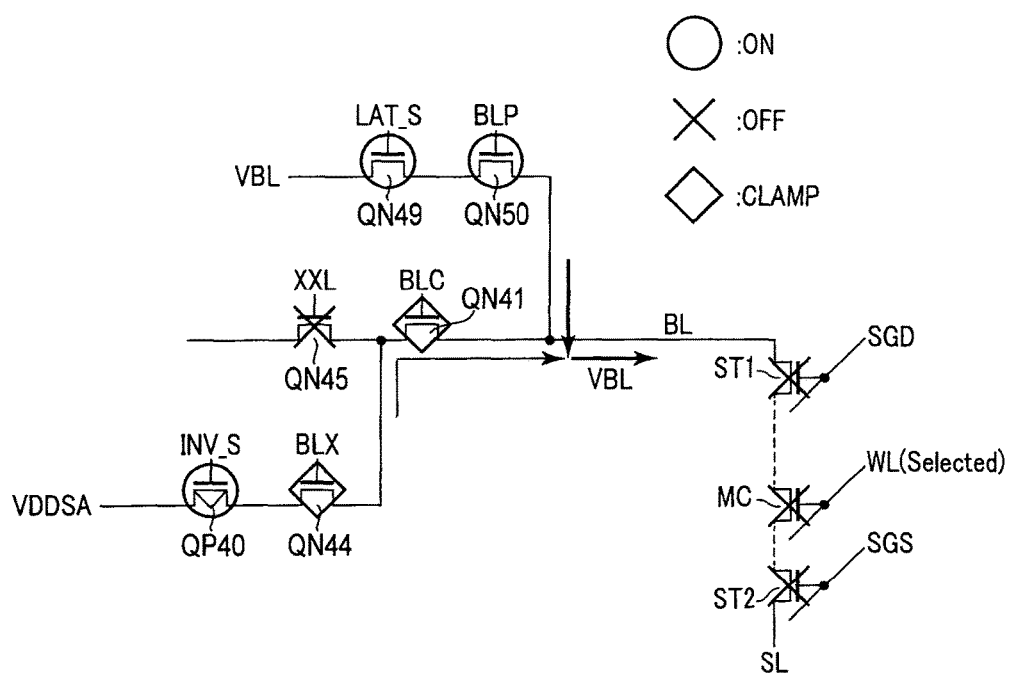
F I G. 38

SEMICONDUCTOR MEMORY DEVICE CONFIGURED TO SENSE MEMORY CELL THRESHOLD VOLTAGES IN ASCENDING ORDER

CROSS-REFERENCE TO RELATED APPLICATIONS

This application is a Continuation-in-Part Application of U.S. patent application Ser. No. 15/069,335, filed Mar. 14, 2016 and claiming the benefit of U.S. Provisional Application No. 62/218,335, filed Sep. 14, 2015, the entire contents of which are incorporated herein by reference.

FIELD

Embodiments described herein relate generally to a semiconductor memory device.

BACKGROUND

NAND flash memories are known as semiconductor memory devices.

BRIEF DESCRIPTION OF THE DRAWINGS

FIG. 2 is a diagram showing a data storing method by sequential storage according to the first embodiment;

FIG. 4 is a diagram showing the configurations of a sense amplifier, a row decoder, and a driver according to the first embodiment;

FIG. 5 is a circuit diagram of a sense circuit of the sense amplifier according to the first embodiment;

FIGS. 6 and 7 are circuit diagrams of a sequential comparison circuit of the sense amplifier according to the first embodiment;

FIG. 10 is a table showing the magnitude relation of threshold voltages of memory cell transistors, and signals LOUT output from an order comparison circuit, according to the first embodiment;

FIG. 11 is a block diagram showing the configuration of the sense amplifier according to a second embodiment;

FIG. 16 is a timing chart showing a program verify operation in a second example according to the second embodiment;

FIG. 19 is a graph showing the relation between currents supplied from an current source of a bias circuit and delay periods of latching according to the second embodiment;

FIG. 23 is a timing chart showing a program verify operation in a second example according to the third embodiment;

FIG. 24 is a timing chart showing a program verify operation in a third example according to the third embodiment;

FIG. 26 is a circuit diagram of the sense circuit according to a fourth embodiment;

FIG. 27 is a conceptual diagram showing a read operation according to the fourth embodiment;

FIG. 30 is a conceptual diagram showing a read operation according to the fifth embodiment;

FIG. 33 is a circuit diagram of the sense circuit according to the sixth embodiment;

FIG. 34 is a conceptual diagram showing a read operation according to the sixth embodiment;

FIG. 35 is a timing chart showing the read operation according to the sixth embodiment;

FIG. 36 is a block diagram showing the configurations of a charge pump and the sense amplifier according to a seventh embodiment;

FIG. 37 is a circuit diagram of the sense circuit according to the seventh embodiment;

FIG. 38 is a conceptual diagram showing a read operation according to the seventh embodiment.

DETAILED DESCRIPTION

Hereinafter, an embodiment will be described with reference to the drawings. In the description below, components having the same functions and configurations are denoted by the same reference signs.

In general, according to one embodiment, a semiconductor memory device includes a first memory cell, a second memory cell, a word line, a first bit line, a second bit line, a sense amplifier and a driver. The first memory cell has a first threshold voltage. The second memory cell has a second threshold voltage. The word line is electrically connected to the first and second memory cells. The first bit line is electrically connected to the first memory cell. The second bit line is electrically connected to the second memory cell. The sense amplifier is electrically connected to the first bit line and the second bit line, and senses the first threshold voltage and the second threshold voltage. The driver increases gradually the voltage of the word line. When the voltage of the word line is increased gradually by the driver, the sense amplifier senses the first and second threshold voltages in ascending order. The sense amplifier includes a first latch circuit. The first latch circuit latches a first voltage when the first threshold voltage is lower than the second threshold voltage and latches a second voltage when the first threshold voltage is higher than the second threshold voltage.

A semiconductor memory device according to an embodiment is described below. Here, a planar NAND flash memory in which memory cell transistors are two-dimensionally arranged on a semiconductor substrate is described as the semiconductor memory device by way of example.

1. First Embodiment

[Overall Configuration]

Figure 1:
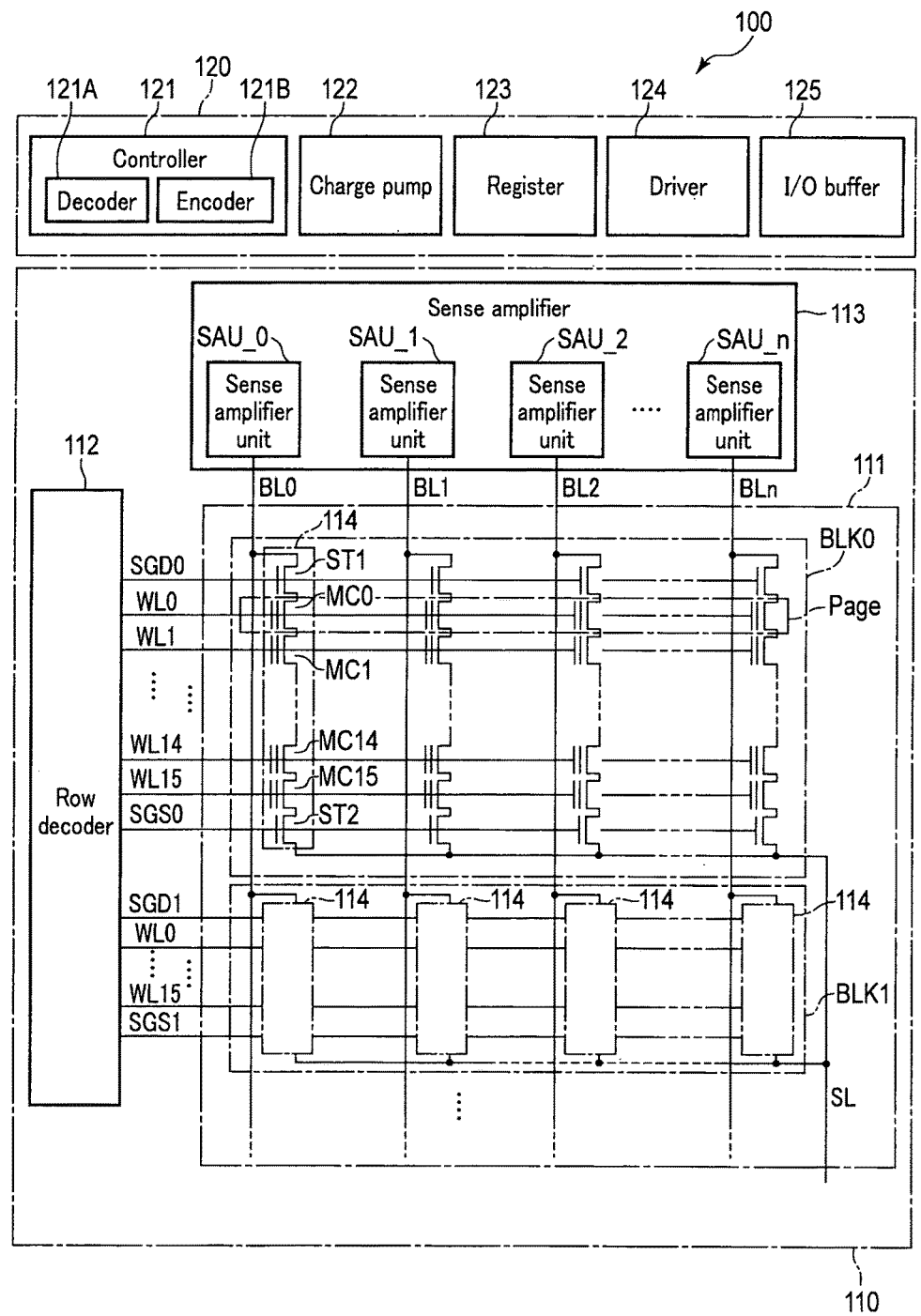
FIG. 1 is a block diagram showing the configuration of a semiconductor memory device according to a first embodiment.

The overall configuration of the semiconductor memory device according to the embodiment is described with reference to FIG. 1. As shown, a NAND flash memory 100 includes a core section 110 and a peripheral circuit 120.

The core section 110 includes a memory cell array 111, a row decoder 112, and a sense amplifier 113.

The memory cell array 111 includes blocks BLK0, BLK1, . . . which are assemblies of nonvolatile memory cell transistors. A block BLK when mentioned in this way hereinafter indicates each of the blocks BLK0, BLK1, . . . . Data in one block BLK are, for example, collectively erased. An erasing range of data is not limited to one block BLK, and more than one block may be collectively erased, or a partial region of one block BLK may be collectively erased.

The block BLK includes NAND strings 114 in which memory cell transistors are connected in series. The memory cell transistors are two-dimensionally arrayed on a semiconductor substrate. Any number of NAND strings 114 may be included in one block.

Each of the NAND strings 114 includes, for example, 16 memory cell transistors MC0, MC1, . . . , and MC15, and select transistors ST1 and ST2. A memory cell transistor MC when mentioned in this way hereinafter indicates each of the memory cell transistors MC0 to MC15.

The memory cell transistor MC includes a stack gate which includes a control gate and a charge storage layer, and saves data in a nonvolatile manner. The memory cell transistor MC may be a metal-oxide-nitride-oxide-silicon (MONOS) type that uses an insulating film as the charge storage layer, or may be a floating gate (FG) type that uses an electrically conductive film as the charge storage layer. Moreover, the number of the memory cell transistors MC is not exclusively 16, and may be, for example, 8, 32, 64, or 128 and is not limited.

The memory cell transistors MC0 to MC15 have their sources or drains connected in series. The drain of the memory cell transistor MC0 at one end of this series connection is connected to the source of the select transistor ST1, and the source of the memory cell transistor MC15 at the other end is connected to the drain of the select transistor ST2.

The gates of the select transistors ST1 in the block BLK are connected in common to the same select gate line. In the example of FIG. 1, the gates of the select transistors ST1 in the block BLK0 are connected in common to the select gate line SGD0, and the gates of the unshown select transistors ST1 in the block BLK1 are connected in common to the select gate line SGD1. Similarly, the gates of the select transistors ST2 in the block BLK0 are connected in common to the select gate line SGS0, and the gates of the unshown select transistors ST2 in the block BLK1 are connected in common to the select gate line SGS1. A select gate line SGD when mentioned in this way hereinafter indicates each of the select gate lines SGD0, SGD1, . . . , and a select gate line SGS when mentioned in this way hereinafter indicates each of the select gate lines SGS0, SGS1, . . . .

The control gates of the memory cell transistors MC of each of the NAND strings 114 in the block BLK are respectively connected in common to the word lines WL0 to WL15. That is, the control gates of the memory cell transistor MC0 of each of the NAND strings 114 are connected in common to the word line WL0. Similarly, the control gates of the memory cell transistors MC1 to MC15 are respectively connected in common to the word lines WL1 to WL15.

The drains of select transistors ST1 of the NAND strings 114 in the same column among the NAND strings 114 arranged in the memory cell array 111 in matrix form are respectively connected in common to the bit lines BL0, BL1, . . . , and BLn (n is a natural number equal to or more than 0). That is, each of the bit lines BL0 to BLn is connected in common to the NAND string 114 in the blocks BLK. A bit line BL when mentioned in this way hereinafter indicates each of the bit lines BL0, BL1, . . . , and BLn.

The sources of the select transistors ST2 in the block BLK are connected in common to the source line SL. That is, the source lines SL are connected in common to the NAND strings 114 in the blocks BLK.

For example, in data writing and reading, the row decoder 112 decodes an address of the block BLK or an address of a page to select a word line WL corresponding to a page targeted for writing and reading. The row decoder 112 also applies suitable voltages to the selected word line WL, the unselected word lines WL, and the select gate lines SGD and SGS.

The sense amplifier 113 includes sense amplifier units SAU_0, SAU_1, . . . , and SAU_n. Each of the sense amplifier units SAU_0 to SAU_n is provided to correspond to each of the bit lines BL0 to BLn. A sense amplifier unit SAU when mentioned in this way hereinafter indicates each of the sense amplifier units SAU_0 to SAU_n.

In data reading, the sense amplifier unit SAU senses and amplifies data read into the bit line BL from the memory cell transistor MC. In data writing, the sense amplifier unit SAU transfers write data to the memory cell transistor MC. The sense amplifier unit SAU includes a sense section to sense data, and a sequential comparison circuit which compares the sensed data. Details of the sense section and the sequential comparison circuit will be described later.

The peripheral circuit 120 includes a controller 121, a charge pump 122, a register 123, a driver 124, and an input/output buffer 125.

The controller 121 controls the overall operation of the NAND flash memory 100. The controller 121 includes a decoder 121A and an encoder 121B. During a write operation, the decoder 121A decodes write data input from, for example, an external controller, and then generates data to be written into the block BLK. In a read operation, the encoder 121B encodes data read from the block BLK, and outputs the encoded data to the external controller via the input/output buffer 125.

The charge pump 122 generates voltages necessary for data writing, reading, and erasing, and supplies the voltages to the driver 124.

The driver 124 supplies the voltages necessary for data writing, reading, and erasing to the row decoder 112, the sense amplifier 113, and the source line SL. The row decoder 112 and the sense amplifier 113 transfer the voltages supplied from the driver 124 to the memory cell transistor MC.

The register 123 holds various signals. For example, the register 123 holds statuses of data write and erase operations, and thereby informs, for example, the external controller whether the operation has been normally completed. The register 123 is also capable of holding various tables.

The input/output (I/O) buffer 125 temporarily stores data input to and output from the external controller in data writing and reading.

Although the planar NAND flash memory in which the memory cell transistors are two-dimensionally arranged on the semiconductor substrate has been described above by way of example, the present embodiment is also applicable to a three-dimensionally stacked nonvolatile semiconductor memory in which memory cell transistors are three-dimensionally arranged on a semiconductor substrate.

The configuration of the memory cell array of the three-dimensionally stacked nonvolatile semiconductor memory is described in, for example, U.S. patent application Ser. No. 12/407,403, filed Mar. 19, 2009 "three-dimensionally stacked nonvolatile semiconductor memory". The configuration is also described in, for example, U.S. patent application Ser. No. 12/406,524, filed Mar. 18, 2009 "three-dimensionally stacked nonvolatile semiconductor memory", U.S. patent application Ser. No. 13/816,799, filed Sep. 22, 2011 "nonvolatile semiconductor memory device", and U.S. patent application Ser. No. 12/532,030, filed Mar. 23, 2009 "semiconductor memory and manufacturing method of the same". The entire contents of these patent applications are incorporated herein by reference.

[Data Storing Method by Sequential Storage]

The present embodiment uses a sequential storage method in which m memory cell transistors MC are treated as one unit (hereinafter referred to as a storage unit), and data are stored in the sequence of cell values stored in the memory cell transistors MC of the storage unit. It should be noted that m is a natural number equal to or more than 2 and less than or equal to n.

A data storing method by sequential storage is described with reference to FIGS. 2 and 3.

According to the embodiment, writing is performed so that each of the m memory cell transistors MC in the storage unit will have different threshold voltages $Vth1, Vth2, \ldots,$ and $Vthm$. The threshold voltages $Vth1$ to $Vthm$ here do not need to be specific values or in a specific range, and have only to have different values. "$Vth(m-1)<Vthm$" is satisfied.

For example, when one of the m memory cell transistors MC has the threshold voltage $Vth1$, none of the other $(m-1)$ memory cell transistors MC have the threshold voltage $Vth1$, and the other $(m-1)$ memory cell transistors MC have other $(m-1)$ threshold voltages. That is, only one of the m memory cell transistors MC has a threshold voltage $Vthi$ ($i=1$ to $m$). As will be described later, the m memory cell transistors MC that constitute the storage unit can hold m! kinds of data patterns as a whole. The reason for the m! kinds is that the m! kinds can be represented by the total number of permutations that can be formed by extracting m kinds from different m kinds.

A specific data storing method is shown in FIG. 2. In the example shown in FIG. 2, m=4. For example, the memory cell transistor connected to the bit line BL0 is written as MC0_0. Similarly, the memory cell transistor connected to the bit line BL1 is written as MC0_1, the memory cell transistor connected to the bit line BL2 is written as MC0_2, and the memory cell transistor connected to the bit line BL3 is written as MC0_3. These memory cell transistors MC0_0, MC0_1, MC0_2, and MC0_3 are connected to the same word line WL0.

In the case shown, each of the four memory cell transistors MC0_0, MC0_1, MC0_2, and MC0_3 has one of the threshold voltages $Vth1, Vth2, Vth3,$ and $Vth4$, and all of the memory cell transistors MC0_0, MC0_1, MC0_2, and MC0_3 have different threshold voltages. In this case, the four memory cell transistors MC0_0, MC0_1, MC0_2, and MC0_3 that constitute the storage unit can hold 4! (=24) kinds of data patterns as a whole.

Figure 3:
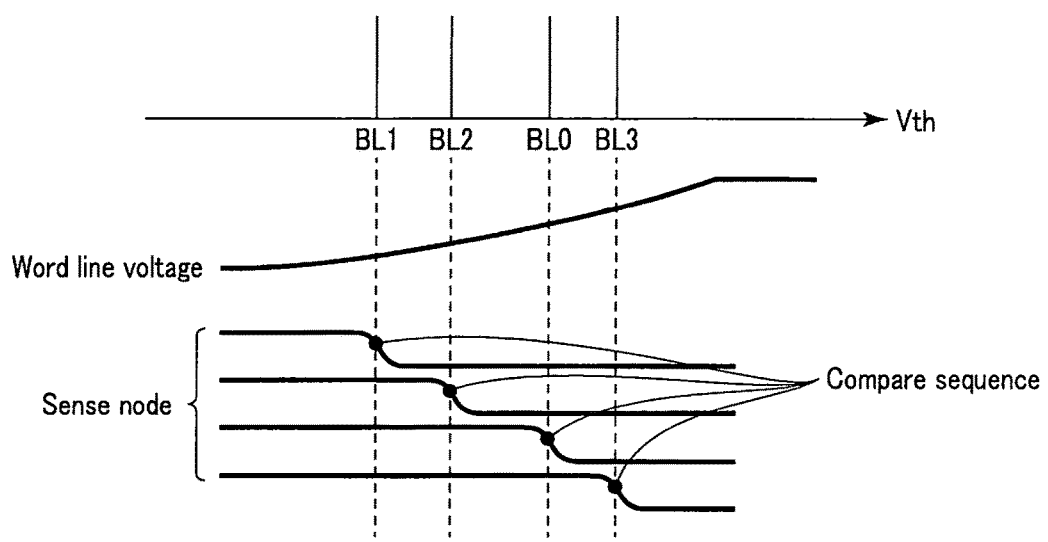
FIG. 3 is a diagram showing a data reading method according to the first embodiment.

In the example shown in FIG. 3, the threshold voltages are sensed from the memory cell transistor MC connected to each of the bit lines BL0 to BL3. The voltage of the word line WL connected in common to the four memory cell transistors MC connected to each of the bit lines BL0 to BL3 is increased gradually as shown in FIG. 3. Thus, the threshold voltage of each of the memory cell transistors MC is sensed in a sense node of the sense amplifier connected to each of the bit lines BL0 to BL3 in ascending order of the threshold voltages of the memory cell transistors MC. In the example shown in FIG. 3, the bit lines BL1, BL2, BL0, and BL3 are in the ascending order of the threshold voltages of the memory cell transistors MC.

It is possible to judge data held by the m memory cell transistors MC that constitute the storage unit by comparing the magnitudes of the threshold voltages of the m memory cell transistors MC by the method shown in FIG. 3. According to this read method, data are judged by the comparison of the threshold voltages of the memory cell transistors MC. Thus, the magnitude relation of the threshold voltages of the memory cell transistors to be compared has only to be maintained, and the incidence of wrong reading can be considerably reduced as compared to a method in which data is read by comparing a reference voltage with the threshold voltage of the memory cell.

If the number of data holding states in this data storing method is found, the condition for the number of data holding states by sequential storage to be greater than the number of data holding states in the case where the memory cells are single-level cells (SLC) is "$\log_2(m!)>m$", and this condition is satisfied when m is equal to or more than 4. That is, if there are four or more memory cell transistors MC that constitute the storage unit, the data amount that can be stored is greater than when the memory cells are SLCs. The SLC is a memory cell capable of independently storing one bit of data.

[Configuration of Sense Amplifier]

The configuration of the sense amplifier 113 according to the embodiment is described with reference to FIG. 4. As shown, the sense amplifier 113 includes the sense amplifier units SAU_0 to SAU_n. The sense amplifier unit SAU_0 is electrically connected to the bit line BL0. The sense amplifier unit SAU_1 is electrically connected to the bit line BL1, and the sense amplifier unit SAU_2 is electrically connected to the bit line BL2. Similarly, the sense amplifier unit SAU_n is electrically connected to the bit line BLn. A sense amplifier unit SAU when mentioned in this way hereinafter indicates each of the sense amplifier units SAU_0 to SAU_n.

The sense amplifier unit SAU_0 includes a sense circuit 10_0 and a sequential comparison circuit 11_0. The sense amplifier unit SAU_1 includes a sense circuit 10_1 and a sequential comparison circuit 11_1, and the sense amplifier unit SAU_2 includes a sense circuit 10_2 and a sequential comparison circuit 11_2. Similarly, the sense amplifier unit SAU_n includes a sense circuit 10_n and a sequential comparison circuit 11_n. A sense circuit 10 when mentioned in this way hereinafter indicates each of the sense circuits 10_0, 10_1, 10_2, . . . , and 10_n, and a sequential comparison circuit 11 when mentioned in this way hereinafter indicates each of the sequential comparison circuits 11_0, 11_1, 11_2, . . . , and 11_n.

Here, a configuration for reading data stored in three memory cell transistors MC0_0, MC0_1, and MC0_2 as the storage unit is described. The bit line BL0 is electrically connected to the sense circuit 10_0. The bit line BL1 is electrically connected to the sense circuit 10_1, and the bit line BL2 is electrically connected to the sense circuit 10_2. The output portion of the sense circuit 10_0 is electrically connected to each of the sequential comparison circuits 11_0 to 11_3. The output portion of the sense circuit 10_1 is electrically connected to each of the sequential comparison circuits 11_0 and 11_1. Moreover, the output portion of the sense circuit 10_2 is electrically connected to each of the sequential comparison circuits 11_1 and 11_2.

Next, the circuit configuration of the sense circuit 10 is described with reference to FIG. 5.

As shown in FIG. 5, the sense circuit 10 has p-channel MOS field effect transistors (hereinafter, pMOS transistors) QP1 and QP2, and n-channel MOS field effect transistors (hereinafter, nMOS transistors) QN1, QN2, QN3, and QN4.

The bit line BL is electrically connected to the source of the nMOS transistor QN2. The drain of the nMOS transistor QN2 is connected to the source of the nMOS transistor QN1. The drain of the nMOS transistor QN1 is connected to the drain of the pMOS transistor QP1, and also connected to the drain of the nMOS transistor QN3 and the gate of the pMOS transistor QP2. The drain of the pMOS transistor QP2 is connected to the drain of the nMOS transistor QN4. A signal SOUT is output to the sequential comparison circuit 11 from a node N1 between the drain of the pMOS transistor QP2 and the drain of the nMOS transistor QN4.

A power supply voltage VDDSA is supplied to the source of the pMOS transistor QP1. A reference voltage, for example, a ground potential GND ("L" level (0 V)) is supplied to the source of the nMOS transistor QN3. Moreover, a power supply voltage VDD ("H" level) is supplied to the source of the pMOS transistor QP2, and a ground potential GND is supplied to the source of the nMOS transistor QN4.

In FIG. 5, BL0 or BL1 is shown as the bit line connected to the sense circuit 10, and as its signal SOUT, SOUT0 or SOUT1 is shown. This is because the threshold voltages of the memory cell transistors MC0_0 and MC0_1 are compared in the read operation described later.

Next, the circuit configuration of the sequential comparison circuit 11 is described with reference to FIGS. 6 and 7.

The sequential comparison circuit 11 receives the signal SOUT from the sense circuit 10 shown in FIG. 5, and latches a signal corresponding to the signal SOUT.

As shown in FIG. 6, the sequential comparison circuit 11 has a transfer gate TG1, an inverter IV1, and a clocked inverter IV2. The transfer gate TG1 includes a pMOS transistor QP3 and an nMOS transistor QN5. The inverter IV1 includes a pMOS transistor QP4 and an nMOS transistor QN6. The clocked inverter IV2 includes pMOS transistors QP5 and QP6 and nMOS transistors QN7 and QN8.

The signal SOUT is input to one end of the transfer gate TG1 from the sense circuit 10. The other end of the transfer gate TG1 is connected to the input end of the inverter IV1. The output end (a node LAT) of the inverter IV1 is connected to the input end of the clocked inverter IV2. Moreover, the output end (a node LATB) of the clocked inverter IV2 is connected to the input end of the inverter IV1. A signal LOUT latched in the sequential comparison circuit 11 is output from the node LATB.

Figure 7:
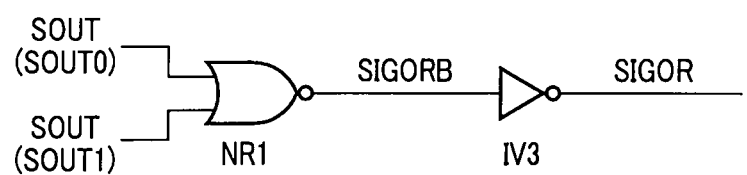

As shown in FIG. 7, the sequential comparison circuit 11 has a NOR circuit NR1 and an inverter IV3. One (e.g., SOUT0) of two signals SOUT to be compared is input to a first input terminal of the NOR circuit NR1, and the other (e.g., SOUT1) of the two signals SOUT is input to a second input terminal of the NOR circuit NR1. In the case shown here in which the cell currents of the bit lines BL0 and BL1 are compared, the signals SOUT0 and SOUT1 are input.

A signal SIGORB is output from the output terminal of the NOR circuit NR1, and input to the input terminal of the inverter IV3. A signal SIGOR is output from the inverter IV3. The signal SIGOR is supplied to the gates of the pMOS transistor QP3 and an nMOS transistor QN8. Further, the signal SIGORB is supplied to the gates of the nMOS transistor QN5 and the pMOS transistor QP6.

The sense amplifier unit SAU senses and compares the cell currents of two different memory cell transistors MC, and thereby latches data in accordance with which of the memory cell transistors has turned on first. That is, data is latched on the basis of the magnitude relation of the threshold voltages of the two memory cell transistors MC.

[Word Line Drivers]

In the present embodiment, the voltage of the selected word line is increased gradually in the read operation, that is, the voltage of the selected word line is swept, for example, from 0 V to a positive first voltage. The configurations of word line drivers and the row decoder 112 according to the embodiment are described with reference to FIG. 4.

The driver 124 has word line drivers 13_0, 13_1, . . . , and 13_15, and select gate line drivers 13_16 and 13_17. The row decoder 112 has nMOS transistors 12_0, 12_1, . . . , and 12_17, and a block decoder 112A.

Each of the word line drivers 13_0 to 13_15 supplies each of the nMOS transistors 12_0 to 12_5 of the row decoder 112 with voltages necessary for data writing, reading, and erasing that have been supplied from the charge pump 122. Each of the word line drivers 13_0 to 13_15 further has a driver to increase gradually a word line voltage shown in FIG. 8. The driver shown in FIG. 8 will be described later in detail.

Each of the select gate line drivers 13_16 and 13_17 supplies each of the nMOS transistors 12_16 and 12_17 of the row decoder 112 with necessary voltages supplied from the charge pump 122 in data writing, reading, and erasing.

The block decoder 112A outputs a signal which brings the nMOS transistors 12_0 to 12_17 of the row decoder 112 into a conducting state or a cutoff state in accordance with a block address. Specifically, in data writing, reading, and erasing, the block decoder 112A outputs a signal which brings the nMOS transistors 12_0 to 12_17 into a conducting state when an input block address corresponds to the block BLK0. In contrast, the block decoder 112A outputs a signal which brings the nMOS transistors 12_0 to 12_17 into a cutoff state when a block address does not correspond to the block BLK0.

The nMOS transistors 12_0 to 12_15 of the row decoder 112 come into the conducting state or the cutoff state in accordance with the signal output from the block decoder 112A, and transfer to the word lines WL0 to WL15 or cut off the voltages supplied from the word line drivers 13_0 to 13_15.

The nMOS transistors 12_16 and 12_17 of the row decoder 112 come into the conducting state or the cutoff state in accordance with the signal output from the block decoder 112A, and transfer to the select gate lines SGD0 and SGS0 or cut off the voltages supplied from the select gate line drivers 13_16 and 13_17.

Next, the driver for sweeping the voltage of the selected word line in the read operation is described with reference to FIG. 8.

Figure 8:
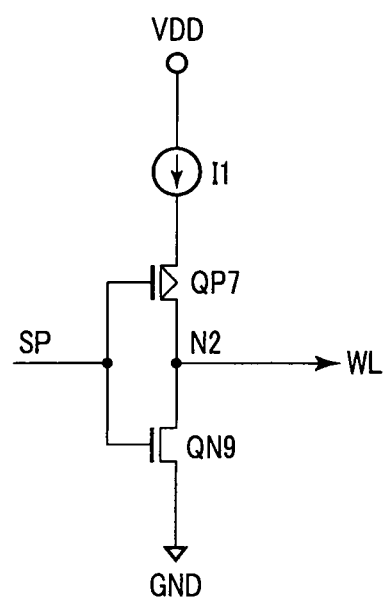
FIG. 8 is a circuit diagram of a word line driver according to the first embodiment.

The driver shown in FIG. 8 has a constant current source I1, a pMOS transistor QP7, and an nMOS transistor QN9. The output terminal of the constant current source I1 is connected to the source of the pMOS transistor QP7. The drain of the pMOS transistor QP7 is connected to the drain of the nMOS transistor QN9. A node N2 between the drain of the pMOS transistor QP7 and the drain of the nMOS transistor QN9 is connected to the word line WL via the row decoder 112. A power supply voltage VDD is supplied to the input terminal of the constant current source I1, and a ground potential GND is supplied to the source of the nMOS transistor QN9. A signal SP for controlling the increase of the word line voltage in response to an instruction from the controller 121 is input to the gates of the pMOS transistor QP7 and the nMOS transistor QN9. As a result, a current for increasing the word line voltage is supplied to the word line WL from the node N2 via the row decoder 112.

[Read Operation]

Next, the read operation according to the present embodiment is described with reference to FIG. 9.

Figure 9:
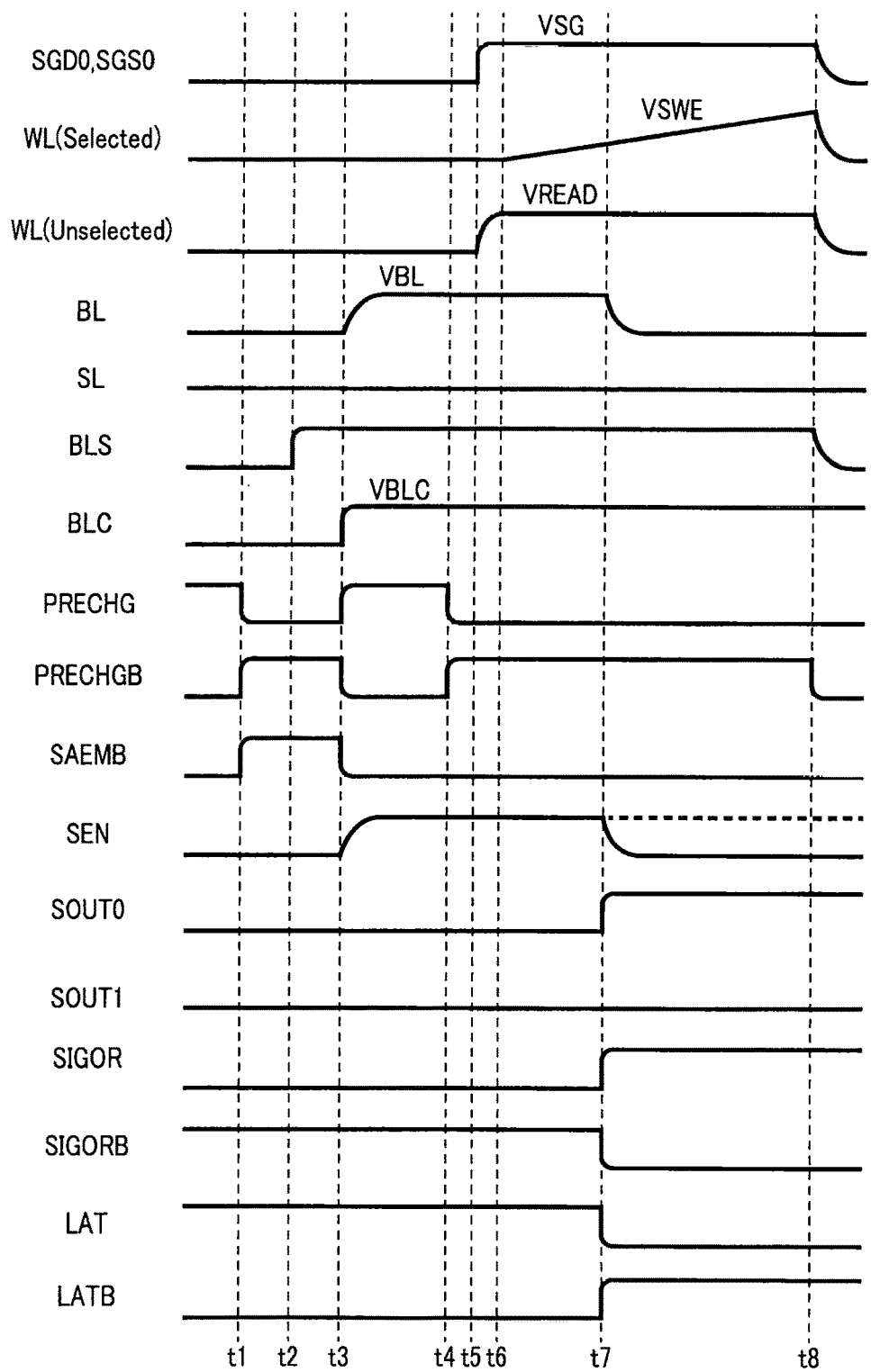
FIG. 9 is a timing chart showing a read operation according to the first embodiment.

A timing chart of various control signals and potentials at various nodes in the read operation is shown in FIG. 9. In the case described here, data is read from the magnitude relation of the threshold voltages of the memory cell transistors MC0_0 and MC0_1. The memory cell transistors MC0_0 and MC0_1 are connected to the same word line WL0. The memory cell transistor MC0_0 is electrically connected to the bit line BL0. The memory cell transistor MC0_1 is electrically connected to BL1.

First, the sense circuit 10 discharges a sense node SEN. Specifically, the controller 121 brings a signal PRECHGB to an "H (high)" level, brings a signal BLC and a signal BLS to an "L (low)" level, and brings a signal SAENB to an "H" level (time t1). Thus, the sense circuit 10 discharges the sense node SEN via the nMOS transistor QN3. The node LATE is reset, and brought to an "L" level.

The controller 121 then brings the signal BLS to an "H" level to connect the sense amplifier unit SAU to the corresponding bit line BL (time t2). Specifically, the sense amplifier unit SAU_0 is connected to the corresponding bit line BL0, and the sense amplifier unit SAU_1 is connected to the corresponding bit line BL1.

The sense circuit 10 then precharges the bit line BL and the sense node SEN. Specifically, the controller 121 brings the signal SAENB to an "L" level, brings the signal BLC to an "H" level, and brings the signal PRECHGB to an "L" level (e.g., time t3). Thus, the sense circuit 10 precharges the bit lines BL0 and BL1 via the nMOS transistors QN1 and QN2. The sense circuit 10 also precharges the sense node SEN. A voltage VBLC in the drawing is a voltage which determines a bit line voltage, and the bit line voltage becomes a voltage VBL clamped by the voltage VBLC.

The sense circuit 10 then senses the bit line BL. Specifically, the controller 121 brings the signal PRECHGB to an "H" level (time t4). The select gate line driver 13_16 then applies a voltage VSG to the select gate line SGD0, and the select gate line driver 13_17 applies a voltage VSG to the select gate line SGS0. Thus, the controller 121 brings the select transistors ST1 and ST2 into the conducting state. The voltage VSG is a voltage which fully turns on the select transistors regardless of the source-side potentials of the select transistors ST1 and ST2. Further, the word line drivers 13_1 to 13_15 apply a voltage VREAD to the unselected word lines WL1 to WL15 (time t5). Further, the word line driver 13_0 applies, to the selected word line WL0, a voltage VSWE which is increased gradually, for example, from 0 V to the positive first voltage (times t6 to t8). That is, the voltage VSWE of the selected word line WL0 is swept from 0 V to the first voltage by the word line driver 130. The voltage of the source line SL is, for example, 0 V.

When the voltage VSWE of the selected word line WL0 is swept, the memory cell transistor having a lower threshold voltage between the memory cell transistors MC0_0 and MC0_1 connected to the word line WL0 first turns on, and a cell current runs through the memory cell transistor which has turned on. In the case described here, the memory cell transistor MC0_0 first turns on. That is, the threshold voltage of the memory cell transistor MC0_0 is lower than the threshold voltage of the memory cell transistor MC0_1.

If the memory cell transistor MC0_0 turns on at a time t7, a cell current runs to the source line SL from the sense node SEN, and the potential of the sense node SEN decreases. On the other hand, the memory cell transistor MC0_1 is off at the time t7, so that no current runs to the source line SL from the sense node SEN, and the potential of the sense node SEN substantially maintains VDDSA.

In the sense circuit 10_0 which senses the bit line BL0, if the potential of the sense node SEN decreases to 0 V at the time t7, the pMOS transistor QP2 turns on. Thus, the sense circuit 10_0 outputs the voltage VDD ("H" level) as the signal SOUT0. On the other hand, in the sense circuit 10_1 which senses the bit line BL1, the potential of the sense node SEN substantially maintains VDDSA at the time t7, so that the pMOS transistor QP2 remains off. Thus, the sense circuit 10_1 outputs the "L" level as the signal SOUT1.

The signal SOUT0 ("H" level) and the signal SOUT1 ("L" level) are input to the sequential comparison circuit 11. The signal SOUT0 is input to the input terminal of the transfer gate TG1 and the first input terminal of the NOR circuit NR1. The signal SOUT1 is input to the second input terminal of the NOR circuit NR1.

The signal SOUT0 ("H" level) input to the transfer gate TG1 passes through the inverter IV1 and becomes the "L" level at the node LAT. Further, the signal SOUT0 passes through the clocked inverter IV2 and becomes the "H" level at the node LATB. In this instance, the signal SIGORB output from the output terminal of the NOR circuit NR1 is at the "L" level. Moreover, the signal SIGOR output from the inverter IV3 is at the "H" level. Thus, if the signal SOUT0 ("H" level) is input to the transfer gate TG1, the transfer gate TG1 immediately comes into the cutoff state. The clocked inverter IV2 is activated, so that the "H" level is latched in the node LATB, and the "L" level is latched in the node LAT.

While the magnitude relation of the threshold voltages of the memory cell transistor MC0_0 and the memory cell transistor MC0_1 is compared in the case of the operation described above, the magnitude relation of the threshold voltages of the memory cell transistor MC0_1 and the memory cell transistor MC0_2 and the magnitude relation of the threshold voltages of the memory cell transistor MC0_2 and the memory cell transistor MC0_0 can also be compared by similar operations.

The signal LOUT latched in the nodes LATB of the sequential comparison circuits 11_0 to 11_2 is then output to the controller 121. The controller 121 finds the magnitude relation of the threshold voltages of the memory cell transistors MC0_0, MC0_1, and MC0_2 from the received signal LOUT. How to find this magnitude relation of the threshold voltages will be described later. Further, data on the found magnitude relation is output to the encoder 121B of the controller 121. The encoder 121B encodes the data on the magnitude relation into binary data. The signal encoded by the encoder 121B is output to the external controller via the input/output buffer 125.

[How to Find Magnitude Relation of Threshold Voltages]

The magnitude relation of the threshold voltages of the memory cell transistors, and the signal LOUT output from the sequential comparison circuit are shown in FIG. 10. As described above, the threshold voltages of the memory cell transistors MC0_0, MC0_1, and MC0_2 are represented by Vth1, Vth2, and Vth3, respectively.

As shown in FIG. 10, when the threshold voltage Vth1 is lower than the threshold voltage Vth2, the signal LOUT output from the sequential comparison circuit 11_0 is "H". When the threshold voltage Vth1 is higher than the threshold voltage Vth2, the signal LOUT from the sequential comparison circuit 11_0 is "L". Similarly, when the threshold voltage Vth2 is lower than the threshold voltage Vth3, the signal LOUT from the sequential comparison circuit 11_1 is "H". When the threshold voltage Vth2 is higher than the threshold voltage Vth3, the signal LOUT from the sequential comparison circuit 11_1 is "L". When the threshold voltage Vth1 is lower than the threshold voltage Vth3, the signal LOUT from the sequential comparison circuit 11_2 is "H". When the threshold voltage Vth1 is higher than the threshold voltage Vth3, the signal LOUT from the sequential comparison circuit 11_2 is "L".

Here, for example, when the outputs of the sequential comparison circuits 11_0, 11_1, and 11_2 are respectively "H", "H", and "H", the magnitude relation of the threshold voltages can be found as follows. The signal LOUT from the sequential comparison circuit 11_0 is "H", so that Vth1<Vth2 is known. The signal LOUT from the sequential comparison circuit 11_1 is "H", so that Vth2<Vth3 is known. Therefore, the magnitude relation of the threshold voltages can be judged to be Vth1<Vth2<Vth3. In this case, the signal LOUT from the sequential comparison circuit 11_2 is always "H".

When the outputs of the sequential comparison circuits 11_0, 11_1, and 11_2 are respectively "L", "L", and "L", the magnitude relation of the threshold voltages can be found as follows. The signal LOUT from the sequential comparison circuit 11_0 is "L", so that Vth1>Vth2 is known. The signal LOUT from the sequential comparison circuit 11_1 is "L", so that Vth2>Vth3 is known. Therefore, the magnitude relation of the threshold voltages can be judged to be Vth1>Vth2>Vth3. In this case, the signal LOUT from the sequential comparison circuit 11_2 is always "L".

When the outputs of the sequential comparison circuits 11_0, 11_1, and 11_2 are respectively "H", "L", and "H", the magnitude relation of the threshold voltages can be found as follows. The signal LOUT from the sequential comparison circuit 11_0 is "H", so that Vth1<Vth2 is known. The signal LOUT from the sequential comparison circuit 11_1 is "L", so that Vth2>Vth3 is known. Therefore, (Vth1 or Vth3) <Vth2 is known. The signal LOUT from the sequential comparison circuit 11_2 is "H", so that Vth1<Vth3 is known. Therefore, the magnitude relation of the threshold voltages can be judged to be Vth1<Vth3<Vth2.

As described above, the magnitude relation of the threshold voltages Vth1, Vth2, and Vth3 can be found from the outputs of the sequential comparison circuits 11_0, 11_1, and 11_2. Although the magnitude relation of the threshold voltages Vth1, Vth2, and Vth3 of the three memory cell transistors MC0_0, MC0_1, and MC0_2 is found in the case shown here, the magnitude relation of four threshold voltages can also be found from the outputs of six sequential comparison circuits when the number of memory cell transistors is four. That is, when the number of memory cell transistors is m, the magnitude relation of m threshold voltages can also be found from the outputs of $(m(m-1)/2)$ sequential comparison circuits. That is, $(m-1)/2$ sequential comparison circuits are needed for one bit line when one cell can hold $LOG_2(m!)/m$ bits of data.

[Effects of Embodiment]

According to the present embodiment, it is possible to provide a semiconductor memory device capable of accurately reading data by use of a sequential storage method of storing data by the sequence of cell values stored in memory cells.

The advantageous effects of the data storing method and reading method according to the embodiment are described below in detail.

According to the embodiment, data are read by the magnitude relation of the threshold voltages of two memory cells to be compared, so that it is not necessary to have a reference voltage for judging the threshold voltages, and it is possible to reduce the influence of the variation of the threshold voltages attributed to, for example, a write disturb, a read disturb, or a temperature change. Thus, accurate data reading is possible. On the other hand, in the case of a device which uses a reference voltage to judge the threshold voltages of memory cells, it is necessary to provide an adequate margin between the threshold voltage and the reference voltage if the variation of the threshold voltages attributed to, for example, a write disturb, a read disturb, or a temperature change is taken into consideration. However, providing an adequate margin is often extremely difficult, in which case wrong reading may occur if the threshold voltages of memory cells vary. According to the present embodiment, the reference voltage for judging the threshold voltages is not used, and the threshold voltages of two memory cells are compared to make a judgment, so that the variation of the threshold voltages is offset, and the effect of the variation of the threshold voltages on reading can be reduced.

According to the embodiment, the effect of a potential rise of the source line SL caused by the cell current on the cell current can be reduced. Even in this embodiment, the potential of the source line SL floats, and the cell current decreases. However, the cell currents of two memory cells to be compared also decrease, and no misjudgment is therefore made.

According to the embodiment, the voltage of the selected word line has only to be increased gradually from 0 V to the first voltage during the read operation, so that it is not necessary to raise the voltage of the word line and wait for the voltage to stabilize. In this way, the reading speed can be higher. On the other hand, in the case of a device which uses the reference voltage to judge the threshold voltages, the memory cells are read by a voltage close to the threshold voltages of the memory cells, so that it is necessary to raise the voltage of the word line and wait for the word line voltage to stabilize, and perform reading with the stabilized word line voltage. This has an effect on the reading speed. When the memory cells are multi-level cells (MLC), it is necessary to set the word line voltage to more than one voltage to perform reading; for example, reading is perform by setting the word line voltage to a first read voltage, and then reading is perform by setting the word line voltage to a second read voltage. According to the present embodiment, as described above, reading can be perform by (linearly) increasing gradually the voltage of the word line from 0 V to a certain voltage only once. Thus, the reading speed can be higher. The MLC is a memory cell capable of storing two-bit data.

According to the embodiment, after the start of the sensing of the cell currents running through the bit lines BL, the sensing is finished at the point where one of the two memory cells to be compared has turned on, and data is latched in the sense amplifier. Thus, there is no need for a strobe signal that indicates the timing of latching the data. On the other hand, in the case of a device which uses the reference voltage to judge the threshold voltages, a strobe signal that indicates the timing of latching the data in the sense amplifier is needed.

As described above, the present embodiment provides a semiconductor memory device which uses a sequential storage method of storing data by the sequence of cell values stored in memory cells, so that accurate data reading is possible without wrong reading.

2. Second Embodiment

Next, the second embodiment is described. In the case described according to the second embodiment, a program verify is performed in consideration of a voltage difference between different threshold voltages. Differences between the first embodiment and the second embodiment are only described below.

[Configuration of Sense Amplifier]

First, the configuration of the sense amplifier 113 according to the embodiment is described with reference to FIG. 11. As shown in FIG. 11, the sense amplifier 113 includes the sense amplifier units SAU_0 to SAU_n, and bias circuits 22 and 23. As in FIG. 4 according to the first embodiment, the sense amplifier units SAU_0 to SAU_n are connected to the bit lines BL0 to BLn, respectively. The bias circuits 22 and 23 may be provided outside the sense amplifier 113.

Each of the sense amplifier units SAU (SAU_0 to SAU_n) includes the sense circuit 10 (10_0 to 10_n) and the order comparison circuit 11 (11_0 to 11_n). The sense circuit 10 is similar to that in FIG. 5 according to the first embodiment. The order comparison circuit 11 according to the present embodiment is different in circuit configuration from the order comparison circuit 11 according to the first embodiment. More specifically, the order comparison circuit 11 according to the present embodiment does not have the circuits shown in FIGS. 6 and 7, and includes a latch circuit 20 and a signal SIGOR generating circuit 21. Hereinafter, the latch circuit of the order comparison circuit 11_0 is represented as 20_0, and the signal SIGOR generating circuit is represented as 21_0. The same also applies to the other order comparison circuits 11_1 to 11_n.

As in FIG. 6 according to the first embodiment, the latch circuit 20 receives the signal SOUT from the sense circuit 10 to be a target of latching, and latches a signal corresponding to the signal SOUT.

In contrast to FIG. 7 according to the first embodiment, the signal SIGOR generating circuit 21 performs a NOR operation by the signal SOUT which is a comparison target and by the potential (held data) of the node LATB of the latch circuit 20, generates signals SIGOR and SIGORB, and sends the signals SIGOR and SIGORB to the latch circuit 20.

The bias circuit 22 is connected in common to the latch circuit 20 of each of the sense amplifier units SAU. The bias circuit 22 controls the current flowing to a ground potential line (ground potential GND) from the node LAT in the latch circuit 20 (this will be described in detail later). If the current flowing to the ground potential line from the node LAT is limited, a delay period is generated in the latch circuit 20 from the inversion of the signal SOUT from the "L" level to the "H" level to the inversion of the potential of the node LAT from the "H" level to the "L" level to determine a logical level (this will be hereinafter referred to as a first delay period).

The bias circuit 23 is connected in common to the signal SIGOR generating circuit 21 of each of the sense amplifier units SAU, and controls the current flowing to the ground potential line from the NOR circuit (which will be described in detail later) in the signal SIGOR generating circuit 21. If the current flowing to the ground potential line from the NOR circuit is limited, a delay period is generated in the NOR circuit from the input of data to the determination of the result ("L" level) of the NOR operation (this will be hereinafter referred to as a second delay period).

[Configurations of Order Circuit and Bias Circuit]

Figure 12:
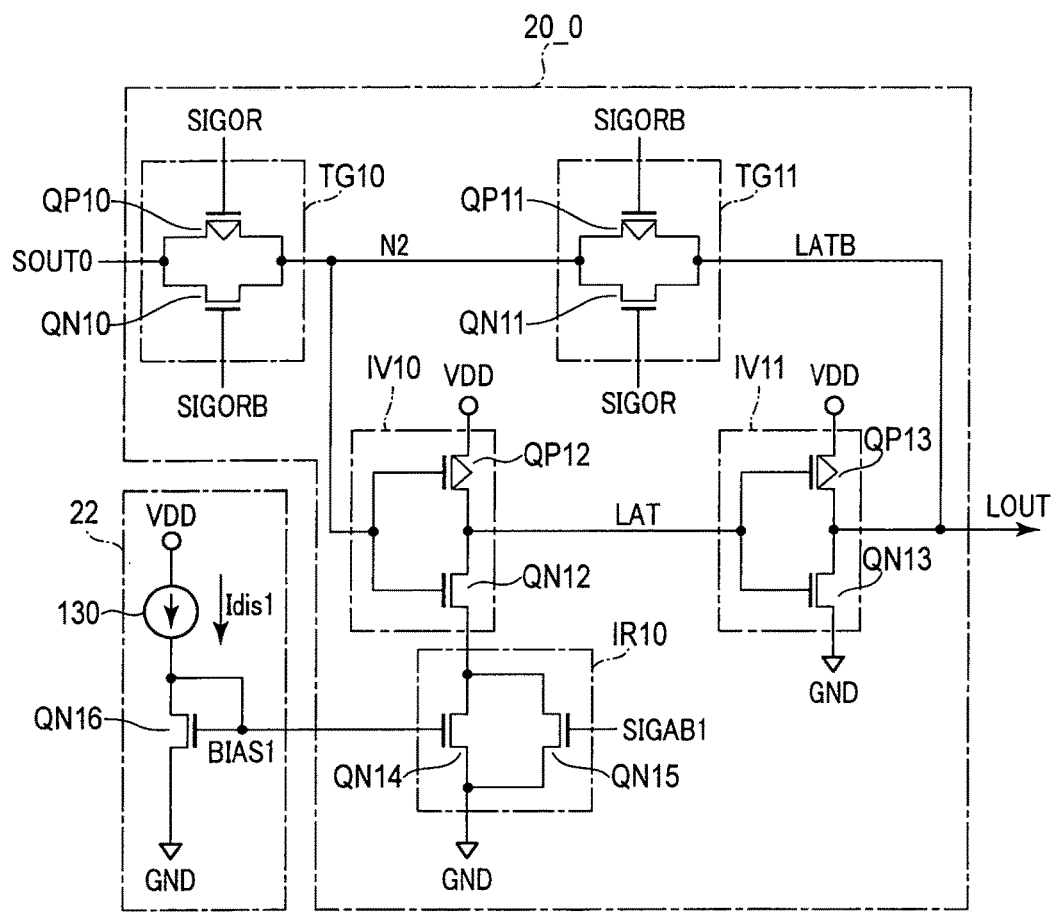
FIGS. 12 and 13 are circuit diagrams of the order comparison circuit of the sense amplifier according to the second embodiment.
Figure 13:
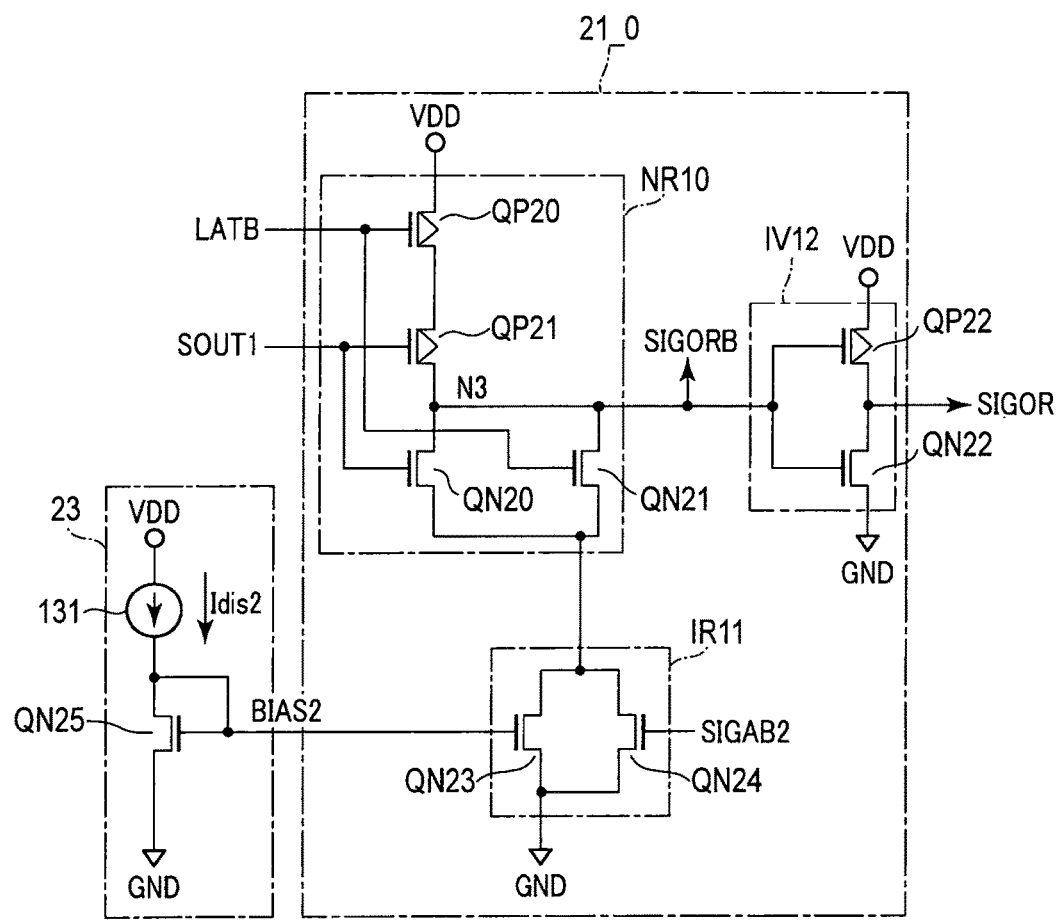

Next, the circuit configurations of the order comparison circuit 11 and the bias circuits 22 and 23 according to the present embodiment are described with reference to FIGS. 12 and 13. FIG. 12 shows the latch circuit 20_0 and the bias circuit 22. FIG. 13 shows the signal SIGOR generating circuit 21 and the bias circuit 23. While FIGS. 12 and 13 show examples of the latch circuit 20_0 and the signal SIGOR generating circuit 21_0 included in the order comparison circuit 11_0, the other order comparison circuits 11_1 to 11_n also have the same configuration. In the following explanation, the source and drain of a transistor are simply referred to as "one end of the transistor" and "the other end of the transistor" unless otherwise specified.

As shown in FIG. 12, the latch circuit 20_0 according to the present embodiment receives the signal SOUT0 from the sense circuit 10 (10_0) shown in FIG. 5 according to the first embodiment, and latches a signal corresponding to the signal SOUT0.

The latch circuit 20_0 includes transfer gates TG10 and TG11, inverters IV10 and IV11, and a current control circuit IR10. The signal SOUT0 is input to one end of the transfer gate TG10 from the sense circuit 10. The other end of the transfer gate TG10 is connected to one end of the transfer gate TG11 and the input end of the inverter IV10. The output end (node LAT) of the inverter IV10 is connected to the input end of the inverter IV11. A ground potential GND is applied to the inverter IV10 via the current control circuit IR10. The output end (node LATB) of the inverter IV11 is connected to the other end of the transfer gate TG11. A signal LOUT latched in the order comparison circuit 11 is output from the node LATB.

More specifically, the transfer gate TG10 includes a pMOS transistor QP10 and an nMOS transistor QN10. The transfer gate TG10 is similar to that in FIG. 6 according to the first embodiment, so that the transistor QP10 corresponds to the transistor QP3, and the transistor QN10 corresponds to the transistor QN5. The transfer gate TG10 sends the signal SOUT0 to one end of the transfer gate TG11 and the input end of the inverter IV1 when the signal SIGOR is at the "L" level or the signal SIGORB is at the "H" level.

The transfer gate TG11 includes a pMOS transistor QP11 and an nMOS transistor QN11. The signal SIGORB is input to the gate of the transistor QP11. The signal SIGOR is input to the gate of the transistor QN11. Therefore, the transfer gate TG11 electrically connects the node N2 and the node LATB when the signal SIGOR is at the "H" level or the signal SIGORB is at the "L" level.

The inverter IV10 includes a pMOS transistor QP12 and an nMOS transistor QN12. A power supply voltage VDD is applied to the source of the transistor QP12, and the transistor QP12 has the drain connected to the node LAT, and the gate connected to the node N2. The transistor QN12 has the drain connected to the node LAT, the source connected to the input end of the current control circuit IR10, and the gate connected to the node N2.

The inverter IV11 includes a pMOS transistor QP13 and an nMOS transistor QN13. A power supply voltage VDD is applied to the source of the transistor QP13, and the transistor QP13 has the drain connected to the node LATB, and the gate connected to the node LAT. The drain of the transistor QN13 is connected to the node LATB, a ground potential GND is applied to the source of the transistors QN13, and the gate of the transistor QN13 is connected to the node LAT.

The current control circuit IR10 controls the current flowing to the ground potential line from the inverter IV10. The current control circuit IR10 includes transistors QN14 and QN15. The drains of the transistors QN14 and QN15 are connected to the source of the transistor QN12. A ground potential GND is applied to the sources of the transistors QN14 and QN15 (the sources of the transistors QN14 and QN15 are connected to the ground potential line). The gate of the transistor QN14 is connected to a node BIAS1. The current flowing in the transistor QN14 is limited by the control of the bias circuit 22. A signal SIGAB1 is input to the gate of the transistor QN15.

The signal SIGAB1 is input from the controller 121. When the signal SIGAB1 is at the "L" level, the first delay period is generated in the latch circuit 20. For example, in the write operation, the threshold voltage Vth1 of the memory cell transistor MC0_0 and the threshold voltage Vth2 of the memory cell transistor MC0_1 have a relation Vth1<Vth2. That is, in the latch circuit 20_0, the signal SOUT0 is inverted from the "L" level to the "H" level before the signal SOUT1 which is a comparison target. In this case, the controller 121 brings the signal SIGAB1 to the "L" level in the program verify. Meanwhile, when the threshold voltages have a relation Vth1>Vth2 in the write operation, the controller 121 brings the signal SIGAB1 to the "H" level in the program verify. In the case of the read operation, the controller 121 brings the signal SIGAB1 to the "L" level so that the first delay period will not be generated.

The bias circuit 22 includes a current source 130 and an nMOS transistor QN16. A power supply voltage VDD is applied to the input end of the current source 130, and the output end of the current source 130 is connected to the drain and gate of the diode-connected transistor QN16. The current source 130 supplies a current Idis1 under the control of the controller 121. A ground potential GND is applied to the source of the transistor QN16. The transistors QN14 and QN16 constitute a current mirror circuit. Therefore, for example, when the transistors QN14 and QN16 have the same transistor size (and characteristics), the current flowing in the transistor QN14 is the same as the current flowing in the transistor QN16. The controller 121 controls the current flowing in the transistor QN14 by controlling the current Idis1.

For example, when the signal SIGAB1 is at the "L" level, the transistor QN15 is turned off. Thus, when the potential of the node LAT is inverted from the "H" level to the "L" level, the node LAT is discharged via the transistor QN14. However, the current flowing from the node LAT to the ground potential line is limited by the bias circuit 22 and the current control circuit IR10. Thus, the potential of the node LAT slowly decreases. Therefore, the first delay period is generated from the inversion of the signal SOUT0 from the "L" level to the "H" level to the inversion of the potential of the node LAT from the "H" level to the "L" level to determine a logical level.

Next, the circuit configurations of the signal SIGOR generating circuit 21 and the bias circuit 23 are described.

As shown in FIG. 13, the signal SIGOR generating circuit 21_0 has a NOR circuit NR10, an inverter IV12, and a current control circuit IR11. To the first input end of the NOR circuit 10, the voltage (logical level) of the node LATB is input from the latch circuit 20_0. To the second input end of the NOR circuit 10, the signal SOUT1 is input from the latch circuit 20_1. The signal SIGORB is output from the output end of the NOR circuit NR10. A ground potential GND is applied to the NOR circuit NR10 via the current control circuit IR11. The input end of the inverter IV12 is connected to the output end of a NOR circuit NR11, and the signal SIGOR is output from the output end of the inverter IV12.

More specifically, the NOR circuit NR10 includes pMOS transistors QP20 and QP21, and nMOS transistors QN20 and QN21. A power supply voltage VDD is applied to the source of the transistor QP20, and the drain of the transistor QP20 is connected to the source of the transistor QP21. The gate of the transistor QP20 is connected to the node LATB of the latch circuit 20_0. The drain of the transistor QP21 is connected to a node N3, and the signal SOUT1 is input to the gate of the transistor QP21. The transistors QN20 and QN21 have the drains connected to the node N3, and the sources connected to the input end of the current control circuit IR11. The voltage of the node N3 is output as the signal SIGORB. The signal SOUT1 is input to the gate of the transistor QN20. The gate of the transistor QN21 is connected to the node LATB.

For example, when both the node LATB and the signal SOUT1 are at the "L" level, the transistors QP20 and QP21 turn on. Thus, the potential of the node N3, that is, the signal SIGORB is brought to the "H" level. In the meantime, when at least one of the potential of the node LATB and the signal SOUT1 is at the "H" level, at least one of the transistors QP20 and QP21 is turned off, and at least one of the transistors QN20 and QN21 is turned on. Thus, the potential of the node N3, that is, the signal SIGORB is brought to the "L" level.

The inverter IV12 includes a pMOS transistor QP22 and an nMOS transistor QN22. A power supply voltage VDD is applied to the source of the transistor QP22, and the drain of the transistor QP22 is connected to the drain of the transistor QN22. The voltage of the drain of the transistor QP22 is output as the signal SIGOR. The gate of the transistor QP22 is connected to the node N3. A ground potential GND is applied to the source of the transistor QN22, and the gate of the transistor QN22 is connected to the node N3.

The current control circuit IR11 controls the current flowing to the ground potential line from the NOR circuit NR10. The current control circuit IR11 is similar in configuration to the current control circuit IR10, and includes transistors QN23 and QN24. The drains of the transistors QN23 and QN24 are connected to the NOR circuit NR10, and a ground potential GND is applied to the sources of the transistors QN23 and QN24 (the sources of the transistors QN23 and QN24 are connected to the ground potential line). The gate of the transistor QN23 is connected to a node BIAS2. The current flowing in the transistor QN23 is limited by the control of the bias circuit 23. A signal SIGAB2 is input to the gate of the transistor QN24.

The signal SIGAB2 is input from the controller 121. When the signal SIGAB2 is at the "L" level, the second delay period is generated in the NOR circuit NR10. For example, in the write operation, the threshold voltages have the relation Vth1>Vth2. In this case, the controller 121 brings the signal SIGAB2 to the "L" level. Meanwhile, when the threshold voltages have the relation Vth1<Vth2 in the write operation or in the case of the read operation, the controller 121 brings the signal SIGAB2 to the "H" level.

The bias circuit 23 is similar in configuration to the bias circuit 22, and includes a current source 131 and an nMOS transistor QN25. A power supply voltage VDD is applied to the input end of the current source 131, and the output end of the current source 131 is connected to the drain and gate of the diode-connected transistor QN25. The current source 131 supplies a current under the control of the controller 121. A ground potential GND is applied to the source of the transistor QN25. The transistors QN23 and QN25 constitute a current mirror circuit. Therefore, for example, when the transistors QN23 and QN25 have the same transistor size (and characteristics), the current flowing in the transistor QN23 is the same as the current flowing in the transistor QN25. The controller 121 controls the current flowing in the transistor QN23 by controlling the current Idis2.

For example, when the signal SIGAB2 is at the "L" level, the transistor QN24 is turned off. Thus, when the potential of the node N3 is inverted from the "H" level to the "L" level, the node N3 is discharged via the transistor QN23. However, the current flowing from the node N3 to the ground potential line is limited by the bias circuit 23 and the current control circuit IR11. Thus, the potential of the node N3 slowly decreases. Therefore, the second delay period is generated from the inversion of the signal SOUT1 or the potential of the node LATB from the "L" level to the "H" level to the determination of the potential of the node N3, that is, the logical level of the signal SIGORB.

The bias circuits 22 and 23 may be connected to the transistors QN14 and QN23 via buffers (e.g., voltage follower circuits).

[Write Operation]

Figure 14:
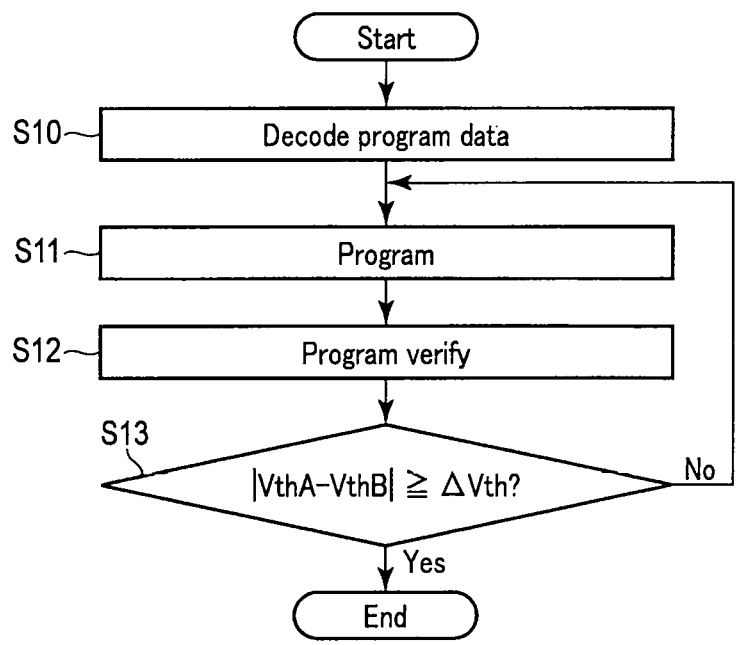
FIG. 14 is a flowchart of a write operation according to the second embodiment.

Next, the write operation according to the present embodiment is briefly described. FIG. 14 is a flowchart of the write operation according to the present embodiment. Hereinafter, in the latch circuit 20, the threshold voltage of the memory cell transistor MC to be a latch target is VthA, and the threshold voltage of the memory cell transistor MC to be a comparison target is VthB. For example, in the order comparison circuit 11_0, the threshold voltage Vth1 corresponds to the threshold voltage VthA, and the threshold voltage Vth2 corresponds to the threshold voltage VthB.

The write operation roughly includes a program and the program verify. A combination of the program and the program verify will be hereinafter referred to as a program loop. By the repetition of the program loop, the threshold voltage Vth of the memory cell transistor MC rises, and the voltage difference between the different threshold voltages Vth1 to Vthm increases.

In the present embodiment, in the program verify, a verify judgment is made by whether the voltage difference (|VthA−VthB|) between two threshold voltages to be compared is greater than a preset margin voltage ΔVth, and the program loop is repeated until the voltage difference (|VthA−VthB|) between the threshold voltages becomes greater than the margin voltage ΔVth.

As shown in FIG. 14, the controller 121 first decodes write data in the decoder 121A to generate data (hereinafter referred to as "order data") to be written into the blocks BLK (step S10).

The controller 121 then executes the program on the basis of the order data (step S11).

The controller 121 then executes the program verify (step S12). More specifically, the controller 121 first decides the signals SIGAB1 and SIGAB2 to be sent to the respective order comparison circuits 11, on the basis of the order data. The controller 121 also decides a verify judgment level on the basis of the order data. The verify judgment level indicates the logical level to be latched in the order comparison circuit 11 (node LAT) when the threshold voltages have a relation |VthA−VthB|≥ΔVth. The controller 121 performs the verify judgment by whether the magnitude relation of the threshold voltages VthA and VthB based on the reading (program verify), that is, the latched data in the order comparison circuit 11 corresponds to the verify judgment level.

When the threshold voltages based on the order data have a relation VthA<VthB, the controller 121 brings the signal SIGAB1 to the "L" level, brings the signal SIGAB2 to the "H" level, and brings the verify judgment level to the "L" level. Meanwhile, when the threshold voltages based on the order data have a relation VthA>VthB, the controller 121 brings the signal SIGAB1 to the "H" level, brings the signal SIGAB2 to the "L" level, and brings the verify judgment level to the "H" level.

When the relation is |VthA−VthB|<ΔVth (S13_No), that is, when the voltage difference between the threshold voltage VthA and the threshold voltage VthB is smaller than the margin voltage ΔVth, the verify judgment level does not correspond to the latched data in the order comparison circuit 11. Therefore, the controller 121 judges that the program verify has been failed, returns to step S11, and again executes the program.

Meanwhile, when the relation is |VthA−VthB|≥ΔVth (S13_Yes), that is, when the voltage difference between the threshold voltages VthA and VthB is equal to or more than the margin voltage ΔVth, the verify judgment level corresponds to the latched data in the order comparison circuit 11. Therefore, the controller 121 judges that the program verify has been passed, and finishes the write operation.

[Examples of Program Verify]

Next, four examples of the program verify according to the present embodiment are shown. In the case described here, data is written into the memory cell transistors MC0_0 and MC0_1, and the magnitude relation between the threshold voltages Vth1 and Vth2 is compared in the program verify.

First Example (Vth2−Vth1)≥ΔVth

Figure 15:
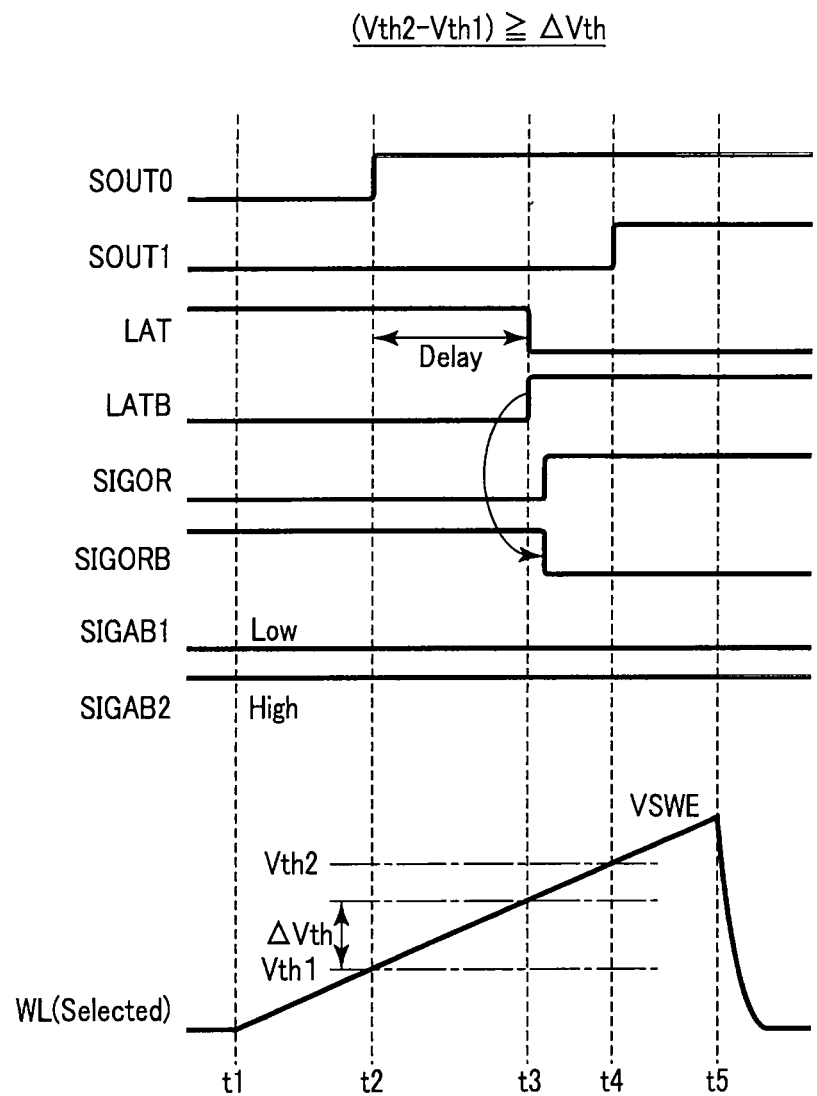
FIG. 15 is a timing chart showing a program verify operation in a first example according to the second embodiment.

First described with reference to FIG. 15 is the case where the threshold voltages based on the order data have the relation Vth1<Vth2, and the threshold voltages after the program have the relation (Vth2−Vth1)≥ΔVth. FIG. 15 is a timing chart of various control signals and potentials at various nodes of the order comparison circuit 11_0 in the program verify in a first example according to the present embodiment.

When the threshold voltages based on the order data have the relation Vth1<Vth2, a potential (data) at the "L" level is held in the node LAT of the latch circuit 20_0 if writing is normally performed. Therefore, the controller 121 sets the verify judgment level for the order comparison circuit 11_0 to the "L" level.

As shown in FIG. 15, the row decoder 112 starts the sweeping of the voltage VSWE of the selected word line WL0 (time t1). In this instance, in the order comparison circuit 11_0, the signals SOUT0, SOUT1, SIGOR, and SIGAB1 and the potential of the node LATB are brought to the "L" level, and the signals SIGORB and SIGAB2 and the potential of the node LAT are brought to the "H" level. Therefore, in the latch circuit 20_0, the transfer gate TG10 is brought into an electrically conductive state, and the transfer gate TG11 is brought into a shut-off state.

When the voltage VSWE becomes higher than the threshold voltage Vth1, the memory cell transistor MC0_0 connected to the selected word line WL0 then is turned on (time t2). As a result, the sense circuit 10_0 brings the signal SOUT0 to the "H" level.

The first delay period elapses (time t3), and in the latch circuit 20_0, the logical levels of the potential ("L" level) of the node LAT and the potential ("H" level) of the node LATB are determined. The potential of the node LATB has been inverted from the "H" level to the "L" level, so that in the signal SIGOR generating circuit 21_0, the signal SIGOR is inverted from the "L" level to the "H" level, and the signal SIGORB is inverted from the "H" level to the "L" level. In the latch circuit 20_0, the logical levels of the signals SIGOR and SIGORB have been inverted, so that the transfer gate TG10 is brought into a shut-off state, and the transfer gate TG11 is brought into an electrically conductive state.

The increase of the voltage VSWE in the first delay period (the interval between the times t2 and t3) corresponds to the margin voltage ΔVth.

When the voltage VSWE becomes higher than the threshold voltage Vth2, the memory cell transistor MC0_1 connected to the selected word line WL0 then is turned on (time t4). As a result, the sense circuit 10_1 brings the signal SOUT1 to the "H" level.

The row decoder 112 then finishes the sweeping of the voltage VSWE of the selected word line WL0 (time t5).

The node LAT of the latch circuit 20_0 is holding data at the "L" level and corresponds to the verify judgment level, so that the controller 121 judges that the program verify has been passed.

Second Example (Vth2−Vth1)<ΔVth

Next described with reference to FIG. 16 is the case where the threshold voltages based on the order data have the relation Vth1<Vth2, and the threshold voltages after the program have the relation (Vth2−Vth1)<ΔVth. FIG. 16 is a timing chart of various control signals and potentials at various nodes of the order comparison circuit 11_0 in the program verify in a second example according to the present embodiment.

As in the first example according to the present embodiment, the controller 121 sets the verify judgment level for the order comparison circuit 11_0 to the "L" level.

As shown in FIG. 16, the row decoder 112 starts sweeping of the voltage VSWE of the selected word line WL0 (time t1). The various signals and the potentials of the various nodes in the order comparison circuit 11_0 are the same as those in FIG. 15 in the first example.

Further, when the voltage VSWE becomes higher than the threshold voltage Vth1, the sense circuit 10_0 brings the signal SOUT0 to the "H" level (time t2).

When the voltage VSWE becomes higher than the threshold voltage Vth2, the sense circuit 10_1 brings the signal SOUT1 to the "H" level (time t3). Here, the interval between the times t2 and t3 is shorter than the first delay period (the interval between the times t2 and t4). The signal SOUT1 has been inverted from the "L" level to the "H" level, so that in the signal SIGORB generating circuit 21_0, the signal SIGORB is inverted from the "H" level to the "L" level, and the signal SIGOR is inverted from the "L" level to the "H" level. In the latch circuit 20_0, the logical levels of the signals SIGOR and SIGORB have been inverted, so that the transfer gate TG10 is brought into a shut-off state, and the transfer gate TG11 is brought into an electrically conductive state. As a result, the "L" level voltage of the node LATB is applied to the inverter IV10, and the node LAT therefore holds the "H" level data.

The row decoder 112 then finishes the sweeping of the voltage VSWE of the selected word line WL0 (time t5).

The node LAT of the latch circuit 20_0 is holding data at the "L" level and does not correspond to the verify judgment level, so that the controller 121 judges that the program verify has been failed.

Third Example (Vth1−Vth2)≥ΔVth

Figure 17:
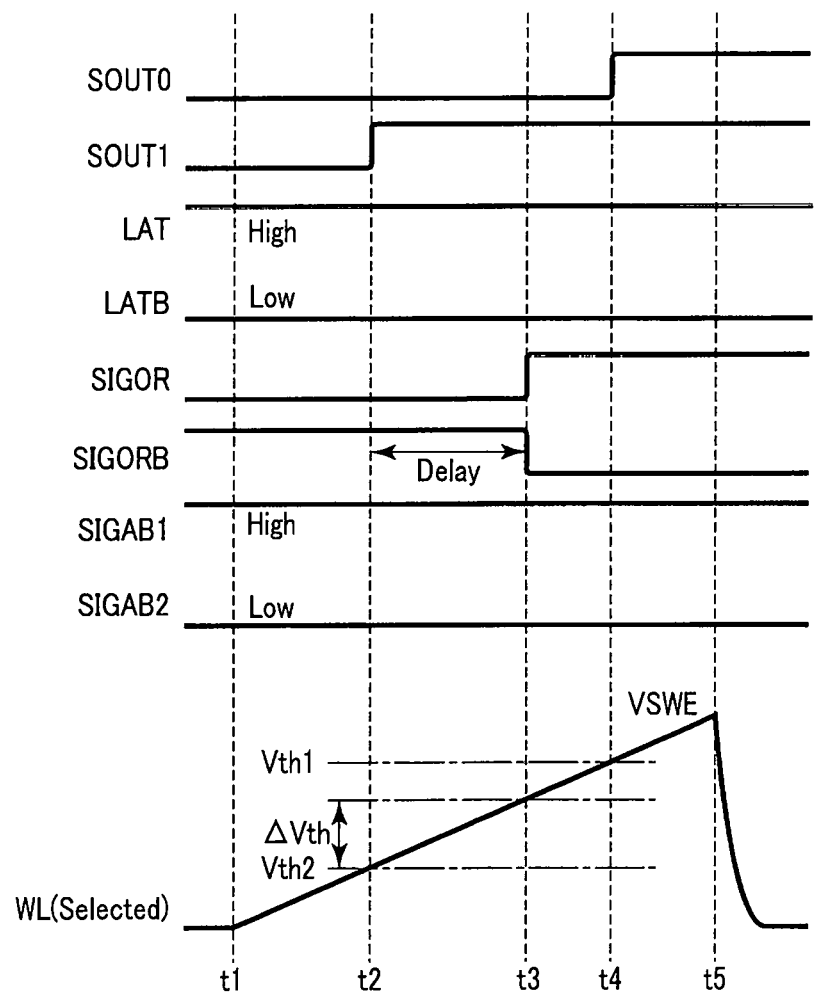
FIG. 17 is a timing chart showing a program verify operation in a third example according to the second embodiment.

Next described with reference to FIG. 17 is the case where the threshold voltages based on the order data have the relation Vth1>Vth2, and the threshold voltages after the program have the relation (Vth1−Vth2)≥ΔVth. FIG. 17 is a timing chart of various control signals and potentials at various nodes of the order comparison circuit 11_0 in the program verify in a third example according to the present embodiment.

When the threshold voltages based on the order data have the relation Vth1>Vth2, data at the "H" level is held in the node LAT of the latch circuit 20_0 if writing is normally performed. Therefore, the controller 121 sets the verify judgment level for the order comparison circuit 11_0 to the "H" level.

As shown in FIG. 17, the row decoder 112 starts the sweeping of the voltage VSWE of the selected word line WL0 (time t1). In this instance, in the order comparison circuit 11_0, the signals SOUT0, SOUT1, SIGOR, and SIGAB2 and the potential of the node LATB are brought to the "L" level, and the signals SIGORB and SIGAB1 and the potential of the node LAT are brought to the "H" level.

When the voltage VSWE becomes higher than the threshold voltage Vth2, the memory cell transistor MC0_1 connected to the selected word line WL0 then is turned on (time t2). As a result, the sense circuit 10_1 brings the signal SOUT1 to the "H" level.

The second delay period elapses (time t3), and in the signal SIGOR generating circuit 21_0, the signal SIGOR is inverted from the "L" level to the "H" level, and the signal SIGORB is inverted from the "H" level to the "L" level. Accordingly, in the latch circuit 20_0, the transfer gate TG10 is brought into a shut-off state, and the transfer gate TG11 is brought into an electrically conductive state.

The increase of the voltage VSWE in the second delay period (the interval between the times t2 and t3) corresponds to the margin voltage ΔVth.

When the voltage VSWE becomes higher than the threshold voltage Vth1, the memory cell transistor MC0_0 connected to the selected word line WL0 then is turned on (time t4). As a result, the sense circuit 10_0 brings the signal SOUT0 to the "H" level.

The row decoder 112 then finishes the sweeping of the voltage VSWE of the selected word line WL0 (time t5).

The node LAT of the latch circuit 20_0 is holding data at the "L" level and corresponds to the verify judgment level, so that the controller 121 judges that the program verify has been passed.

Fourth Example (Vth1−Vth2)<ΔVth

Figure 18:
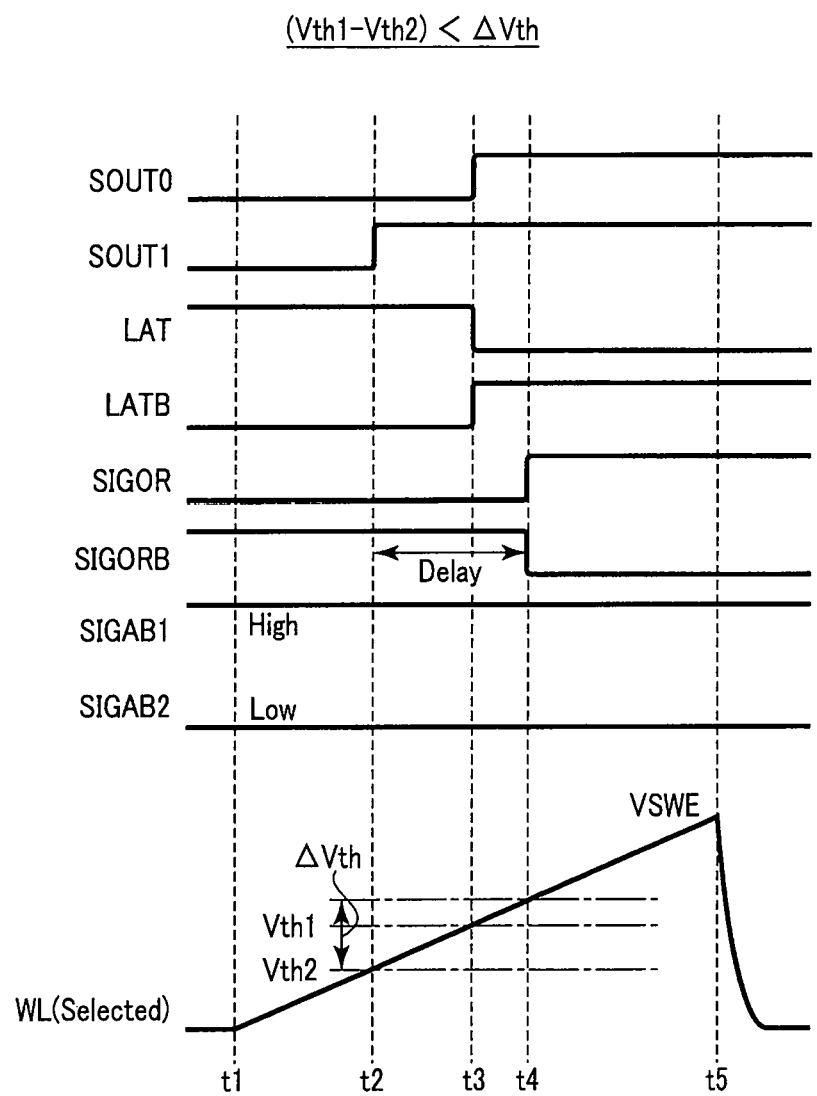
FIG. 18 is a timing chart showing a program verify operation in a fourth example according to the second embodiment.

Next described with reference to FIG. 18 is the case where the threshold voltages based on the order data have the relation Vth1>Vth2, and the threshold voltages after the program have the relation (Vth1−Vth2)<ΔVth. FIG. 18 is a timing chart of various control signals and potentials at various nodes of the order comparison circuit 11_0 in the program verify in a fourth example according to the present embodiment.

As in the third example according to the present embodiment, the controller 121 sets the verify judgment level for the order comparison circuit 11_0 to the "H" level.

As shown in FIG. 18, the row decoder 112 starts the sweeping of the voltage VSWE of the selected word line WL0 (time t1). The various control signals and the potentials of the various nodes in the order comparison circuit 11_0 are the same as those in FIG. 17 in the third example.

When the voltage VSWE becomes higher than the threshold voltage Vth2, the sense circuit 10_1 then brings the signal SOUT1 to the "H" level (time t2).

When the voltage VSWE becomes higher than the threshold voltage Vth1, the sense circuit 10_0 brings the signal SOUT0 to the "H" level (time t3). The interval between the times t2 and t3 is shorter than the second delay period (the interval between the times t2 and t4). The signal SOUT0 has been inverted from the "L" level to the "H" level, so that the node LAT holds the "L" level data, and the node LATB holds the "H" level data.

The second delay period elapses (time t4), and in the signal SIGOR generating circuit 21_0, the signal SIGOR is inverted from the "L" level to the "H" level, and the signal SIGORB is inverted from the "H" level to the "L" level. Accordingly, in the latch circuit 20_0, the transfer gate TG10 is brought into a shut-off state, and the transfer gate TG11 is brought into an electrically conductive state.

The row decoder 112 then finishes the sweeping of the voltage VSWE of the selected word line WL0 (time t5).

The node LAT of the latch circuit 20_0 is holding data at the "L" level and does not correspond to the verify judgment level, so that the controller 121 judges that the program verify has been failed.

[First and Second Delay Periods]

Next, the relation between the first and second delay periods and the currents Idis1 and Idis2 is briefly described. FIG. 19 is a graph showing the relation between the current Idis1 (Idis2) and the first (second) delay period.

As shown in FIG. 19, as the current Idis1 decreases, the current flowing from the node LAT to the ground potential line is reduced, and the first delay period therefore becomes longer. Similarly, as the current Idis2 decreases, the current flowing from the node N3 to the ground potential line is reduced, and the second delay period therefore becomes longer. The lengths of the first and second delay periods, that is, the margin voltage ΔVth can be adjusted by the control of the currents Idis1 and Idis2. The lengths of the first delay period and the second delay period may be the same or different.

[Advantageous Effects of the Embodiment]

According to the semiconductor memory device in the present embodiment, advantageous effects similar to those in the first embodiment can be obtained.

Moreover, the configuration according to the present embodiment enables the verify judgment to be made in the program verify by whether the voltage difference between the two threshold voltages (VthA and VthB) is greater than the preset margin voltage ΔVth. That is, data can be written so that the voltage difference between the threshold voltages of two memory cell transistors MC to be program targets will be equal to or more than the preset margin voltage ΔVth. Consequently, in the read operation, wrong judgments in the order comparison circuits can be reduced. Therefore, the reliability of the semiconductor memory device can be improved.

3. Third Embodiment

Next, the third embodiment is described. In the third embodiment, the order comparison circuit 11 different from that in the second embodiment is described. Differences between the third embodiment and the first and second embodiments are only described below.

[Configuration of Sense Amplifier]

Figure 20:
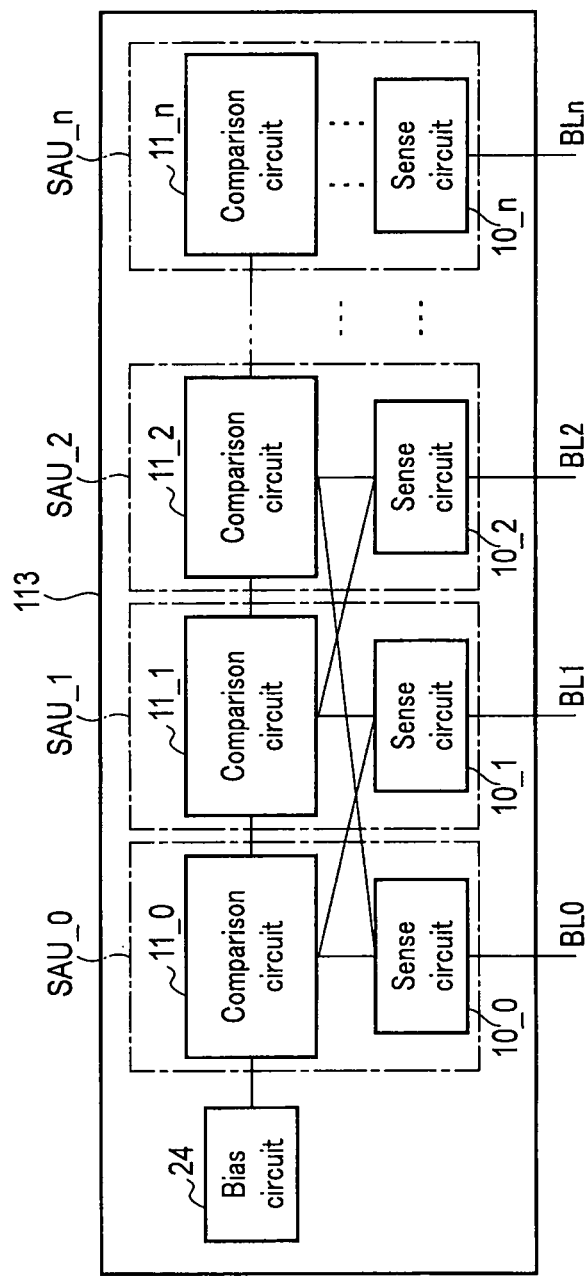
FIG. 20 is a block diagram showing the configuration of the sense amplifier according to a third embodiment.

The configuration of the sense amplifier 113 according to the embodiment is described with reference to FIG. 20. As shown in FIG. 20, the sense amplifier 113 includes the sense amplifier units SAU_0 to SAU_n, and a bias circuit 24. As in FIG. 4 according to the first embodiment, the sense amplifier units SAU_0 to SAU_n are connected to the bit lines BL0 to BLn, respectively. The bias circuit 24 may be provided outside the sense amplifier 113.

Each of the sense amplifier units SAU (SAU_0 to SAU_n) includes the sense circuit 10 (10_0 to 10_n) and the order comparison circuit 11 (11_0 to 11_n). The sense circuit 10 is similar to that in FIG. 5 according to the first embodiment. The order comparison circuit 11 is different in configuration from the order comparison circuit 11 according to the first and second embodiments, but can generate the first delay period and the second delay period as in the second embodiment (details will be described later).

The bias circuit 24 is connected in common to each of the order comparison circuits 11, and controls the current flowing to the ground potential line from the order comparison circuit 11.

[Configuration of Order Comparison Circuit]

Figure 21:
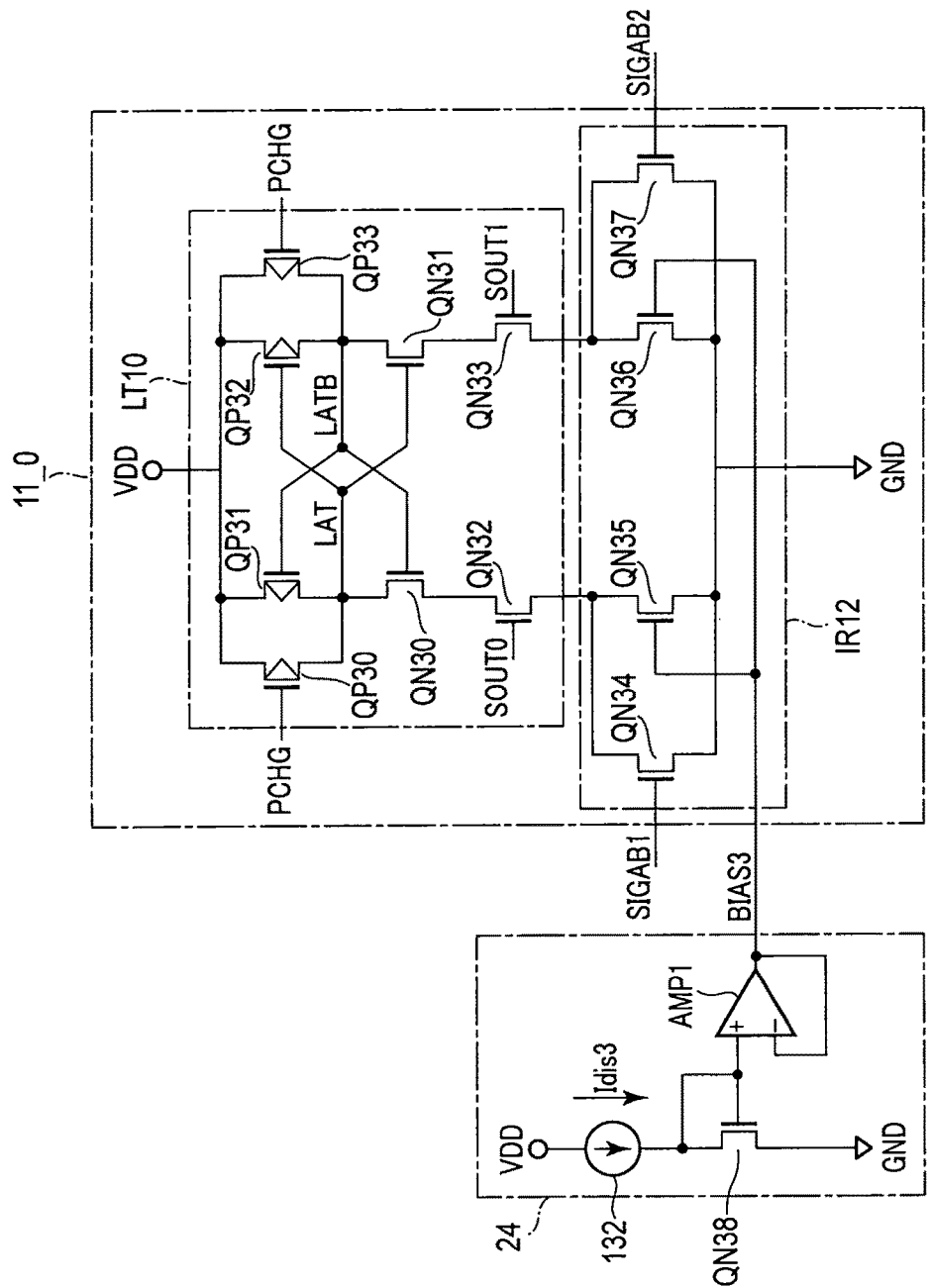
FIG. 21 is a circuit diagram of the order comparison circuit of the sense amplifier according to the third embodiment.

Next, the circuit configurations of the order comparison circuit 11 and the bias circuit 24 according to the present embodiment are described with reference to FIG. 21. FIG. 21 shows an example of the order comparison circuit 11_0, but the other order comparison circuits 11_1 to 11_n also have the same configuration.

As shown in FIG. 21, the order comparison circuit 21 has a latch circuit LT10 and a current control circuit IR12.

The latch circuit LT10 includes pMOS transistors QP30 to QP33, and nMOS transistors QN30 to QN33. The sources of the transistors QP30 to QP33 are connected in common, and a power supply voltage VDD is applied thereto. The drain of the transistor QP30 is connected to the node LAT, and a signal PCHG is applied to the gate of the transistor QP30. The signal PCHG is input from the controller 121, and is brought to the "L" level when the node LAT and the node LATB are charged (the power supply voltage VDD is applied). The transistor QP31 has the drain connected to the node LAT, and the gate connected to the node LATB. The transistor QP32 has the drain connected to the node LATB, and the gate connected to the node LAT. The drain of the transistor QP33 is connected to the node LATB.

The transistor QN30 has the drain connected to the node LAT, the source connected to the drain of the transistor QN32, and the gate connected to the node LATB. The transistor QN31 has the drain connected to the node LATB, the source connected to the drain of the transistor QN33, and the gate connected to the node LAT.

A ground potential GND is applied to the source of the transistor QN32 via the current control circuit IR12 (the source of the transistor QN32 is connected to the ground potential line), and the signal SOUT0 is input to the gate of the transistor QN32. A ground potential GND is applied to the source of the transistor QN33 via the current control circuit IR12, and the signal SOUT1 is input to the gate of the transistor QN33.

The transistors QP31 and QN30 function as a first inverter, and the transistors QP32 and QN31 function as a second inverter. The transistor QP30 functions as a bypass transistor when the power supply voltage VDD is applied to the node LAT, and the transistor QP33 functions as a bypass transistor when the power supply voltage VDD is applied to the node LATB.

The current control circuit IR12 includes nMOS transistors QN34 to QN37. The sources of the transistors QN34 to QN37 are connected in common, and a ground potential GND is applied thereto. The drain of the transistor QN34 is connected to the drain of the transistor QN35 and the source of the transistor QN32. The signal SIGAB1 is input to the gate of the transistor QN34. The gate of the transistor QN35 is connected to a node BIAS3. The drain of the transistor QN36 is connected to the drain of the transistor QN37 and the source of the transistor QN33. The gate of the transistor QN36 is connected to the node BIAS3. The signal SIGAB2 is input to the gate of the transistor QN37.

Next, the bias circuit 24 is described.

The bias circuit 24 includes a current source 132, an nMOS transistor QN38, and an operational amplifier AMP1. A power supply voltage VDD is applied to the input end of the current source 132, and the output end of the current source 132 is connected to the drain and gate of the diode-connected transistor QN38. The current source 132 supplies a current Idis3 under the control of the controller 121. A ground potential GND is applied to the source of the transistor QN38, and the gate of the transistor QN38 is connected to a noninverting input terminal of the operational amplifier AMP1. The output end of the operational amplifier AMP1 is connected to an inverting input terminal and the current control circuit IR12. The operational amplifier AMP1 functions as a voltage follower circuit. The controller 121 controls the current flowing in the transistor QN35 or the transistor QN36 by controlling the current Idis3. The AMP1 may be omitted. In this case, the bias circuit 24 is similar to the bias circuits 22 and 23 described in the second embodiment.

For example, when the signal SIGAB1 is at the "L" level, the transistor QN34 is turned off. Thus, when the potential of the node LAT is inverted from the "H" level to the "L" level, the node LAT is discharged via the transistor QN35. In this instance, because the current flowing from the node LAT to the ground potential line is limited, the potential of the node LAT slowly decreases. Therefore, a delay (hereinafter referred to as a "third delay period") is generated from the inversion of the signal SOUT1 from the "L" level to the "H" level to the inversion of the potential of the node LAT from the "H" level to the "L" level to determine a logical level.

Similarly, when the signal SIGAB2 is at the "L" level, a delay (hereinafter referred to as a "fourth delay period") is generated from the inversion of the signal SOUT1 from the "L" level to the "H" level to the inversion of the potential of the node LATB from the "H" level to the "L" level to determine a logical level.

In the second embodiment, the processing in the inverter IV10 of the latch circuit 20 is delayed when the first delay period is generated, and the operation in the NOR circuit NR10 is delayed when the second delay period is generated. That is, the place where the delay is generated varies between the first delay period and the second delay period. In contrast, the order comparison circuit 11 according to the present embodiment has a circuit configuration symmetrical to two input signals SOUT (e.g., SOUT0 and SOUT1), and can generate the third delay period and the fourth delay period by one circuit.

[Examples of Program Verify]

Next, four examples of the program verify according to the present embodiment are shown. A flowchart of the write operation is the same as that in FIG. 14 according to the second embodiment.

In the case described here, data is written into the memory cell transistors MC0_0 and MC0_1, and the magnitude relation between the threshold voltages Vth1 and Vth2 is compared in the program verify, as in the second embodiment.

First Example (Vth2−Vth1)≥ΔVth

Figure 22:
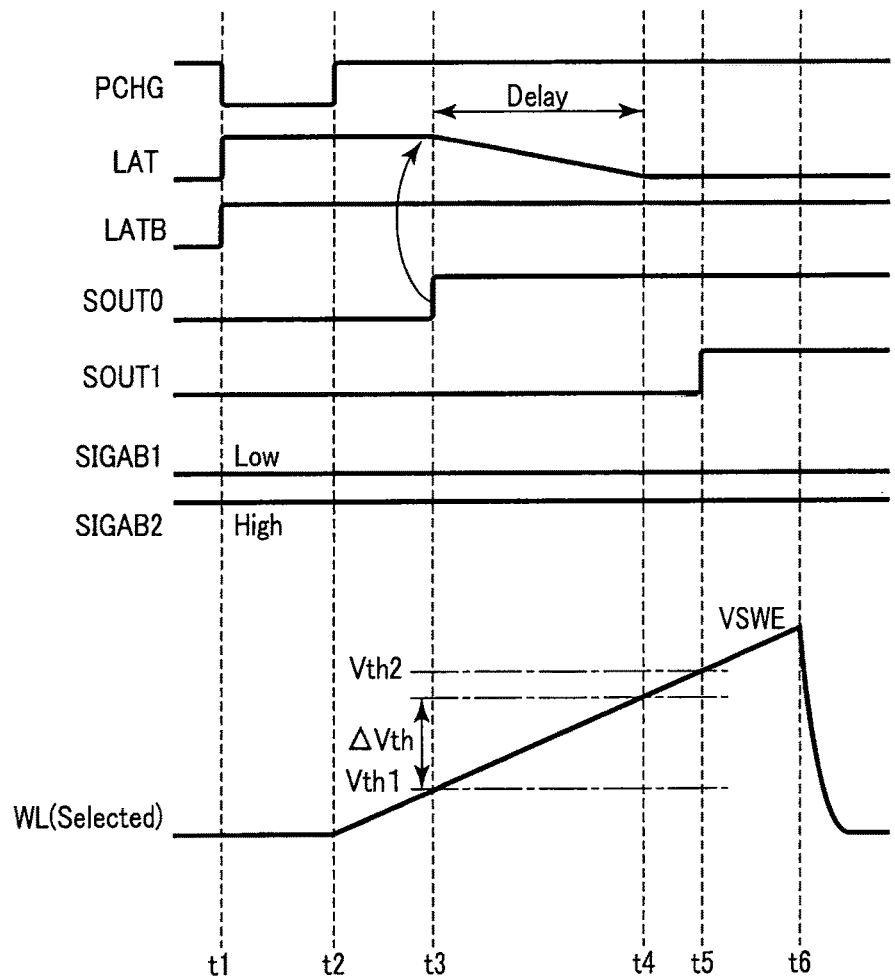
FIG. 22 is a timing chart showing a program verify operation in a first example according to the third embodiment.

First described with reference to FIG. 22 is the case where the threshold voltages based on the order data have the relation Vth1<Vth2, and the threshold voltages after the program have the relation (Vth2−Vth1)≥ΔVth.

As in the second embodiment, when the threshold voltages based on the order data have the relation Vth1<Vth2, the controller 121 sets the verify judgment level for the order comparison circuit 11_0 to the "L" level. FIG. 22 is a timing charts of various control signals and potentials at various nodes of the order comparison circuits 11_0 in the program verify in a first example according to the present embodiment.

As shown in FIG. 22, the controller 121 precharges the nodes LAT and LATB (times t1 to t2). More specifically, the controller 121 brings the signal PCHG to the "L" level. Accordingly, in the order comparison circuit 11_0, the transistors QP30 and QP33 are turned on, and a power supply voltage VDD is applied to the nodes LAT and LATB. That is, the potentials of the nodes LAT and LATB are brought to the "H" level.

In this instance, in the order comparison circuit 11_0, the signals SOUT0, SOUT1, and SIGAB1 and the node LATB are brought to the "L" level, and the signal SIGAB2 is brought to the "H" level.

The controller 121 then brings the signal PCHG to the "H" level. The row decoder 112 starts the sweeping of the voltage VSWE of the selected word line WL0 (time t2).

When the voltage VSWE becomes higher than the threshold voltage Vth1, the sense circuit 10_0 then brings the signal SOUT0 to the "H" level (time t3). Accordingly, the potential of the node LAT slowly decreases.

The third delay period elapses (time t4), and the logical levels of the potential ("L" level) of the node LAT and the potential ("H" level) of the node LATB are determined.

The increase of the voltage VSWE in the third delay period (the interval between the times t3 and t4) corresponds to the margin voltage ΔVth.

When the voltage VSWE becomes higher than the threshold voltage Vth2, the sense circuit 10_1 then brings the signal SOUT1 to the "H" level (time t5). However, in the order comparison circuit 11_0, the potentials (logical levels) of the nodes LAT and LATB are determined, so that the latched data is not changed.

The row decoder 112 then finishes the sweeping of the voltage VSWE of the selected word line WL0 (time t6).

The node LAT of the order comparison circuit 11_0 is holding data at the "L" level and corresponds to the verify judgment level, so that the controller 121 judges that the program verify has been passed.

Second Example (Vth2−Vth1)<ΔVth

Next described with reference to FIG. 23 is the case where the threshold voltages based on the order data have the relation Vth1<Vth2, and the threshold voltages after the program have the relation (Vth2−Vth1)<ΔVth. FIG. 23 is a timing charts of various control signals and potentials at various nodes of the order comparison circuits 11_0 in the program verify in a second example according to the present embodiment.

As in the first example according to the present embodiment, the controller 121 sets the verify judgment level for the order comparison circuit 11_0 to the "L" level.

As shown in FIG. 23, the respective signals and the potentials of the nodes at the times t1 to t3 are the same as those in the first example according to the present embodiment.

When the voltage VSWE becomes higher than the threshold voltage Vth2, the sense circuit 10_1 then brings the signal SOUT1 to the "H" level (time t4). Here, the interval between the times t3 and t4 is shorter than the third delay period (the interval between the times t3 and t4). Because the signal SOUT1 has been inverted from the "L" level to the "H" level, the potential of the node LATB decreases more rapidly than the potential of the node LAT, and determined at the "L" level. As a result, the potential of the node LAT is determined at the "H" level.

The row decoder 112 then finishes the sweeping of the voltage VSWE of the selected word line WL0 (time t6).

The node LAT of the order comparison circuit 11_0 is holding data at the "H" level and does not correspond to the verify judgment level, so that the controller 121 judges that the program verify has been failed.

Third Example (Vth1−Vth2)≥ΔVth

Next described with reference to FIG. 24 is the case where the threshold voltages based on the order data have the relation Vth1>Vth2, and the threshold voltages after the program have the relation (Vth1−Vth2)≥ΔVth. FIG. 24 is a timing charts of various control signals and potentials at various nodes of the order comparison circuits 11_0 in the program verify in a third example according to the present embodiment.

As in the second embodiment, when the threshold voltages based on the order data have the relation Vth1>Vth2, the controller 121 sets the verify judgment level for the order comparison circuit 11_0 to the "H" level.

As shown in FIG. 24, the controller 121 precharges the nodes LAT and LATB (time t1).

In this instance, in the order comparison circuit 11_0, the signals SOUT0, SOUT1, and SIGAB2 are brought to the "L" level, and the signal SIGAB1 is brought to the "H" level.

The controller 121 then brings the signal PCHG to the "H" level. The row decoder 112 starts the sweeping of the voltage VSWE of the selected word line WL0 (time t2).

When the voltage VSWE becomes higher than the threshold voltage Vth2, the sense circuit 10_1 then brings the signal SOUT1 to the "H" level (time t3). Accordingly, the potential of the node LATB slowly decreases.

The fourth delay period elapses (time t4), and the logical levels of the potential ("H" level) of the node LAT and the potential ("L" level) of the node LATB are determined.

The increase of the voltage VSWE in the fourth delay period (the interval between the times t3 and t4) corresponds to the margin voltage ΔVth.

When the voltage VSWE becomes higher than the threshold voltage Vth2, the sense circuit 10_0 then brings the signal SOUT0 to the "H" level (time t5).

The row decoder 112 then finishes the sweeping of the voltage VSWE of the selected word line WL0 (time t6).

The node LAT of the order comparison circuit 11_0 is holding data at the "H" level and corresponds to the verify judgment level, so that the controller 121 judges that the program verify has been passed.

Fourth Example (Vth1−Vth2)<ΔVth

Figure 25:
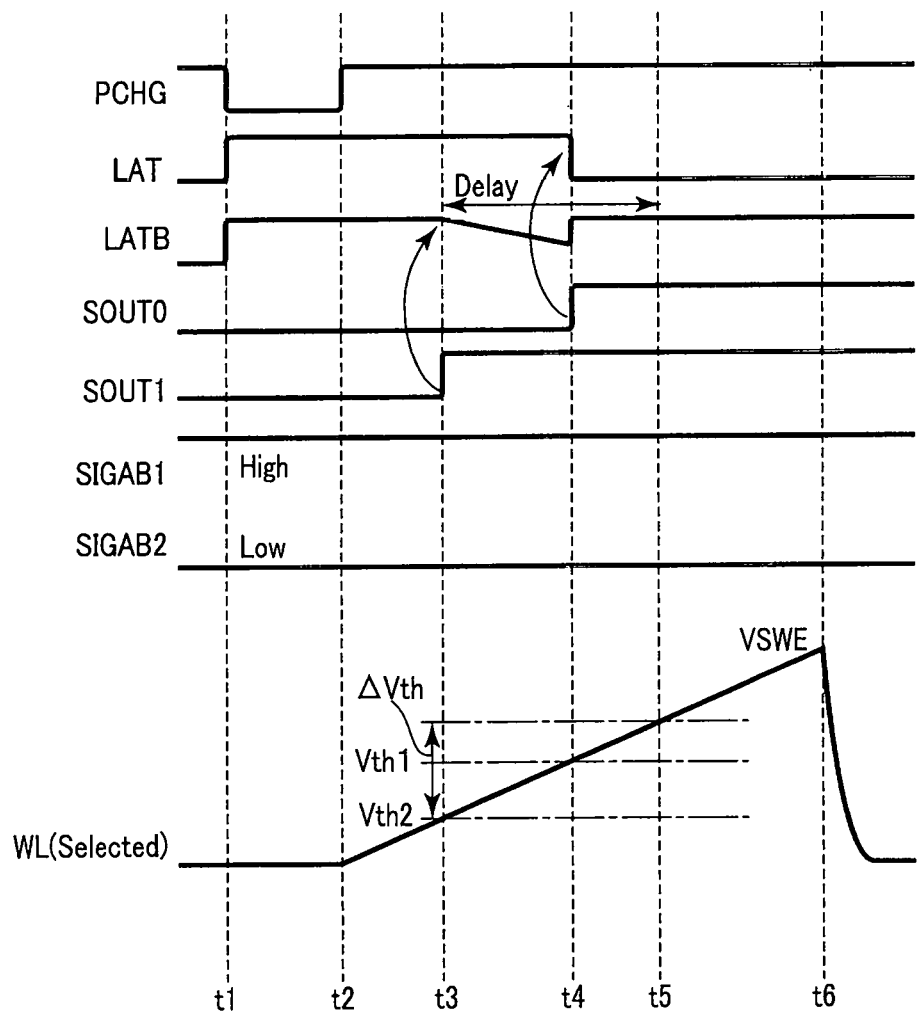
FIG. 25 is a timing chart showing a program verify operation in a fourth example according to the third embodiment.

Next described with reference to FIG. 25 is the case where the threshold voltages based on the order data have the relation Vth1>Vth2, and the threshold voltages after the program have the relation (Vth1−Vth2)<ΔVth. FIG. 25 is a timing charts of various control signals and potentials at various nodes of the order comparison circuits 11_0 in the program verify in a fourth example according to the present embodiment.

As in the third example according to the present embodiment, the controller 121 sets the verify judgment level for the order comparison circuit 11_0 to the "H" level.

As shown in FIG. 25, the respective signals and the potentials of the nodes at the times t1 to t3 are the same as those in the third example according to the present embodiment.

When the voltage VSWE becomes higher than the threshold voltage Vth1, the sense circuit 10_0 then brings the signal SOUT0 to the "H" level (time t4). Here, the interval between the times t3 and t4 is shorter than the fourth delay period (the interval between the times t3 and t5). Because the signal SOUT0 has been inverted from the "L" level to the "H" level, the potential of the node LAT decreases more rapidly than the potential of the node LATB, and is determined at the "L" level. As a result, the potential of the node LATB is determined at the "H" level.

The row decoder 112 then finishes the sweeping of the voltage VSWE of the selected word line WL0 (time t6).

The node LAT of the order comparison circuit 11_0 is holding data at the "L" level and does not correspond to the verify judgment level, so that the controller 121 judges that the program verify has been failed.

[Advantageous Effects of the Embodiment]

According to the semiconductor memory device in the present embodiment, advantageous effects similar to those in the first and second embodiments can be obtained.

Moreover, in the configuration according to the present embodiment, the NOR circuit can be omitted in the order comparison circuit, so that it is possible to reduce the number of necessary elements, and suppress an increase of the chip area.

Furthermore, in the configuration according to the present embodiment, the order comparison circuit 11 has a circuit configuration symmetrical to the input signals SOUT (e.g., SOUT0 and SOUT1) from the two sense circuits 10. It is therefore possible to generate, by a similar circuit configuration, the delay period (third delay period) to invert the potential of the node LAT from the "H" level to the "L" level, and the delay period (fourth delay period) to invert the potential of the node LATB from the "H" level to the "L" level. Thus, the difference between the third delay period and the fourth delay period can be reduced. That is, it is possible to suppress the variation of the margin voltage ΔVth, and suppress the variation of write data. Thus, wrong judgments in the order comparison circuits can be reduced in the read operation. Therefore, the reliability of the semiconductor memory device can be improved.

4. Fourth Embodiment

Next, the fourth embodiment is described. In the fourth embodiment, the sense circuit 10 different from that in the first embodiment is described. The sense circuit 10 according to the present embodiment has a function to reduce a voltage drop in the bit line BL resulting from an on-current when the memory cell transistor MC to be a read target has been turned on. Differences between the fourth embodiment and the first embodiment are only described below.

[Configuration of Sense Circuit]

The circuit configuration of the sense circuit 10 is first described with reference to FIG. 26. The sense circuit that uses a current sensing method is described in the present embodiment.

As shown in FIG. 26, the sense circuit 10 includes p-channel MOS transistors QP40 to QP43, n-channel MOS transistors QN40 to QN47, a capacitive element CP, and a latch circuit 140.

The transistor QN40 has one end connected to the bit line BL, and the other end connected to a node BLI, and a signal BLS is input to the gate of the transistor QN40.

The transistor QN41 has one end connected to the node BLI, and the other end connected to a node SCOM, and a signal BLC1 is input to the gate of the transistor QN41. The transistor QN41 functions as a first clamp transistor which controls a voltage to be applied to the bit line BL in accordance with the voltage VBLC1 of the signal BLC1.

One end of the transistor QN42 is connected to the node BLI, a voltage SRCGND is applied to the other end of the transistor QN42, and a signal BLV is input to the gate of the transistor QN42.

One end of the transistor Q43 is connected to the node SCOM, a voltage SRCGND (e.g., a ground potential GND) is applied to the other end of the transistor QN43, and the gate of the transistor QN43 is connected to a node INV_S. The node INV_S holds inversion data of held data in a node LAT_S (not shown) in the latch circuit 140.

The transistor QN44 has the drain connected to a node SSRC, and the source connected to the node SCOM, and a signal BLX is input to the gate of the transistor QN44.

The transistor QN45 has the drain connected to the node SEN, and the source connected to the node SCOM, and a signal XXL is input to the gate of the transistor QN45.

One end of the transistor QN46 is connected to a node N1, a voltage VSSSA (e.g., a ground potential GND) is applied to the other end of the transistor QN46, and a signal PRECHG is input to the gate of the transistor QN46.

The transistor QN47 has the drain connected to a node SCHG, and the source connected to the node BLI, and a signal BLC2 is input to the gate of the transistor QN47. The transistor QN47 functions as a second clamp transistor which controls a voltage to be applied to the bit line BL in accordance with a voltage VBLC2 of the signal BLC2.

A power supply voltage VDDSA is applied to the source of the transistor QP40, and the transistor QP40 has the drain connected to a node SSRG, and the gate connected to the node INV_S.

The transistor QN41 has the source connected to the node SSRC, and the drain connected to the node SEN, and a signal HLL is input to the gate of the transistor QN41.

The transistor QN42 has the source connected to the node SSRC, and the drain connected to the node N1, and the gate connected to the node SEN.

A power supply voltage VDDSA is applied to the source of the transistor QP43, the transistor QP43 has the drain connected to the node SCHG, and a signal RDLn is input to the gate of the transistor QP43. The signal RDLn is a signal output from the latch circuit 140.

One electrode of the capacitive element CP is connected to the node SEN, and a voltage VSSSA is applied to the other electrode.

The signal SOUT is output to the order comparison circuit 11 from the node N1.

The latch circuit 140 temporarily holds write data or read data. The input end of the latch circuit 140 is connected to the node N1. The latch circuit 140 outputs the signal RDLn on the basis of the input data. For example, if the potential of the node N1 connected to the input end of the latch circuit 140 is inverted from the "L" level to the "H" level, the latch circuit 140 brings the signal RDLn from the "H" level to the "L" level. More than one latch circuit 140 may be provided.

Various control signals in the sense circuit 10 having the configuration described above are provided by, for example, the controller 121.

[Operation of Sense Circuit in Read Operation]

Next, the operation of the sense circuit 10 in the read operation is described with reference to FIG. 27. FIG. 27 is a conceptual diagram showing the operation of the sense circuit 10 in the read operation. In the example in FIG. 27, some of the elements of the sense circuit 10 described with reference to FIG. 26, and the NAND strings 114 are simply shown. More specifically, the transistors QN41, QN44, QN45, QN47, QP42, and QP43, the capacitive element CP, and the latch circuit 140 of the sense circuit 10 are shown. Select transistors ST1 and ST2, and the memory cell transistor MC to be a read target of the NAND string 114 connected to the bit line BL are shown. The select gate lines SGD and SGS connected to the select transistors ST1 and ST2, and the selected word line WL connected to the memory cell transistor MC are also shown.

As shown in FIG. 27, the memory cell transistor MC is turned on ((1) MC ON) if the voltage VSWE of the selected word line WL becomes higher than the threshold voltage Vth in the read operation.

If the memory cell transistor MC is turned on, an on-current Ion flows to the source line SL from the node SEN via the memory cell transistor MC ((2) Ion). If the on-current Ion flows, the potential of the bit line BL drops due to a voltage drop (IR drop).

Similarly, if the on-current Ion flows, the potential of the node SEN drops. Accordingly, the transistor QP42 is turned on ((3) QP42 ON).

If the transistor QP42 is turned on, a power supply voltage VDDSA ("H" level voltage) is applied to the node N1 ((4) "L"→"H").

The latch circuit 140 latches, for example, the "L" level, and inverts the signal RDLn from the "H" level to the "L" level ((5) "H"→"L").

If the signal RDLn reaches the "L" level, the transistor QP43 is turned on ((6) QP43 ON).

If the transistor QP43 is turned on, the voltage clamped in the transistor QN47 is applied to the bit line BL ((7) voltage application). In this instance, the voltage clamped in the transistor QN47 is made higher than the voltage clamped in the transistor QN41, that is, the voltage VBCL2 is made higher than the voltage VBLC1. Thus, the potential of the bit line BL in which the voltage has dropped rises.

[Various Control Signals and Potentials of Various Nodes in Read Operation]

Figure 28:
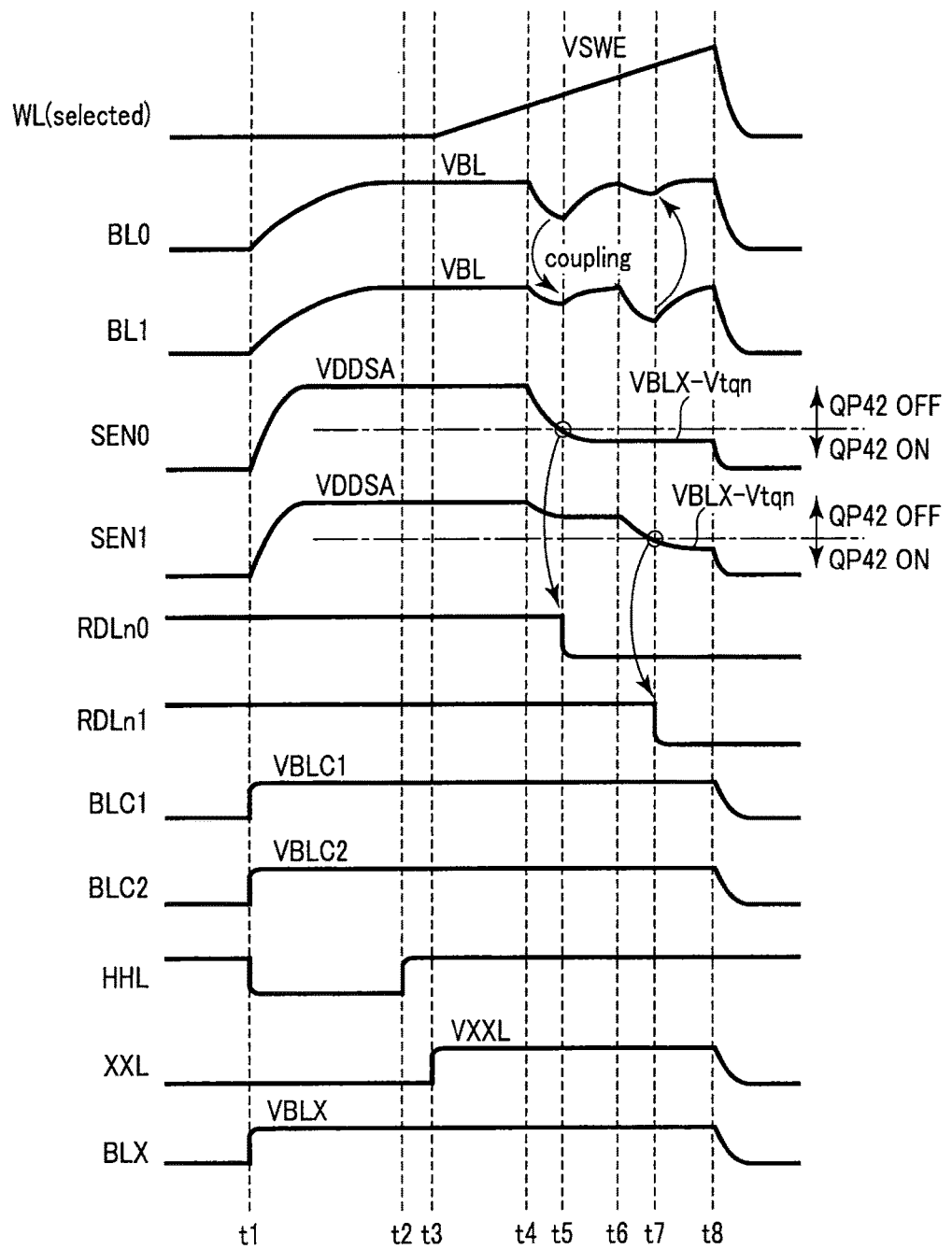
FIG. 28 is a timing chart showing the read operation according to the fourth embodiment.

Next, various control signals and potentials of various nodes in the read operation are described with reference to FIG. 28. FIG. 28 shows the selected word line WL, the bit lines BL0 and BL1, and various control signals and various nodes of the sense circuits 10_0 and 10_1 in the read operation. FIG. 28 also shows the case where the memory cell transistor MC corresponding to the bit line BL0 is turned on before the memory cell transistor MC corresponding to the bit line BL1. That is, the case where the threshold voltage Vth1<Vth2 is shown. Hereinafter, the node SEN corresponding to the sense circuit 10_0 is represented as SEN0, and the signal RDLn is represented as RDLn0. Similarly, the node SEN corresponding to the sense circuit 10_1 is represented as SEN1, and the signal RDLn is represented as RDLn1. In FIG. 28, the signals BLC1, BLC2, HHL, XXL, and BLX are common in the sense circuits 10_0 and 10_1.

As shown in FIG. 28, the sense circuit 10 (10_0 and 10_1) first starts the precharging of the bit line BL and the node SEN (time t1). More specifically, in the sense circuit 10, the potential of the node INV_S (not shown) is brought to the "L" level so that the transistor QP40 is turned on. A voltage VBLX is applied to the gate of the transistor QN44 as the signal BLX. Thus, a voltage "VBLX–Vtqn" clamped by the transistor QN44 is applied to the node SCOM. Vtqn is a threshold voltage of the n-channel MOS transistor in the sense circuit 10. The voltage "VBLX–Vtqn" has a relation "VBLX–Vtqn"<VDDSA.

The voltage VBLC1 is applied to the gate of the transistor QN41 as the signal BLC1. The voltages VBLX and VBLC1 have a relation VBLX>VBLC1. The signal BLS (not shown) is brought to the "H" level, and the transistor QN40 is in an on-state. Thus, a voltage "VBCL1–Vtqn" is applied to the node BLI and the bit line BL. The bit line BL is precharged to a voltage VBL between the times t1 and t2. The voltage VBL has a relation VBL="VBCL1–Vtqn"<"VBLX–Vtqn".

A signal RLDn (RDLn0 and RDLn1) is brought to the "H" level, and the transistor QP43 is turned off. The voltage VBCL2 is applied to the gate of the transistor QN47 as the signal BLC2.

The signal HLL is brought to the "L" level, and the transistor QP41 is turned on. The signal XXL is brought to the "L" level, and the transistor QN45 is turned off. Thus, the node SEN is precharged (the voltage VDDSA is applied).

The sense circuit 10 then finishes the precharging of the node SEN (time t2). More specifically, the signal HHL is brought to the "H" level.

The row decoder 113 then starts the sweeping of the voltage VSWE which is applied to the selected word line WL (time t3). In the sense circuit 10, a voltage VXXL is applied to the gate of the transistor QN45 as the signal XXL, and the transistor is turned on. The voltage VXXL has a relation VXXL>VBLX.

Further, the voltage VSWE becomes equal to or more than the threshold voltage Vth1, and the memory cell transistor MC connected to the bit line BL0 is turned on (time t4). Accordingly, the on-current Ion flows to the source line SL from the node SEN0 via the bit line BL0, and the potential of the node SEN0 drops. In this instance, the potential of the bit line BL0 drops due to the voltage drop (IR drop). The potential of the bit line BL1 adjacent to the bit line BL0 also drops due to capacitive coupling with the bit line BL0. In response to the drop of the potential of the bit line BL1, the potential of the node SEN1 also drops. However, because the decrease of the potential of the bit line BL1 is smaller than the decrease of the potential of the bit line BL0, the decrease of the potential of the node SEN1 is also smaller than the decrease of the potential of the node SEN0.

Further, in the sense circuit 100, the potential of the node SEN0 drops, and the transistor QP42 is turned on (time t5). The potential of the node SEN0 drops to the voltage "VBLX–Vtqn" clamped by the transistor QN44 between the times t5 and t6. Because the transistor QP42 is turned on, the signal RDLn0 is brought to the "L" level. A voltage "VBLC2–Vtqn" clamped by the transistor QN47 is applied to the bit line BL0. In this instance, the potential of the bit line BL0 rises if the voltage VBLC2 is made higher than the voltage VBLC1.

If the potential of the bit line BL0 rises, the potential of the bit line BL1 also rises due to capacitive coupling. Therefore, the potential of the node SEN1 no longer drops, so that the transistor QP42 of the sense circuit 10_1 maintains an off-state.

Further, the voltage VSWE becomes equal to or more than the threshold voltage Vth2, and the memory cell transistor MC connected to the bit line BL1 is turned on (time t6). Accordingly, the on-current Ion flows to the source line SL from the node SEN1 via the bit line BL1, and the potential of the node SEN1 drops. In this instance, the potential of the bit line BL1 drops due to the voltage drop (IR drop). The potential of the bit line BL0 adjacent to the bit line BL1 also drops due to capacitive coupling.

Further, in the sense circuit 10_1, the potential of the node SEN1 drops, and the transistor QP42 is turned on (time t7). The potential of the node SEN1 drops to the voltage "VBLX–Vtqn" clamped by the transistor QN44 between the times t7 and t8. Because the transistor QP42 is turned on, the signal RDLn1 is brought to the "L" level. The voltage "VBLC2–Vtqn" clamped by the transistor QN47 is applied to the bit line BL1, and the potential of the bit line BL1 rises.

If the potential of the bit line BL1 rises, the potential of the bit line BL0 also rises due to capacitive coupling.

The sweeping of the voltage VSWE of the selected word line WL0 then ends, and recovery processing is performed (time t8).

[Advantageous Effects of the Embodiment]

According to the semiconductor memory device in the present embodiment, advantageous effects similar to those in the first embodiment can be obtained.

Moreover, the configuration according to the present embodiment enables the improvement of reliability. The present advantageous effects are described in detail.

In the order storage method, each of the sense circuits 10 senses the threshold voltage of the memory cell transistor MC by a different timing. Therefore, when the memory cell transistor MC connected to the adjacent bit line BL has been turned on, the on-current Ion flows to the adjacent bit line BL, and the potential of the adjacent bit line BL drops due to the IR drop. Accordingly, the potential of the bit line BL to be a sensing target also drops due to capacitive coupling with the adjacent bit line BL. Therefore, the potential of the node SEN drops even though the target memory cell transistor MC has not been turned on, so that there is a possibility that the sense circuit 10 may make a wrong judgment (wrong sensing).

In contrast, in the configuration according to the present embodiment, when the sense circuit 10 senses the threshold voltage, a higher voltage can be applied to the bit line BL than at the start of precharging. Thus, it is possible to suppress a voltage drop in the bit line BL, and raise the potential of the bit line BL. Accordingly, it is possible to suppress the decrease of the potential of the adjacent bit line (the potential of the node SEN) due to capacitive coupling. Thus, wrong judgments (wrong sensing) in the sense circuit 10 can be suppressed. Therefore, the reliability of the semiconductor memory device can be improved.

The present embodiment may be applied to the second or third embodiment.

5. Fifth Embodiment

Next, the fifth embodiment is described. In the fifth embodiment, the configuration of the sense circuit different from those in the first and fourth embodiments is described. Differences between the fifth embodiment and the first and fourth embodiments are only described below.

[Configuration of Sense Circuit]

The circuit configuration of the sense circuit 10 is first described with reference to FIG. 29.

Figure 29:
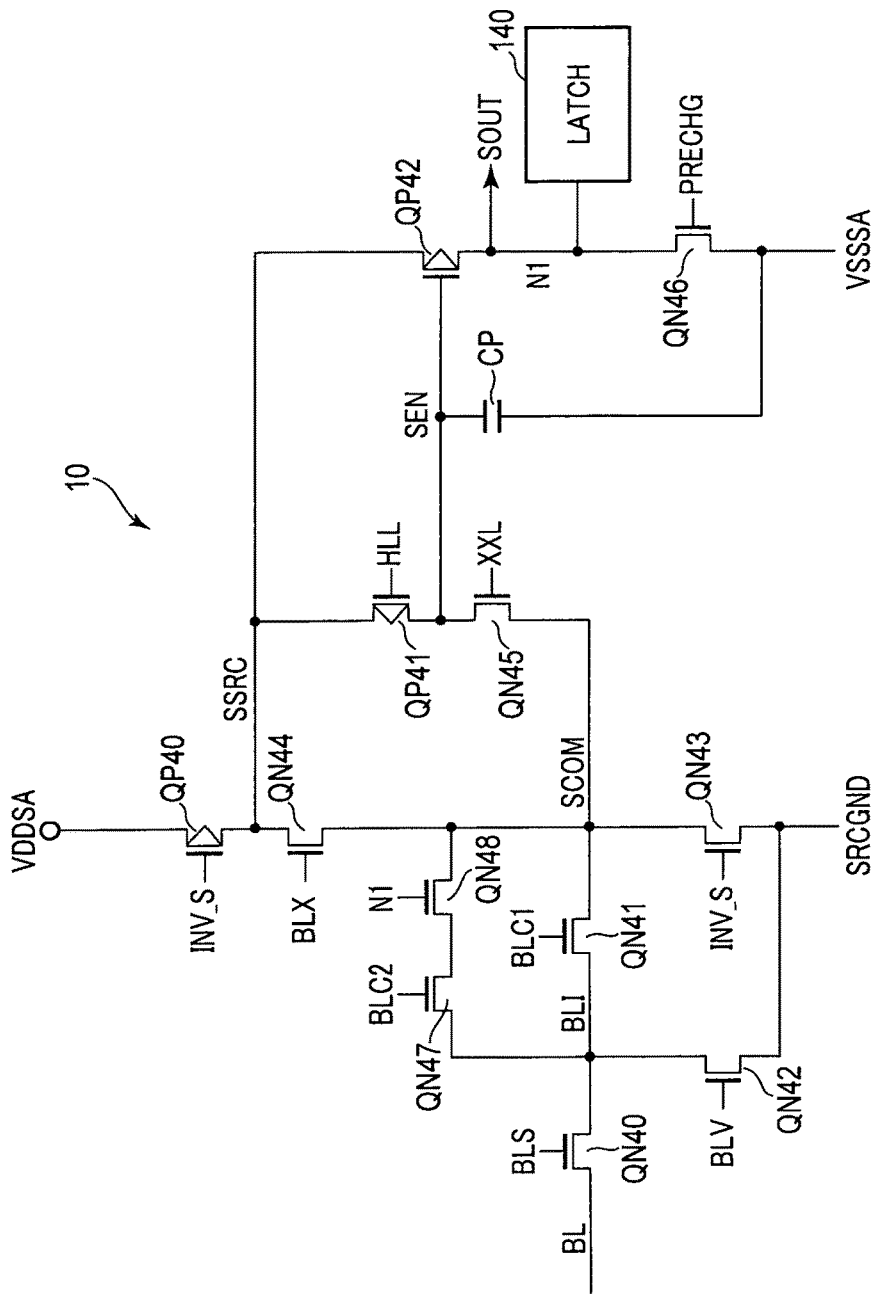
FIG. 29 is a circuit diagram of the sense circuit according to a fifth embodiment.

As shown in FIG. 29, the sense circuit 10 includes the p-channel MOS transistors QP40 to QP42, the n-channel MOS transistors QN40 to 48, the capacitive element CP, and the latch circuit 140. The connections of the transistors QP40 to QP42 and QN40 to 46, the capacitive element CP, and the latch circuit 140 are the same as those in FIG. 26 in the fourth embodiment. The latch circuit 140 according to the present embodiment does not need to output the signal RDLn.

The drain of the transistor QN47 is connected to the source of the transistor QN48.

The transistor QN48 has the drain connected to a node SCOMG, and the gate connected to the node N1.

[Operation of Sense Circuit in Read Operation]

Next, the operation of the sense circuit 10 in the read operation is described with reference to FIG. 30. FIG. 30 is a conceptual diagram showing the operation of the sense circuit 10 in the read operation. In the example in FIG. 30, some of the elements of the sense circuit 10 described with reference to FIG. 29, and the NAND strings 114 are simply shown. The differences between FIG. 30 and FIG. 27 according to the fourth embodiment are that the transistor QP43 is eliminated, the transistor QN48 is added, and the latch circuit 140 is omitted.

As shown in FIG. 30, the memory cell transistor MC is turned on ((1) MC ON) if the voltage VSWE of the selected word line WL becomes higher than the threshold voltage Vth in the read operation.

If the memory cell transistor MC is turned on, the on-current Ion flows to the source line SL from the node SEN via the memory cell transistor MC ((2) Ion). If the on-current Ion flows, the potential of the bit line BL drops.

If the on-current Ion flows, the potential of the node SEN drops. Accordingly, the transistor QP42 is turned on ((3) QP42 ON).

If the transistor QP42 is turned on, the power supply voltage VDDSA ("H" level voltage) is applied to the node N1 ((4) "L"→"H").

If the node N1 reaches the "H" level, the transistor QP48 is turned on ((5) QP48 ON).

If the transistor QP48 is turned on, the voltage clamped in the transistor QN47 is applied to the bit line BL ((6) Voltage application).

[Various Control Signals and Potentials of Various Nodes in Read Operation]

Figure 31:
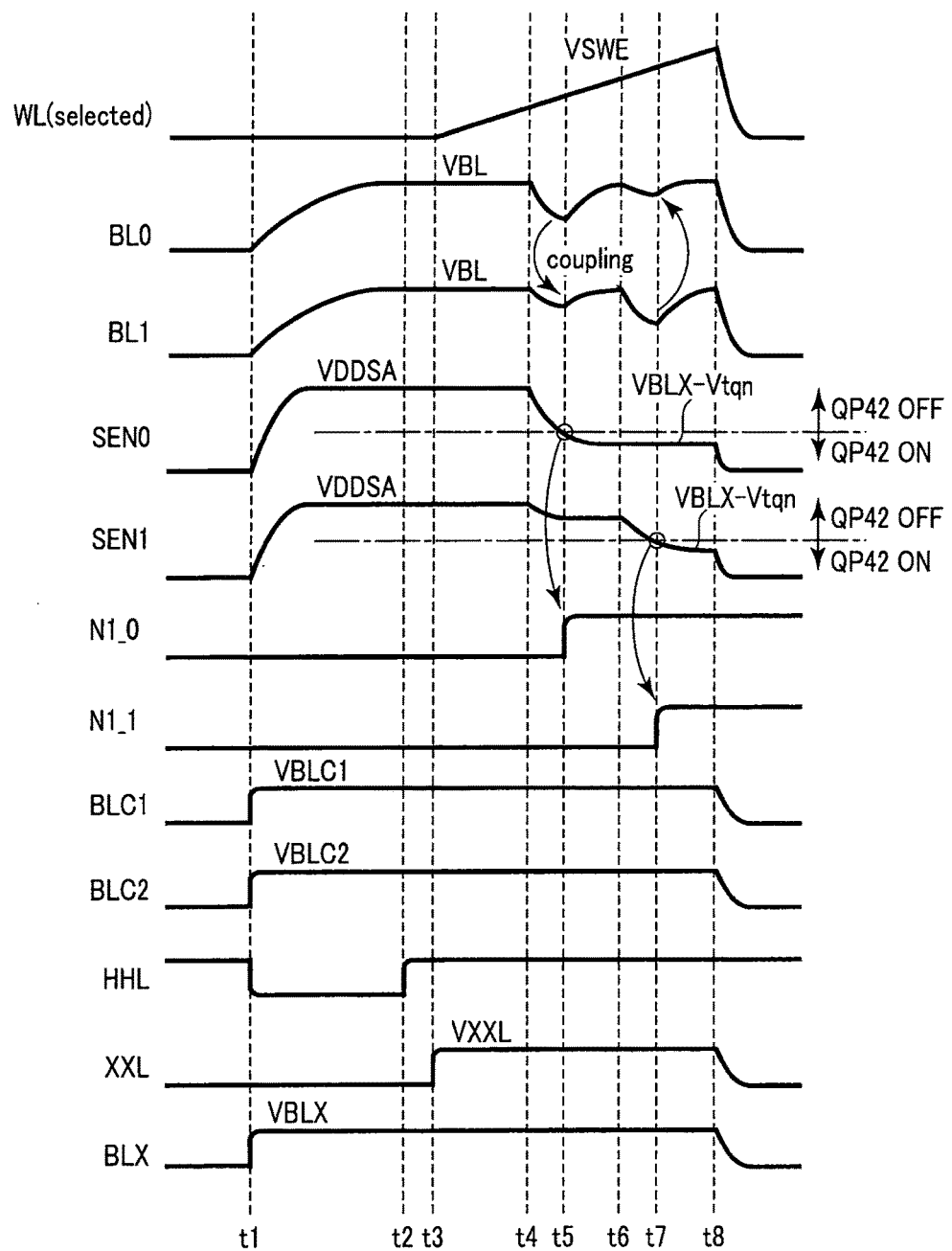
FIG. 31 is a timing chart showing the read operation according to the fifth embodiment.

Next, various control signals and potentials of various nodes in the read operation are described with reference to FIG. 31. FIG. 31 shows the selected word line WL, the bit lines BL0 and BL1, and various control signals and various nodes of the sense circuits 10_0 and 10_1 in the read operation. FIG. 31 also shows the case where the memory cell transistor MC corresponding to the bit line BL0 is turned on before the memory cell transistor MC corresponding to the bit line BL1. That is, the case where the threshold voltage Vth1<Vth2 is shown. Hereinafter, the node N1 corresponding to the sense circuit 10_0 is represented as N1_0, and the node N1 corresponding to the sense circuit 10_1 is represented as N1_1.

As shown in FIG. 31, the potentials of the selected word line, the bit lines BL0 and BL1, the nodes SEN0 and SEN1, and the signals BLC1, BLC2, HHL, XLL, and BLX at the times t1 to t8 are the same as those in FIG. 28 in the fourth embodiment.

At the time t1, the nodes N1_0 and N1_1 are brought to the "L" level.

At the time t5, the potential of the node SEN0 drops, and the transistor QP42 of the sense circuit 100 is turned on. As a result, the "H" level voltage (power supply voltage VDDSA) is applied to the node N1_0 (i.e. the signal SOUT0). In this instance, because the transistor QP42 of the sense circuit 10_1 is in an off-state, the node N1_1 maintains the "L" level.

At the time t7, the potential of the node SEN1 drops, and the transistor QP42 of the sense circuit 10_1 is turned on. As a result, the "H" level voltage (power supply voltage VDDSA) is applied to the node N1_1 (i.e. the signal SOUT1).

[Advantageous Effects of the Embodiment]

According to the semiconductor memory device in the present embodiment, advantageous effects similar to those in the first and fourth embodiments can be obtained.

The present embodiment may be applied to the second or third embodiment.

6. Sixth Embodiment

Next, the sixth embodiment is described. In the sixth embodiment, the configuration of the sense circuit different from those in the first, fourth, and fifth embodiments is described. The sense circuit 10 according to the present embodiment has a function to suppress a voltage drop in the corresponding bit line BL due to capacitive coupling with the adjacent bit line. Differences between the sixth embodiment and the first, fourth, and fifth embodiments are only described below.

[Configuration of Sense Amplifier]

Figure 32:
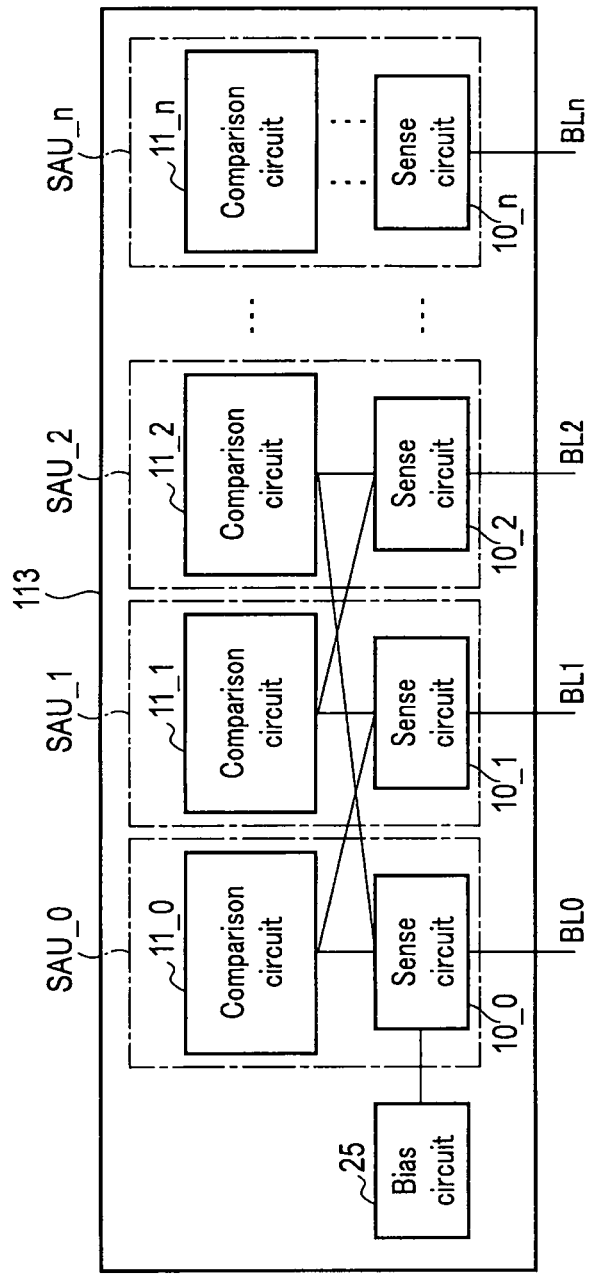
FIG. 32 is a block diagram showing the configuration of the sense amplifier according to a sixth embodiment.

The configuration of the sense amplifier 113 according to the embodiment is described with reference to FIG. 32. As shown in FIG. 32, the sense amplifier 113 includes the sense amplifier units SAU_0 to SAU_n, and a bias circuit 25. As in FIG. 4 according to the first embodiment, the sense amplifier units SAU_0 to SAU_n are connected to the bit lines BL0 to BLn, respectively. The bias circuit 25 may be provided outside the sense amplifier 113.

Each of the sense amplifier units SAU (SAU_0 to SAU_n) includes the sense circuit 10 (10_0 to 10_n) and the order comparison circuit 11 (11_0 to 11_n). The order comparison circuit 11 is similar to, for example, that in FIGS. 6 and 7 according to the first embodiment.

The bias circuit 25 is connected in common to each of the sense circuits 10.

[Configurations of Sense Circuit and Bias Circuit]

Next, the circuit configurations of the sense circuit 10 and the bias circuit 25 are described with reference to FIG. 33.

As shown in FIG. 33, the sense circuit 10 includes the p-channel MOS transistors QP40 to QP42 and QP44, the n-channel MOS transistors QN40 to 46, the capacitive element CP, and the latch circuit 140. The connections of the transistors QP40 to QP42 and QN40 to 46, the capacitive element CP, and the latch circuit 140 are the same as those in FIG. 26 in the fourth embodiment. The latch circuit 140 according to the present embodiment does not need to output the signal RDLn.

A signal BLC is input to the gate of the transistor QN41. The transistor QP44 has the source connected to the node SSRC, and the drain connected to the node SEN, and the gate connected to a node BIASP. The transistor QP44 controls a current Isen flowing in the node SEN in accordance with the voltage of the node BIASP. If there is much current Isen, the potential of the node SEN in which the on-current Ion flows does not drop, and the sense circuit 10 becomes unable to sense. If there is a little current Isen, the potential of the node SEN considerably drops due to capacitive coupling, which increases the possibility of wrong sensing. Thus, it is preferable that the current Isen is controlled so that the current Isen will be, for example, about ½ to ⅓ of the on-current Ion.

Next, the bias circuit 25 is described. The bias circuit 25 includes an operational amplifier AMP2. The operational amplifier AMP2 functions as a voltage follower circuit. A signal BIASP_REF is input to a noninverting input terminal, and an inverting input terminal and an output end are connected to the node BIASP. The signal BIASP_REF is, for example, a signal input from the controller 121. The bias circuit 25 may have the same configuration as the bias circuits 22 and 23 according to the second embodiment or the bias circuit 24 according to the third embodiment.

[Operation of Sense Circuit in Read Operation]

Next, the operation of the sense circuit 10 in the read operation is described with reference to FIG. 34. FIG. 34 is a conceptual diagram showing the operation of the sense circuit 10 in the read operation. In the example in FIG. 34, some of the elements of the sense circuit 10 connected to the bit line BL1, the bias circuit 25, and the NAND strings 114 connected to the bit lines BL0 to BL1 are simply shown. More specifically, the transistors QN41, QN44, QN45, QP42, and QP44, and the capacitive element CP of the sense circuit 10 are shown. The select transistors ST1 and ST2, and the memory cell transistor MC to be a read target of the NAND string 114 connected to the respective bit lines BL0 and BL1 are shown. The select transistors ST1 and ST2, and the memory cell transistor MC are connected to the select gate lines SGD and SGS, and the selected word line WL, respectively.

FIG. 34 also shows the case where the memory cell transistor MC corresponding to the bit line BL0 is turned on before the memory cell transistor MC corresponding to the bit line BL1. That is, the case where the threshold voltage Vth1<Vth2 is shown.

As shown in FIG. 34, the memory cell transistor MC of the bit line BL0 is turned on ((1) MC ON) if the voltage VSWE of the selected word line WL becomes higher than the threshold voltage Vth1 in the read operation.

The on-current Ion flows to the source line SL from the bit line BL0 via the memory cell transistor MC ((2) Ion). If the on-current Ion flows, the potential of the bit line BL0 drops.

If the potential of the bit line BL0 drops, the potentials of the bit line BL1 and the node SEN drop due to capacitive coupling ((3) Coupling).

The voltage VDDSA is applied to the node SEN via the transistor QP44. However, the current Isen flowing in the transistor QP44 is limited by the voltage of the node BIASP applied to the gate ((3) Isen). Thus, the potential of the node SEN slowly rises.

[Various Control Signals and Potentials of Various Nodes in Read Operation]

Next, various control signals and potentials of various nodes in the read operation are described with reference to FIG. 35. FIG. 35 shows the selected word line WL, the bit lines BL0 and BL1, and various control signals and various nodes of the sense circuits 10_0 and 10_1, and the bias circuit 25 in the read operation.

As shown in FIG. 34, the potentials of the selected word line WL, and the signals HHL, XLL, and BLX at the times t1 to t8 are the same as those in FIG. 28 in the fourth embodiment.

The sense circuit 10 first starts the precharging of the bit line BL and the node SEN (time t1). The nodes N1_0 and N1_1 are brought to the "L" level. A voltage VBLC is applied to the gate of the transistor QN41 as the signal BLC. The voltage VBL has a relation VBL="VBCL−Vtqn"<"VBLX−Vtqn".

The sense circuit 10 then finishes the precharging of the node SEN (time t2), as in FIG. 28 according to the fourth embodiment.

The row decoder 112 then starts the sweeping of the voltage VSWE which is applied to the selected word line WL (time t3). In the bias circuit 25, a voltage VBIASP is applied to the noninverting input terminal of the operational amplifier AMP2 as the signal BIASP_REF.

Further, the voltage VSWE becomes equal to or more than the threshold voltage Vth1, and the memory cell transistor MC connected to the bit line BL0 is turned on (time t4). Accordingly, the potential of the node SEN0 drops. The potentials of the bit line BL1 and the node SEN1 also drop due to capacitive coupling. In this instance, the current Isen flows to the nodes SEN0 and SEN1.

Further, in the sense circuit 100, the potential of the node SEN0 drops, and the transistor QP42 is turned on (time t5). Accordingly, the potential of the node N1_0 (i.e. the signal SOUT0) is brought to the "H" level. The potentials of the node SEN1 and the bit line BL1 slowly rise because the current Isen flows in. Thus, the transistor QP42 of the sense circuit 10_1 maintains an off-state.

Further, the voltage VSWE becomes equal to or more than the threshold voltage Vth2, and the memory cell transistor MC connected to the bit line BL1 is turned on (time t6). Accordingly, the on-current Ion flows to the source line SL from the node SEN1 via the bit line BL1, and the potentials of the node SEN1 and the bit line BL1 drop.

Further, in the sense circuit 10_1, the potential of the node SEN1 drops, and the transistor QP42 is turned on (time t7).

The row decoder 112 then finishes the sweeping of the voltage VSWE of the selected word line WL0. A recovery processing is performed (time t8).

[Advantageous Effects of the Embodiment]

According to the semiconductor memory device in the present embodiment, advantageous effects similar to those in the first embodiment can be obtained.

Moreover, in the configuration according to the present embodiment, the sense circuit 10 can suppress voltage drops in the bit line BL and the node SEN due to capacitive coupling. Thus, it is possible to suppress drops in the potentials of the adjacent bit line BL and the node SEN due to capacitive coupling. It is therefore possible to suppress wrong judgments (wrong sensing) in the sense circuit 10. Therefore, the reliability of the semiconductor memory device can be improved.

The present embodiment may be applied to the second or third embodiment. Moreover, the present embodiment may be combined with the fourth or fifth embodiment.

7. Seventh Embodiment

Next, the seventh embodiment is described. In the seventh embodiment, the configuration of the sense circuit 10 different from those in the first and fourth to sixth embodiments is described. The sense circuit 10 according to the present embodiment can reduce the precharge period of the bit line BL. Differences between the seventh embodiment and the first and fourth to sixth embodiments are only described below.

[Configuration of Charge Pump]

The configuration of the charge pump 122 is first described with reference to FIG. 36. FIG. 36 is a block diagram of the charge pump 122, the driver 124, and the sense amplifier 113. Although the order comparison circuit 11 is not shown in FIG. 36 to simplify the explanation, the configuration of the sense amplifier 113 is the same as that in FIG. 4 according to the first embodiment.

As shown in FIG. 36, the charge pump 122 includes a VBL generating circuit 150.

The VBL generating circuit 150 generates the voltage VBL which precharges the bit line BL in the read operation.

The VBL generating circuit 150 is connected in common to the sense circuits 10 (10_1 to 10_n) via the driver 124.

[Configuration of Sense Circuit]

Next, the configuration of the sense circuit 10 is described with reference to FIG. 37.

As shown in FIG. 37, the sense circuit 10 includes the p-channel MOS transistors QP40 to QP42, the n-channel MOS transistors QN40 to 46, QN49, and QN50, the capacitive element CP, and the latch circuit 140. The connections of the transistors QP40 to QP42 and QN40 to 46, the capacitive element CP, and the latch circuit 140 are the same as those in FIG. 26 in the fourth embodiment. The latch circuit 140 according to the present embodiment does not need to output the signal RDLn.

The voltage VBL is applied to the drain of the transistor QN49. That is, the drain of the transistor QN49 is connected to the VBL generating circuit 150 via the driver 124. The transistor QN49 has the source connected to the drain of the transistor QN50, and the gate connected to the node LAT_S. The node LAT_S is a node to hold data in the latch circuit 140.

The source of the transistor QN50 is connected to the node BLI, and a signal BLP is input to the gate of the transistor QN50. For example, when the bit line BL is precharged with the voltage VBL, the transistors QN49 and QN50 are turned on. Therefore, the voltage VBL generated in the VBL generating circuit 150 is applied to the bit line BL.

[Operation of Sense Circuit in Bit Line Precharge Period]

Next, the operation of the sense circuit 10 in a bit line precharge period is described with reference to FIG. 38. FIG. 38 is a conceptual diagram showing the operation of the sense circuit 10 in the bit line precharge period. In the example in FIG. 38, some of the elements of the sense circuit 10 described with reference to FIG. 37, and the NAND string 114 are simply shown. More specifically, the transistors QN41, QN44, QN45, QN49, QN50, and QP40 of the sense circuit 10 are shown. The select transistors ST1 and ST2, and the memory cell transistor MC to be a read target of the NAND string 114 connected to the bit lines BL are shown. The select gate lines SGD and SGS, and the selected word line WL are shown.

As shown in FIG. 38, when the bit line BL is precharged, the select transistors ST1 and ST2 of the NAND string 114, and the memory cell transistor MC are turned off. In the sense circuit 10, the transistors QP40, QN49, and QN50 are turned on, and the transistor QN45 is turned off. The transistors QN41 and QN44 clamp voltages.

In this state, the sense circuit 10 applies the voltage VBL to the bit line BL by use of two current paths. Hereinafter, the current path to apply the voltage VBL to the bit line BL via the transistors QN49 and QN50 is LA, and the current path to apply the voltage VBL to the bit line BL via the transistors QP40, QN44, and QN41 is LB.

In the current path LA, the transistor QN50 transfers, to the bit line BL, the voltage VBL applied from the VBL generating circuit 150. Thus, the "H" level voltage (e.g., the power supply voltage VDD) is applied to the gate of the transistor QN50 as the signal BLP. The "H" level voltage in this instance is a voltage sufficiently higher than a voltage "VBL+Vtqn". In the meantime, in the current path LB, the voltage clamped in the transistor QN41 is the voltage VBL. Thus, the signal BLC becomes equal to the voltage "VBL+Vtqn". Accordingly, the current flowing in the transistor QN41 is more limited than the current flowing in the transistor QN50. Therefore, the precharge period can be shorter when the precharge is performed by use of the current path LA than when the precharge is performed by use of the current path LB.

[Various Control Signals and Potentials of Various Nodes in Precharge Period]

Figure 39:
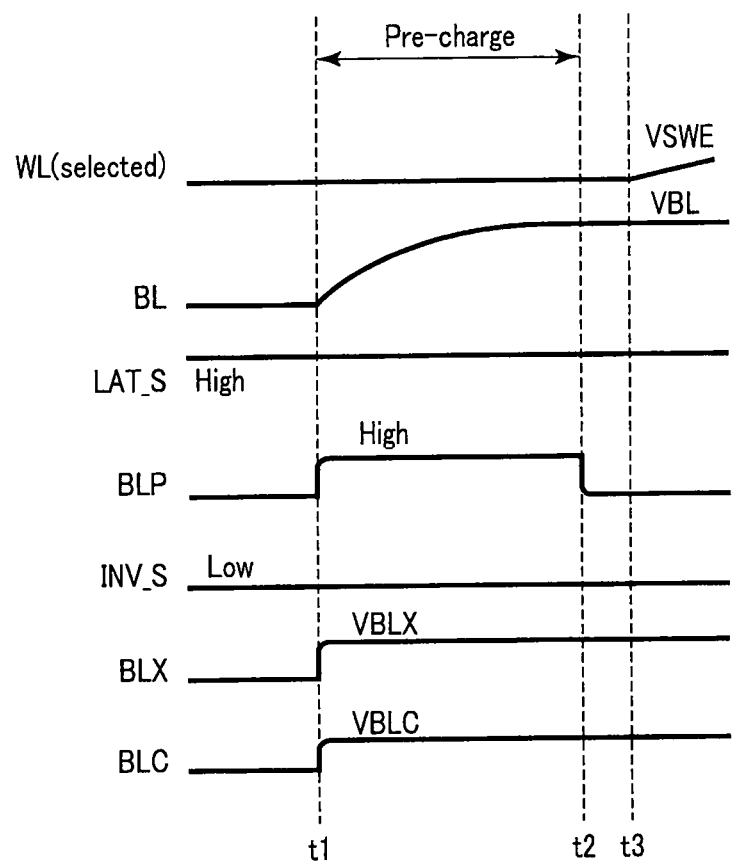
FIG. 39 is a timing chart showing the read operation according to the seventh embodiment.

Next, various control signals and potentials of various nodes in the precharge period are described with reference to FIG. 39. FIG. 39 shows the selected word line WL, the bit line BL, the nodes LAT_S and INV_S, and the signal BLP and the signal BLC in the precharge period.

As shown in FIG. 39, the sense circuit 10 first starts the precharging of the bit line BL and the node SEN (time t1). More specifically, in the sense circuit 10, the potential of the node LAT_S is brought to the "H" level so that the transistor QN49 is turned on. An "H" level voltage is applied to the gate of the transistor QN50 as the signal BLP. Accordingly, the voltage VBL is applied to the bit line BL from the current path LA. The potential of the node INV_S is brought to the "L" level so that the transistor QP40 is turned on. The voltage VBLX is applied to the gate of the transistor QN44 as the signal BLX. The voltage VBLC (=VBL+Vtqn) is applied to the gate of the transistor QN41 as the signal BLC. Accordingly, the voltage VBL is applied to the bit line BL from the current path LB.

Further, if the precharge is finished, the signal BLP is brought to the "L" level, and the transistor QN50 is turned off (time t2).

The row decoder 112 then starts the sweeping of the voltage VSWE which is applied to the selected word line WL (time t3). The read operations that and after the time t3 are similar to those in other embodiments.

[Advantageous Effects of the Embodiment]

According to the semiconductor memory device in the present embodiment, advantageous effects similar to those in the first embodiment can be obtained.

Moreover, the configuration according to the present embodiment enables the reduction of the precharge period of the bit line BL. It is therefore possible to reduce the processing period of the read operation, and improve a processing capability.

The present embodiment may be applied to the second to sixth embodiments.

8. Modifications and Others

The first to seventh embodiments described above can be combined as needed. For example, the second, fifth, sixth, and seventh embodiments may be combined.

Moreover, in the embodiments described above, a voltage sensing type sense amplifier may be used.

Furthermore, in the embodiments described above, the terms "connect" and "couple" include not only directly connecting but also physically or electrically connecting via any element unless otherwise specified.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell having a first threshold voltage;
   a second memory cell having a second threshold voltage;
   a word line which is electrically connected to the first and second memory cells;
   a first bit line which is electrically connected to the first memory cell;
   a second bit line which is electrically connected to the second memory cell;
   a sense amplifier which is electrically connected to the first bit line and the second bit line and which senses the first threshold voltage and the second threshold voltage; and
   a driver which increases gradually a voltage of the word line,
   wherein when the voltage of the word line is increased gradually by the driver, the sense amplifier senses the first and second threshold voltages in ascending order, and
   the sense amplifier includes a first latch circuit which latches a first voltage when the first threshold voltage is lower than the second threshold voltage and which latches a second voltage when the first threshold voltage is higher than the second threshold voltage.

2. The semiconductor memory device according to claim 1, further comprising:
   a controller which judges a magnitude relation of the first and second threshold voltages on the basis of one of the first and second voltages latched in the first latch circuit.

3. The semiconductor memory device according to claim 2, further comprising:
   an arithmetic circuit which encodes a judgment result of the magnitude relation of the first threshold voltage and the second threshold voltage.

4. The semiconductor memory device according to claim 1, further comprising:
   a third memory cell which has a third threshold voltage and which is electrically connected to the word line; and
   a third bit line which is electrically connected to the third memory cell,
   wherein the sense amplifier is electrically connected to the third bit line, and the sense amplifier senses the first, second, and third threshold voltages in ascending order when the voltage of the word line is increased gradually by the driver.

5. The semiconductor memory device according to claim 4,
   wherein the sense amplifier further includes:
   a second latch circuit which latches the first voltage when the second threshold voltage is lower than the third threshold voltage and which latches the second voltage when the second threshold voltage is higher than the third threshold voltage; and
   a third latch circuit which latches the first voltage when the first threshold voltage is lower than the third threshold voltage and which latches the second voltage when the first threshold voltage is higher than the third threshold voltage.

6. The semiconductor memory device according to claim 5, further comprising:
   a controller which judges a magnitude relation of the first, second, and third threshold voltages on the basis of one of the first and second voltages latched in the first, second, and third latch circuits.

7. The semiconductor memory device according to claim 6, further comprising:
   an arithmetic circuit which encodes a judgment result of the magnitude relation of the first, second, and third threshold voltages.

8. The semiconductor memory device according to claim 1, comprising a NAND flash memory.

9. The semiconductor memory device according to claim 1,
   wherein a write operation includes a program and a program verify, and
   in the program verify, the first latch circuit latches one of the first and second voltages, after the sense amplifier senses one of the first and second threshold voltages and then a first period elapses.

10. The semiconductor memory device according to claim 9, wherein
    the first latch circuit latches the one of the first and second voltages on the basis of write data after the elapse of the first period, or latches other of the first and second voltages in a period shorter than the first period on the basis of write data.

11. The semiconductor memory device according to claim 9,
    wherein the sense amplifier further includes:
    a first sense circuit which senses the first threshold voltage and which outputs a voltage that is input to the first latch circuit;
    a second sense circuit which senses the second threshold voltage; and an operational circuit which performs an operation on the basis of other of the first and second voltages and an output voltage of the second sense circuit, and sends an operation result to the first latch circuit, when the first threshold voltage is lower than the second threshold voltage, the first latch circuit latches the first voltage, after the first latch circuit senses the first threshold voltage and then the first period elapses, and when the first threshold voltage is higher than the second threshold voltage, the operational circuit sends the operation result to the first latch circuit, after the second sense circuit senses the second threshold voltage and then a second period elapses.

12. The semiconductor memory device according to claim 1,
wherein the sense amplifier applies a third voltage to the first bit line when the sense amplifier has sensed the first threshold voltage, and
the sense amplifier applies the third voltage to the second bit line when the sense amplifier has sensed the second threshold voltage.

13. The semiconductor memory device according to claim 1, further comprising:
a bias circuit which is electrically connected to the sense amplifier,
wherein the sense amplifier further includes a first node whereby a charge is transferred to the first bit line when the first memory cell is in an on-state, and
when a first current flows to the first bit line from the first node, a second current smaller than the first current is supplied to the first node from the bias circuit.

14. The semiconductor memory device according to claim 1, further comprising:
a voltage generator which applies a third voltage to the sense amplifier,
wherein the sense amplifier senses the first and second threshold voltages after the first and second bit lines are charged with the third voltage by use of the voltage generator in a read operation.

15. The semiconductor memory device according to claim 1,
wherein a write operation includes a program and a program verify, and
in the program verify:
when a difference of the first and second threshold voltage is equal to more than a third voltage, the first latch circuit latches one of the first and second voltages, after the sense amplifier senses the one of the first and second threshold voltages and then a first period elapses; and
when the difference of the first and second threshold voltage is less than the third voltage, the first latch circuit latches other of the first and second voltages in a period shorter than the first period.

* * * * *